(12) United States Patent
Kato et al.

(10) Patent No.: US 9,297,072 B2
(45) Date of Patent: Mar. 29, 2016

(54) FILM DEPOSITION APPARATUS

(75) Inventors: Hitoshi Kato, Oshu (JP); Manabu Honma, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 1390 days.

(21) Appl. No.: 12/620,750

(22) Filed: Nov. 18, 2009

(65) Prior Publication Data

US 2010/0132614 A1 Jun. 3, 2010

(30) Foreign Application Priority Data

Dec. 1, 2008 (JP) .................................. 2008-306734
Dec. 3, 2008 (JP) .................................. 2008-309011

(51) Int. Cl.
*C23C 16/455* (2006.01)
*H01L 21/677* (2006.01)
*H01L 21/67* (2006.01)
*C23C 16/40* (2006.01)

(52) U.S. Cl.
CPC ........... *C23C 16/4551* (2013.01); *C23C 16/402* (2013.01); *C23C 16/45578* (2013.01); *H01L 21/6719* (2013.01); *H01L 21/67703* (2013.01)

(58) Field of Classification Search
USPC ........................ 118/719; 156/345.33–345.34
See application file for complete search history.

(56) References Cited

U.S. PATENT DOCUMENTS

| | | | |
|---|---|---|---|
| 4,699,805 A * | 10/1987 | Seelbach et al. | 438/680 |
| 4,854,266 A * | 8/1989 | Simson et al. | 118/728 |
| 5,281,274 A | 1/1994 | Yoder | |
| 5,620,523 A | 4/1997 | Maeda et al. | |
| 5,704,984 A * | 1/1998 | Lee et al. | 118/724 |
| 5,744,049 A | 4/1998 | Hills et al. | |
| 5,849,088 A | 12/1998 | DeDontney et al. | |
| 5,906,354 A | 5/1999 | Gilbert et al. | |
| 6,200,389 B1 * | 3/2001 | Miller et al. | 118/729 |
| 6,279,503 B1 | 8/2001 | Choi et al. | |
| 6,340,501 B1 | 1/2002 | Kamiyama et al. | |
| 6,416,292 B1 * | 7/2002 | Liehr | 417/48 |
| 6,634,314 B2 | 10/2003 | Hwang et al. | |

(Continued)

FOREIGN PATENT DOCUMENTS

| | | |
|---|---|---|
| CN | 1269046 | 10/2000 |
| CN | 101076878 | 11/2007 |

(Continued)

OTHER PUBLICATIONS

Japanese Office Action mailed May 29, 2012.

*Primary Examiner* — Karla Moore
(74) *Attorney, Agent, or Firm* — IPUSA, PLLC

(57) ABSTRACT

A film deposition apparatus includes a rotary table having a substrate placement area to support a substrate, a vacuum container including a container and a top panel, an open-and-close mechanism configured to open and close the top panel, reactant gas nozzles disposed through and supported by an outer wall of the container to be situated at different angular positions with respect to a rotation center of the rotary table to face areas in which the substrate placement area passes, the reactant gas nozzles having gas discharge ports arranged in radial directions to supply respective reactant gases to the wafer thereby to form respective process areas, a discharge gas supply unit situated at an angular position between the process areas to supply purge gas to form an isolation area that isolates atmospheres of the process areas from each other, and an exhaustion unit configured to exhaust atmosphere inside the vacuum container.

23 Claims, 42 Drawing Sheets

(56) References Cited

U.S. PATENT DOCUMENTS

| | | | |
|---|---|---|---|
| 7,153,542 B2 | 12/2006 | Nguyen et al. | |
| 7,537,662 B2 * | 5/2009 | Soininen et al. | 118/715 |
| 7,682,482 B2 * | 3/2010 | Yoshida et al. | 156/345.41 |
| 8,034,723 B2 | 10/2011 | Ohizumi et al. | |
| 8,092,598 B2 | 1/2012 | Baek et al. | |
| 8,372,202 B2 | 2/2013 | Kato et al. | |
| 8,465,591 B2 | 6/2013 | Kato et al. | |
| 8,465,592 B2 | 6/2013 | Kato et al. | |
| 8,518,183 B2 | 8/2013 | Honma | |
| 8,673,079 B2 | 3/2014 | Kato et al. | |
| 8,673,395 B2 | 3/2014 | Kato et al. | |
| 8,721,790 B2 | 5/2014 | Kato et al. | |
| 8,746,170 B2 | 6/2014 | Orito et al. | |
| 8,808,456 B2 | 8/2014 | Kato et al. | |
| 8,835,332 B2 | 9/2014 | Kato et al. | |
| 8,840,727 B2 | 9/2014 | Kato et al. | |
| 8,845,857 B2 | 9/2014 | Ohizumi et al. | |
| 8,854,449 B2 | 10/2014 | Aikawa et al. | |
| 8,882,915 B2 | 11/2014 | Kato et al. | |
| 8,882,916 B2 | 11/2014 | Kumagai et al. | |
| 8,906,246 B2 | 12/2014 | Kato et al. | |
| 8,951,347 B2 | 2/2015 | Kato et al. | |
| 8,961,691 B2 | 2/2015 | Kato et al. | |
| 8,962,495 B2 | 2/2015 | Ikegawa et al. | |
| 8,992,685 B2 | 3/2015 | Kato et al. | |
| 9,023,738 B2 | 5/2015 | Kato et al. | |
| 9,040,434 B2 | 5/2015 | Kato | |
| 9,053,909 B2 | 6/2015 | Kato et al. | |
| 9,103,030 B2 | 8/2015 | Kato et al. | |
| 9,111,747 B2 | 8/2015 | Yamawaku et al. | |
| 9,136,133 B2 | 9/2015 | Oshimo et al. | |
| 2002/0195056 A1 | 12/2002 | Sandhu et al. | |
| 2004/0052972 A1 | 3/2004 | Schmitt | |
| 2004/0067641 A1 * | 4/2004 | Yudovsky | 438/680 |
| 2004/0187784 A1 * | 9/2004 | Sferlazzo | 118/719 |
| 2004/0217217 A1 * | 11/2004 | Han et al. | 239/589 |
| 2005/0084610 A1 | 4/2005 | Selitser | |
| 2006/0137606 A1 * | 6/2006 | Lee | 118/715 |
| 2006/0177579 A1 | 8/2006 | Shin et al. | |
| 2006/0196538 A1 | 9/2006 | Kubista et al. | |
| 2006/0216417 A1 * | 9/2006 | Todd et al. | 427/248.1 |
| 2007/0095286 A1 | 5/2007 | Baek et al. | |
| 2007/0215036 A1 | 9/2007 | Park et al. | |
| 2007/0218701 A1 | 9/2007 | Shimizu et al. | |
| 2007/0218702 A1 | 9/2007 | Shimizu et al. | |
| 2008/0193643 A1 * | 8/2008 | Dip | 427/255.5 |
| 2008/0208385 A1 | 8/2008 | Sakamoto et al. | |
| 2008/0216864 A1 | 9/2008 | Sexton et al. | |
| 2009/0272402 A1 | 11/2009 | Kim et al. | |
| 2009/0324826 A1 | 12/2009 | Kato et al. | |
| 2009/0324828 A1 | 12/2009 | Kato et al. | |
| 2010/0050942 A1 | 3/2010 | Kato et al. | |
| 2010/0050943 A1 | 3/2010 | Kato et al. | |
| 2010/0050944 A1 | 3/2010 | Kato et al. | |
| 2010/0055297 A1 | 3/2010 | Kato et al. | |
| 2010/0055312 A1 | 3/2010 | Kato et al. | |
| 2010/0055314 A1 | 3/2010 | Kato et al. | |
| 2010/0055315 A1 | 3/2010 | Honma | |
| 2010/0055316 A1 | 3/2010 | Honma | |
| 2010/0055319 A1 | 3/2010 | Kato et al. | |
| 2010/0055320 A1 | 3/2010 | Honma | |
| 2010/0055347 A1 | 3/2010 | Kato et al. | |
| 2010/0055351 A1 | 3/2010 | Kato et al. | |
| 2010/0116210 A1 | 5/2010 | Kato et al. | |
| 2010/0124610 A1 | 5/2010 | Aikawa et al. | |
| 2010/0132614 A1 | 6/2010 | Kato et al. | |
| 2010/0132615 A1 | 6/2010 | Kato et al. | |
| 2010/0136795 A1 | 6/2010 | Honma | |
| 2010/0151131 A1 | 6/2010 | Obara et al. | |
| 2010/0199914 A1 * | 8/2010 | Iza | 118/725 |
| 2010/0227046 A1 | 9/2010 | Kato et al. | |
| 2010/0227059 A1 | 9/2010 | Kato et al. | |
| 2010/0260935 A1 | 10/2010 | Kato et al. | |
| 2010/0260936 A1 | 10/2010 | Kato et al. | |
| 2011/0039026 A1 | 2/2011 | Kato et al. | |
| 2011/0048326 A1 | 3/2011 | Kato et al. | |
| 2011/0100489 A1 | 5/2011 | Orito et al. | |
| 2011/0104395 A1 | 5/2011 | Kumagai et al. | |
| 2011/0126985 A1 | 6/2011 | Ohizumi et al. | |
| 2011/0139074 A1 | 6/2011 | Kato et al. | |
| 2011/0151122 A1 | 6/2011 | Kato et al. | |
| 2011/0155056 A1 | 6/2011 | Kato et al. | |
| 2011/0155057 A1 | 6/2011 | Kato et al. | |
| 2011/0159187 A1 | 6/2011 | Kato et al. | |
| 2011/0159188 A1 | 6/2011 | Kato et al. | |
| 2011/0159702 A1 | 6/2011 | Ohizumi et al. | |
| 2011/0214611 A1 | 9/2011 | Kato et al. | |
| 2011/0236598 A1 | 9/2011 | Kumagai et al. | |
| 2012/0075460 A1 | 3/2012 | Aikawa et al. | |
| 2012/0076937 A1 | 3/2012 | Kato et al. | |
| 2012/0222615 A1 | 9/2012 | Kato et al. | |
| 2012/0267341 A1 | 10/2012 | Kato et al. | |
| 2013/0059415 A1 | 3/2013 | Kato et al. | |
| 2013/0122718 A1 | 5/2013 | Kato et al. | |
| 2013/0164942 A1 | 6/2013 | Kato et al. | |
| 2013/0251904 A1 | 9/2013 | Kato et al. | |
| 2013/0337635 A1 | 12/2013 | Yamawaku et al. | |
| 2013/0337658 A1 | 12/2013 | Ikegawa et al. | |
| 2014/0017909 A1 | 1/2014 | Kato | |
| 2014/0170859 A1 | 6/2014 | Yamawaku et al. | |
| 2014/0174351 A1 | 6/2014 | Aikawa | |
| 2014/0199856 A1 | 7/2014 | Kato et al. | |
| 2014/0213068 A1 | 7/2014 | Kato et al. | |
| 2014/0220260 A1 | 8/2014 | Yamawaku et al. | |
| 2014/0345523 A1 | 11/2014 | Kikuchi et al. | |
| 2014/0349032 A1 | 11/2014 | Kato et al. | |
| 2015/0011087 A1 | 1/2015 | Oshimo et al. | |
| 2015/0024143 A1 | 1/2015 | Kumagai et al. | |
| 2015/0078864 A1 | 3/2015 | Sato et al. | |
| 2015/0079807 A1 | 3/2015 | Tamura et al. | |
| 2015/0184293 A1 | 7/2015 | Kato et al. | |
| 2015/0184294 A1 | 7/2015 | Kato et al. | |
| 2015/0214029 A1 | 7/2015 | Hane et al. | |
| 2015/0225849 A1 | 8/2015 | Kato et al. | |

FOREIGN PATENT DOCUMENTS

| | | |
|---|---|---|
| JP | 04-287912 | 10/1992 |
| JP | 08-144040 | 6/1996 |
| JP | 09-260298 | 10/1997 |
| JP | 3144664 | 3/2001 |
| JP | 2001-254181 | 9/2001 |
| JP | 2003-502878 | 1/2003 |
| JP | 2007-247066 | 9/2007 |
| JP | 2008-153409 | 7/2008 |
| TW | 200609378 | 3/2006 |
| WO | WO 00/79019 A1 | 12/2000 |

* cited by examiner

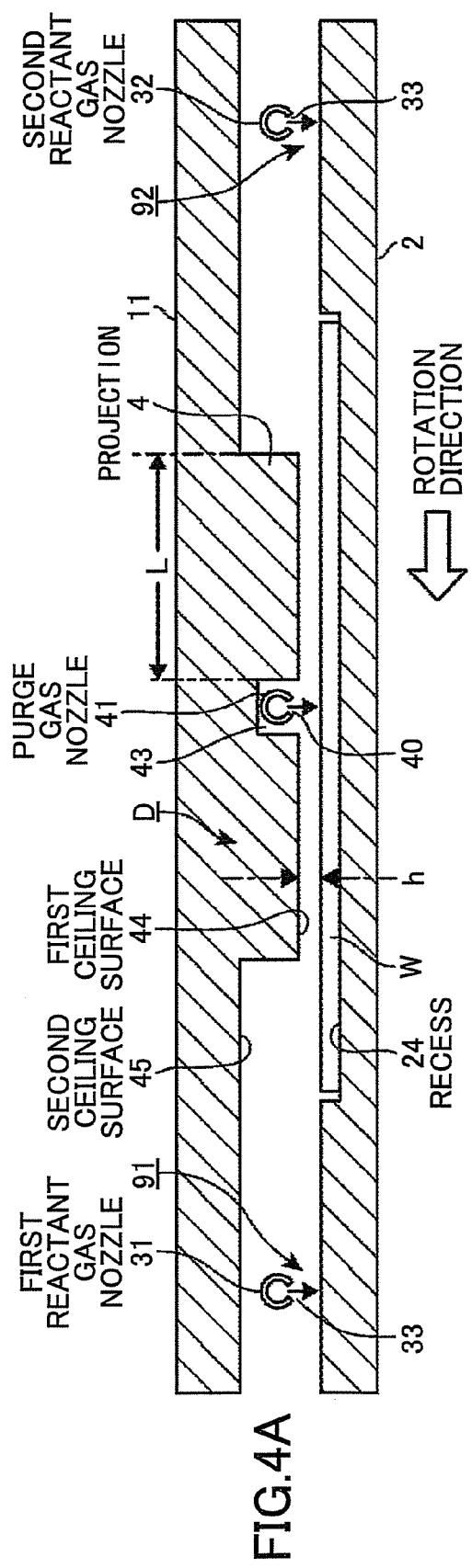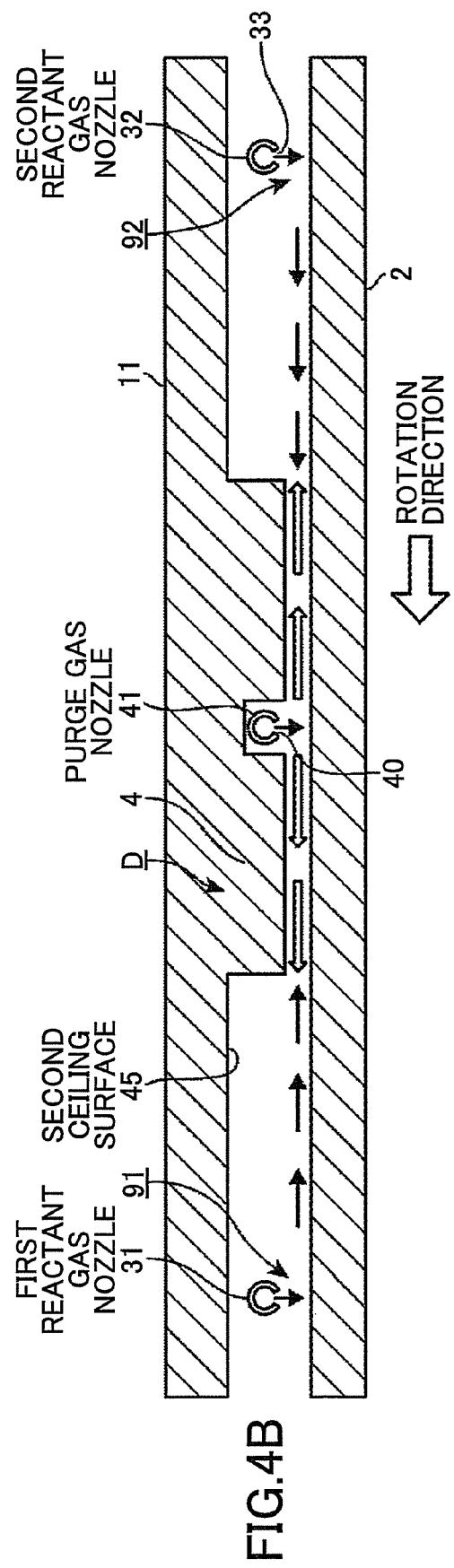

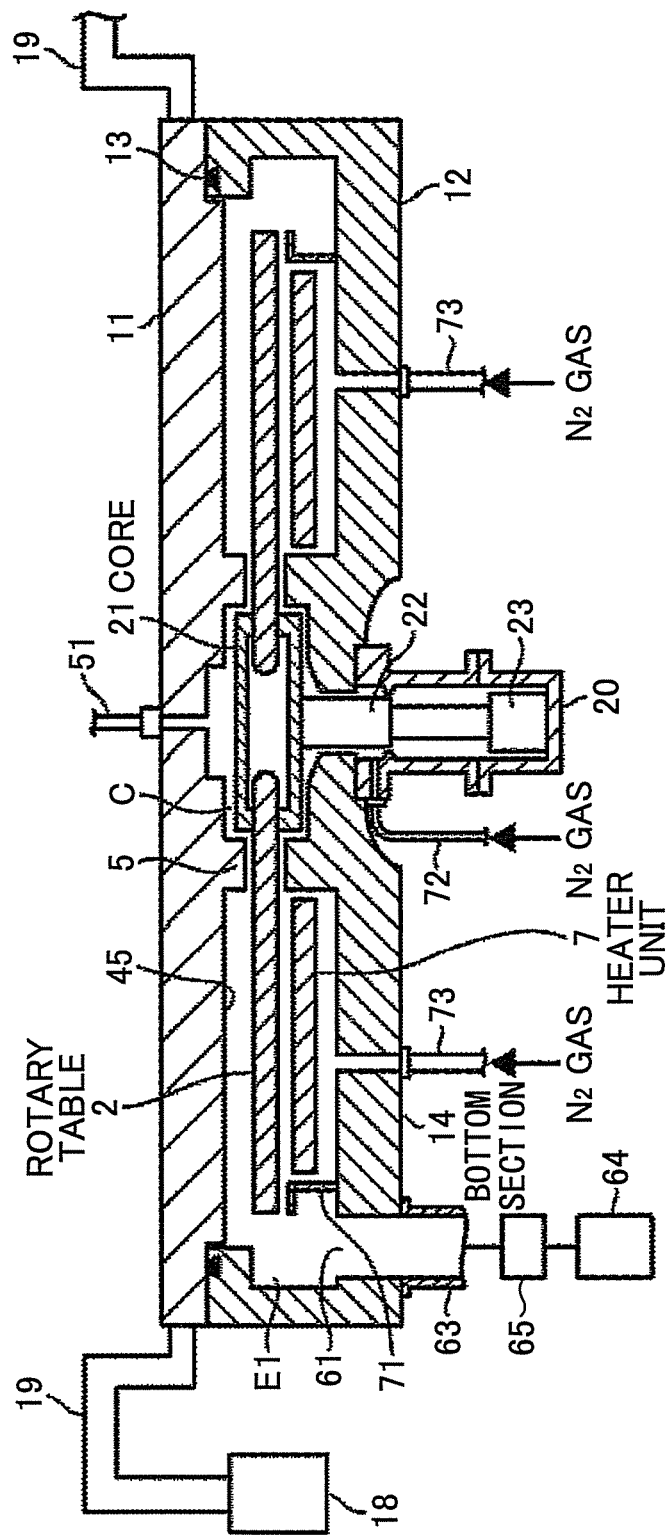

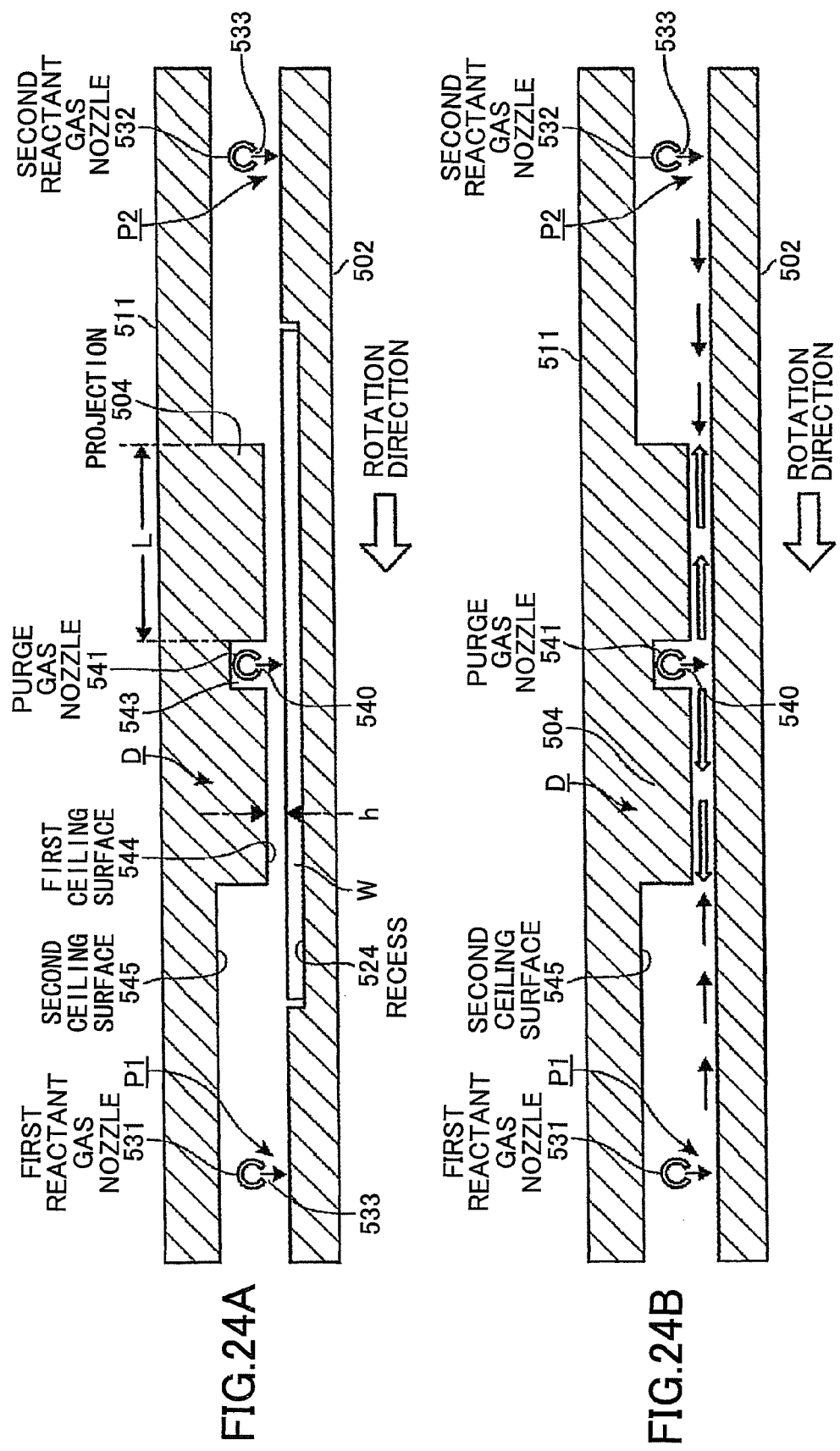

FILM DEPOSITION APPARATUS

BACKGROUND OF THE INVENTION

1. Field of the Invention

The disclosures herein generally relate to film deposition apparatuses, and particularly relate to a film deposition apparatus that forms a film on a substrate by supplying reactant gases through reactant gas nozzles in a vacuum container.

2. Description of the Related Art

A certain type of film deposition method used in semiconductor manufacturing processes supplies at least two types of reactant gases in sequence to a surface of a semiconductor wafer (hereinafter referred to as a "wafer") serving as a substrate in vacuum atmosphere to form a film. This method repeats plural cycles, each of which causes a first reactant gas to be adsorbed to a surface of a substrate, for example, and then switches the supplied gas to a second reactant gas to form one or more layers of atoms or molecules through reaction of these two gases on the wafer surface. The repetition of cycles creates layers one over another thereby to form a film on the wafer. Such a process is referred to as the ALD (Atomic Layer Deposition) or MLD (Molecular Layer Deposition). This process can control a film thickness with high precision by adjusting the number of cycles. High homogeneity of film quality over the extent of the surface is obtainable, thereby helping to create a thin semiconductor device.

Such a film deposition method may be preferred when forming a highly dielectric material for use as a gate oxide film, for example. When forming a silicon oxide film (i.e., $SiO_2$ film), for example, bis-tertiary butyl amino silane (hereinafter referred to as "BTBAS") may be used as a first reactant gas (i.e., source gas), and ozone gas may be used as a second reactant gas (i.e., oxidant gas).

Patent Documents 1 through 8 disclose apparatuses for practicing such a film deposition method. A general configuration of these apparatuses is as follows. In a vacuum container, a platform to support a plurality of wafers placed thereon in a circumferential direction (i.e., rotational direction) is provided. Further, a plurality of gas supply units for supplying process gases to the wafer is situated in the upper space of the vacuum container to face the platform.

The vacuum container is depressurized to a predetermined process pressure, with the wafers placed on the platform. The platform is then rotated relative to the gas supply units around a vertical axis while the wafers are heated. The gas supply units supply two or more different types of gases, e.g., the first reactant gas and the second reactant gas as previously described, to surfaces of wafers. Physical barrier walls or air curtains made by discharging inert gas are provided between gas supply units that supply the reactant gases. With this arrangement, the process area formed by the first reactant gas and the process area formed by the second reactant gas are isolated from each other in the vacuum container.

In this manner, plural types of reactant gases are simultaneously injected into a single vacuum container, and respective process areas are isolated from each other to prevent the reactant gases from being mixed on the wafers. Any given wafer that revolves around a center point is subjected to the first reactant gas and to the second reactant gas in sequence while going through the barrier walls or air curtains, thereby allowing the film deposition process to be performed thereon.

Maintenance work of the vacuum container is generally performed by opening a top panel of the vacuum container. This requires the reactant gas pipes to be disconnected from the top panel, which complicates the maintenance work. When reactant gases have left residuals inside the pipes, these residuals may fall due to the manual handling of the pipes, which may end up being undesirable particles.

A preparatory treatment such as a heating process or plasma process may be performed with respect to reactant gases before supplying the reactant gases to the vacuum container. To this end, a preparatory treatment unit to perform the preparatory treatment may need to be provided in the vicinity of the vacuum container, i.e., may need to be placed on the top surface of the top panel. Since such a preparatory treatment unit is generally bulky and heavy, an elevation mechanism for lifting the top panel ends up requiring a large amount of power. Further, there is also a need to secure sufficient space over the vacuum container such that the top panel plus the preparatory treatment unit can be lifted without any obstacle. This limits the choice of location where the apparatus is installed.

Accordingly, it is preferable to provide an arrangement for allowing easy maintenance work of a film deposition apparatus in which a rotary table to support wafers placed thereon is rotated in a vacuum container to revolve the wafers, which are subjected to a film deposition process performed by reactant gases supplied through reactant gas nozzles.

[Patent Document 1] U.S. Pat. No. 6,634,314
[Patent Document 2] Japanese Patent Application Publication No. 2001-254181: FIG. 1 and FIG. 2
[Patent Document 3] Japanese Patent No. 3144664: FIG. 1, FIG. 2, claim 1
[Patent Document 4] Japanese Patent Application Publication No. 4-287912
[Patent Document 5] U.S. Pat. No. 7,153,542: FIG. 8(a), (b)
[Patent Document 6] Japanese Patent Application Publication No. 2007-247066: paragraph 0023-0025, 0058, FIG. 12, and FIG. 18
[Patent Document 7] United States Patent Application Publication No. 2007-218701
[Patent Document 8] United States Patent Application Publication No. 2007-218702

SUMMARY OF THE INVENTION

According to a first aspect, a film deposition apparatus allowing easy maintenance work is provided in which a rotary table to support wafers placed thereon is rotated in a vacuum container to revolve the wafers, which are subjected to a film deposition process performed by reactant gases supplied through reactant gas nozzles.

In the first aspect, a film deposition apparatus for forming a thin film on a surface of a wafer by use of reactant gases includes: a rotary table including a substrate placement area in which a substrate is placed; a vacuum container including a container configured to accommodate the rotary table and a top panel configured to hermetically seal a top of the container; an open-and-close mechanism configured to open and close the top panel; a plurality of reactant gas nozzles disposed through and supported by an outer wall of the container of the vacuum container to be situated at different angular positions with respect to a rotation center of the rotary table to face areas in which the substrate placement area passes, the plurality of reactant gas nozzles having gas discharge ports arranged in radial directions with respect to the rotation center to supply respective reactant gases to a surface of the wafer thereby to form respective process areas; a discharge gas supply unit situated at an angular position between the process areas to supply purge gas to form an isolation area that isolates atmospheres of the process areas from each other; and an exhaustion unit configured to exhaust atmosphere inside the vacuum container.

According to at least one embodiment of the first aspect, a film deposition apparatus is provided in which a rotary table to support wafers placed thereon is rotated in a vacuum container to revolve the wafers, which are subjected to a film deposition process performed by reactant gases supplied through reactant gas nozzles, which are inserted into through-holes of the outer wall of the vacuum container for mounting thereof. Since the reactant gas nozzles are not connected to the top panel of the vacuum container, there is no need to detach the reactant gas nozzles at the time of opening and closing the top panel for maintenance work. This makes the maintenance work easier, and reduces the occurrence of particles caused by manual handling of the nozzle pipes. Further, the reactant gas nozzles are attached at the through-holes to the outer wall of the vacuum container. Accordingly, a preparatory treatment unit for performing a preparatory treatment with respect to a reactant gas flowing through a reactant gas nozzle can be situated alongside the vacuum container, thereby eliminating the need to place such a preparatory treatment unit on top of the top plate, which requires a high power opening-and-closing mechanism for driving the top panel.

According to a second aspect, a film deposition apparatus that can adjust the inclination of a gas nozzle relative to the horizontal axis is provided.

In the second aspect, a film deposition apparatus for forming a thin film by supplying reactant gases to a surface of a wafer includes: a vacuum container; a substrate placement unit disposed in the vacuum container and configured to support a substrate placed thereon in a substantially horizontal position; a reactant gas nozzle having one end thereof inserted into a hole formed in a wall part of the vacuum container to extend over the substrate placement unit to supply a reactant gas to a surface of the substrate placement unit; a movement unit configured to move the substrate placement unit relative to the reactant gas nozzle; a sealing member disposed between the one end of the reactant gas nozzle and the wall part of the vacuum container to fixedly support the one end of the reactant gas nozzle while hermetically sealing an inner space of the vacuum container; and an inclination adjustment unit configured to support the reactant gas nozzle from below at a support point that is closer to the inner space of the vacuum container than a position of the hole, such that a height of the support point is adjustable to adjust inclination of the reactant gas nozzle relative to the horizontal position.

According to at least one embodiment of the second aspect, one end of the reactant gas nozzle extending in a substantially horizontal direction is inserted into a hole formed in the wall part of the vacuum container. The sealing member disposed between the one end of the reactant gas nozzle and the wall part of the vacuum container fixedly supports the reactant gas nozzle while hermetically sealing an inner space of the vacuum container. Further, the inclination adjustment unit supports the reactant gas nozzle from below at a support point that is situated closer to the inner space of the vacuum container than the insertion hole, with the provision to adjust the height of the support point. Since the height of the support point of the reactant gas nozzle is adjusted at the position that is more inside than the position at which the reactant gas nozzle is fixed to the vacuum container, the inclination of the reactant gas nozzle relative to the horizontal plane can be adjusted. This inclination adjustment may be performed such as to suppress the dropping of the distal end of the reactant gas nozzle, or may be performed such as to bring the distal side of the reactant gas nozzle closer to the substrate placement unit than the proximal side. With this arrangement, the amount of reactant gases supplied from the reactant gas nozzles and adsorbed by the wafers may be adjusted to be constant across the surface of a given wafer. Accordingly, a satisfactory film deposition process is achieved.

Other objects and further features of the present invention will be apparent from the following detailed description when read in conjunction with the accompanying drawings.

BRIEF DESCRIPTION OF THE DRAWINGS

FIGS. 4A and 4B are cross-sectional views of the film deposition apparatus for illustrating process areas and an isolation area;

FIGS. 14A and 14B are cross-sectional views of the film deposition apparatus at the time of maintenance work;

FIGS. 24A and 24B are cross-sectional views of the film deposition apparatus for illustrating process areas and an isolation area;

DESCRIPTION OF THE PREFERRED EMBODIMENTS

In the following, embodiments of the present invention will be described with reference to the accompanying drawings.

Figure 1:
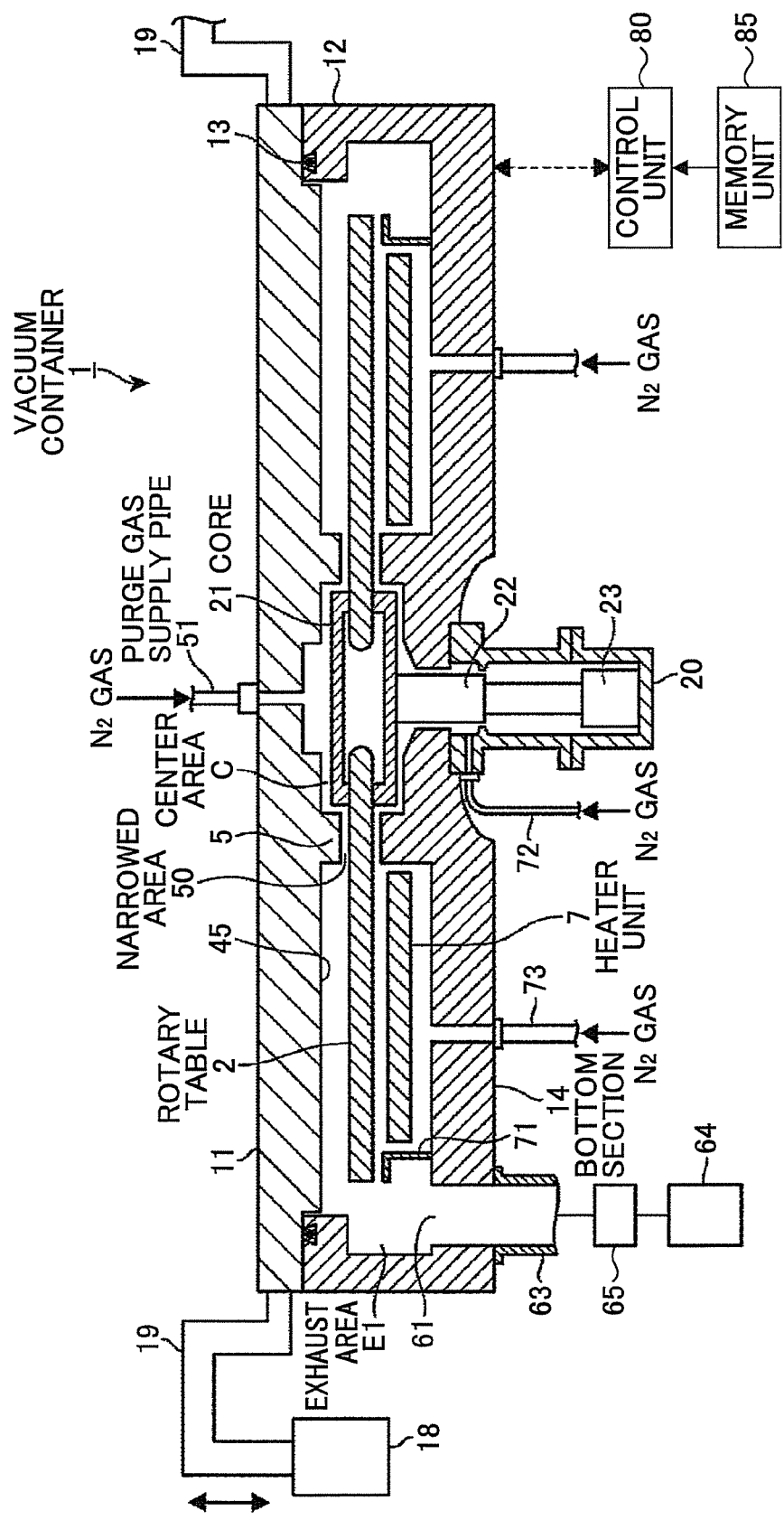
FIG. 1 is a cross-sectional view of a film deposition apparatus according to an embodiment of the present invention.
Figure 2:
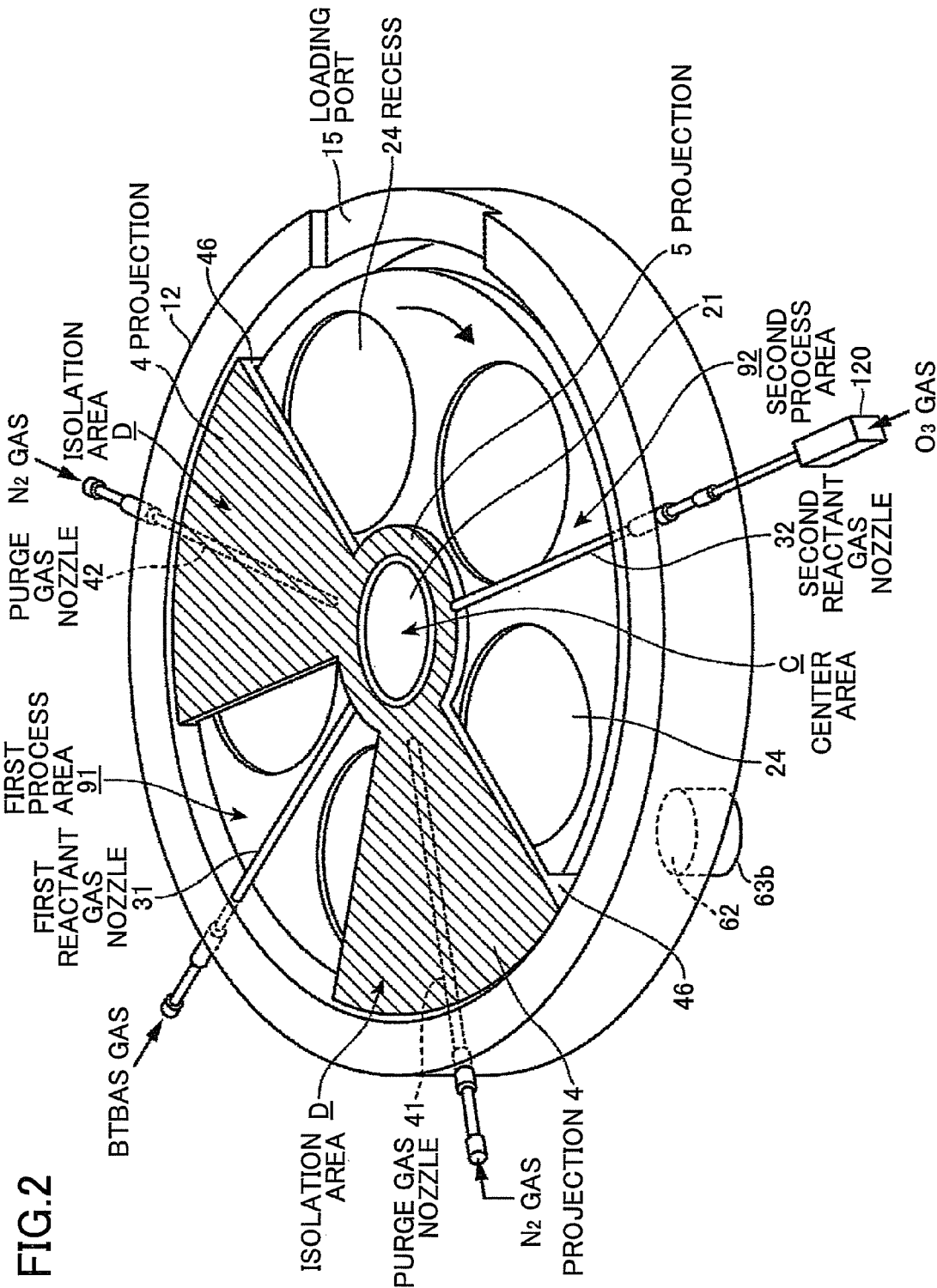
FIG. 2 is an oblique perspective view showing a schematic configuration of the inside of the film deposition apparatus.
Figure 3:
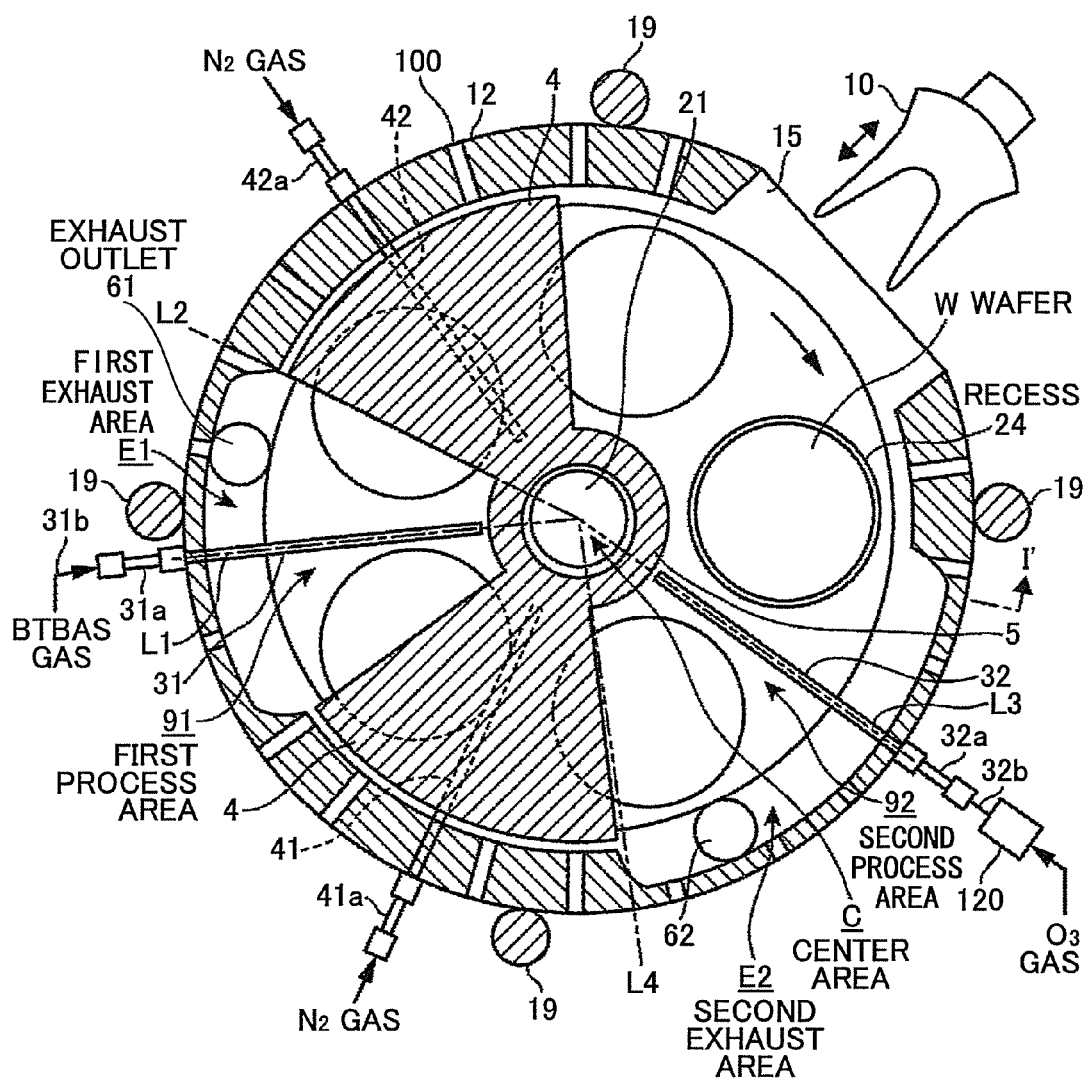
FIG. 3 is a horizontal sectional view of the film deposition apparatus.

A film deposition apparatus according to a first embodiment of the present invention includes a vacuum container 1 having a generally flat circular shape and a rotary table 2 situated in the vacuum container 1 with a rotation center thereof at a general center of the vacuum container 1, as illustrated in FIG. 1 through FIG. 3. The vacuum container 1 includes a container 12 having a general cup shape to accommodate the rotary table 2 and a top panel 11 having a disc shape to hermetically seal the top opening of the container 12. An opening-&-closing mechanism 18 for lifting and lowering the top panel 11 is provided at the exterior of the vacuum container 1 as illustrated in FIG. 1. As illustrated in FIG. 3, lifting shafts 19 extending from the opening-&-closing mechanism 18 are situated at four points, for example, at equal intervals along the perimeter of the top panel 11. The opening-&-closing mechanism 18 places the top panel 11 by use of the lifting shafts 19 in the position to hermetically seal the vacuum container 1, or places the top panel 11 by use of the lifting shafts 19 in the position that allows maintenance work to be performed. In this manner, the top panel is detachable from the container 12 through opening-&-closing (i.e., lifting-&-lowering) movements. Upon reduction of interior pressure inside the vacuum container 1, the top panel 11 is pressed against the container 12 to maintain the airtight condition, with a sealant such as an O ring intervening therebetween that has a ring shape provided at the top rim of the container 12. In this example, the lifting shafts 19 are connected to the side face of the top panel 11. Notwithstanding this, the lifting shafts 19 may be connected to the top surface of the top panel 11. Further, an opening-&-closing mechanism 18 may be provided separately for each of the lifting shafts 19. Illustration of the opening-&-closing mechanism 18 and the lifting shafts 19 are omitted in figures other than FIG. 1 and FIG. 3 as well as FIGS. 14A and 14B, which will be described later.

The rotary table 2 is fixedly mounted at its center to a core 21 having a cylindrical shape. The core 21 is fixedly mounted to a top end of a rotation shaft 22 extending in a vertical direction. The rotation shaft 22 penetrates through a bottom section 14 of the vacuum container 1, and has its bottom end attached to a drive unit 23. The drive unit 23 rotates the rotation shaft 22 clockwise around a vertical axis. The rotation shaft 22 and the drive unit 23 are accommodated in a case 20 having a cylindrical shape with an opening at the top. The case 20 has a flange portion at the top, which is attached to the bottom surface of the bottom section 14 of the vacuum container 1 in an airtight manner. The atmosphere inside the case 20 is thus hermetically isolated from the exterior atmosphere.

Recesses 24 each having a circular shape are formed in the surface of the rotary table 2 as illustrated in FIG. 2 and FIG. 3, so that semiconductor wafers (hereinafter referred to as "wafers"), which may be five substrates, for example, can be placed therein in a circular direction (i.e., circumferential direction). With the rotation of the rotary table 2, the recesses 24 revolve around a vertical axis, which is the rotation center of the rotary table 2. For the sake of convenience of illustration, FIG. 3 shows only one wafer W in one of the recesses 24. FIGS. 4A and 4B are development views in which a rotary table is sectioned along a concentric circle and developed in a horizontal direction. As illustrated in FIG. 4A, the diameter of the recess 24 is slightly larger than the diameter of the wafer W, e.g., larger by a margin of 4 mm, and the depth of the recess 24 is configured to be substantially equal to the thickness of the wafer W. When the wafer is placed in the recess 24, thus, the upper surface of the wafer W and the upper surface of the rotary table 2 (i.e., in the places where no wafer is placed) are flush with each other. If there is a large difference in elevation between the surface of the wafer and the surface of the rotary table 2, a step created by such a difference causes pressure variation. For the purpose of achieving an even film thickness over the extent of the surface, the surface of the wafer W and the surface of the rotary table 2 may preferably have the same elevation (i.e., flush with each other). The provision that the wafer surface and the surface of the rotary table 2 may preferably be flush with each other may include a situation in which these surfaces are at the same elevation, or have a difference in elevation within a margin of 5 mm. It is preferable, however, that a difference in elevation between these surfaces be set as close to zero as processing precision allows. Through-holes (not shown) are formed at the bottom surface of the recesses 24, so that three elevating pins 16 (see FIG. 10)

are inserted through the holes for the purpose of elevating the wafer W from the bottom surface of the wafer W, as will be described later.

The recesses 24 serve to position wafers W in order to prevent them from being thrown outwardly by a centrifugal force associated with the rotation of the rotary table 2. The substrate placement part (i.e., wafer placement area) is not limited to a recess. Alternatively, guide members for embracing the circumferential edge of the wafer W may be arranged on the rotary table 2. When a chuck mechanism such as an electrostatic chuck is provided in the rotary table 2 to achieve wafer adhesion, the places to which wafers W are adhered serve as the substrate placement parts.

Figure 5:
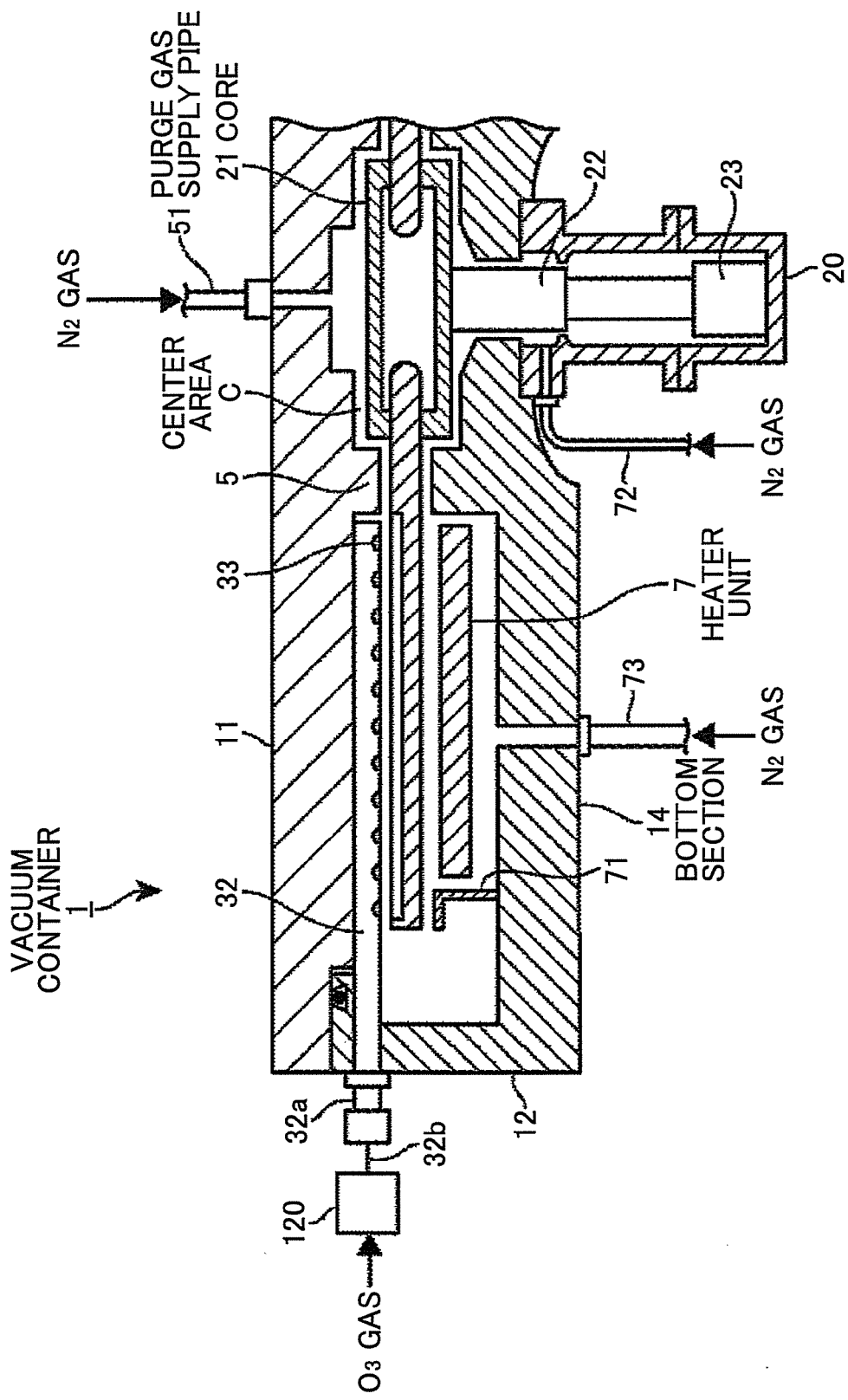
FIG. 5 is a cross-sectional view of the film deposition apparatus for illustrating a portion where a nozzle is attached.
Figure 6A:
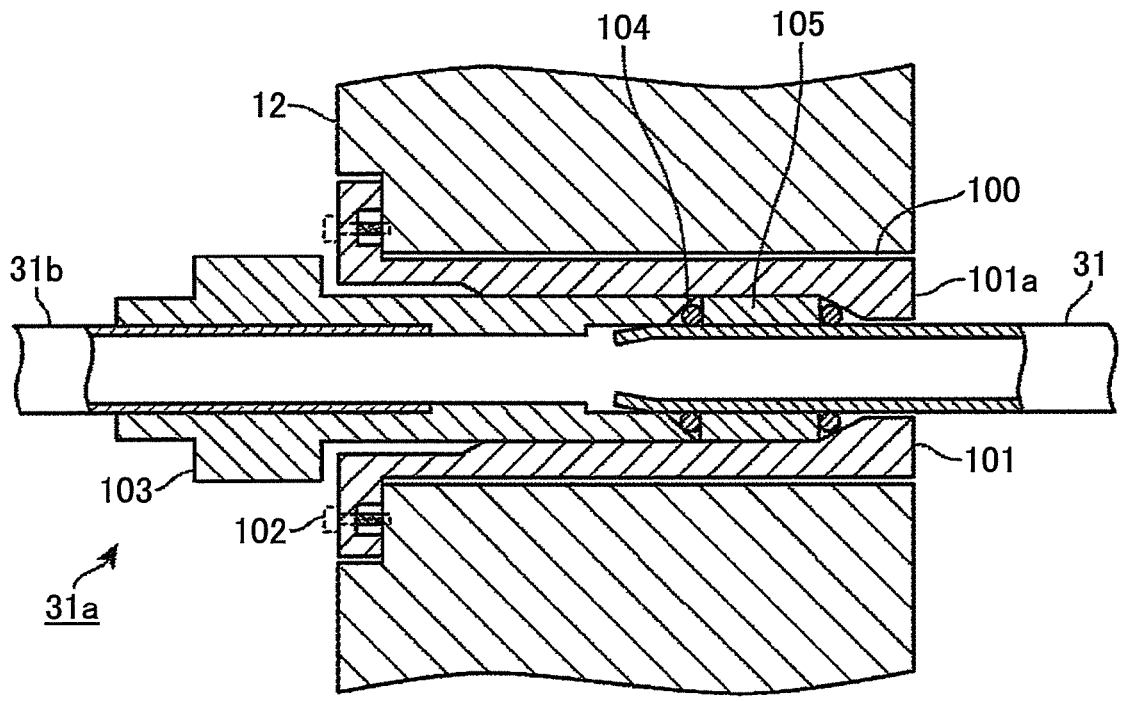
FIGS. 6A and 6B are schematic drawings showing mechanisms for attaching the nozzle.
Figure 6B:
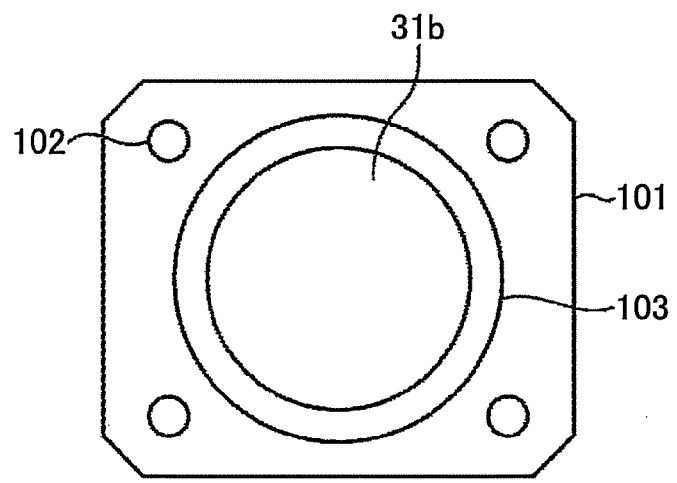

As illustrated in FIG. 2, FIG. 3, and FIG. 5, a first reactant gas nozzle 31, a second reactant gas nozzle 32, and two purge gas nozzles 41 and 42, each of which is made of quartz, are situated at intervals along the circumferential direction of the vacuum container 1 (i.e., the circular direction of the rotary table 2) above the areas where the recesses 24 of the rotary table 2 pass. In this example, the second reactant gas nozzle 32, the purge gas nozzle 41, the first reactant gas nozzle 31, and the purge gas nozzle 42 are arranged clockwise in the order listed. Each of the reactant gas nozzles 31 and 32 and purge gas nozzles 41 and is configured to extend horizontally from the outer circumference wall of the vacuum container 1 toward to the rotation center of the rotary table 2 to face the wafers W. Gas injecting ports 31a, 32a, 41a, and 42a provided at the ends of the respective nozzles penetrate through the outer circumference wall. The nozzles 31, 32, 41, and 42 are attached to the side wall of the vacuum container 1 through the same mechanism. In the following, this attachment mechanism will be described by using the nozzle 31 as an example by referring to FIGS. 6A and 6B.

The side wall of the vacuum container 1 has a through-hole 100 through which the nozzle 31 is attached. Into the through-hole 100, an outer sleeve 101 having a generally cylindrical shape is inserted from outside the vacuum container 1. On the exterior of the vacuum container 1, a flange of the outer sleeve 101 formed at its one end is fixed to the side wall of the vacuum container 1 by use of bolts 102, with an intervening O ring serving as a ring-shape resin sealing member (not shown). The interior space of the outer sleeve 101 narrows toward its distal end (i.e., toward the interior side of the vacuum container 1), thereby forming a tapering unit 101a. A joint unit 103 having a pipe shape is inserted into the outer sleeve 101 from outside the vacuum container 1, and is connected to a gas supply pipe 31b extending from the gas injecting port 31a. An inner sleeve 105 having a ring shape is disposed between the distal end of the joint unit 103 and the tapering unit 101a, with O rings 104 situated on both sides of the inner sleeve 105. Into the inner sleeve 105, the proximal end of the nozzle 31 is inserted from inside the vacuum container 1. The opening at this proximal end is situated deeper (i.e., further toward outside the vacuum container 1) than the distal end of the joint unit 103.

When the joint unit 103 is pressed against the tapering unit 101a by a fixture member (not shown), the outer sleeve 101 and the nozzle 31 are hermetically pressed against each other via the intervening O rings 104 flattened by the pressure, so that the nozzle 31 is fixedly kept in place. When the joint unit 103 is moved away from the tapering unit 101a, the nozzle 31 is detachable from inside the vacuum container 1. Alternatively, the nozzle 31 may be hermetically fixed to the interior of the joint unit 103, so that the nozzle 31 is detached together with the joint unit 103 from outside the vacuum container 1.

In this configuration, it is easy to replace the nozzle 31 since there is no need to open the top panel 11 at the time of replacing the nozzle 31.

Through-holes 100 each serving as a hole at which the nozzle 31, 32, 41, or 42 is attached are formed at equal intervals at plural points along the circumference as illustrated in FIG. 3, avoiding the position of a loading port 15 which will be described later. The number of the through-holes may be 21, for example. In this example, the through-holes 100 have the same size such as the same opening size, so that the attaching holes can be used for both the reactant gas nozzles 31 and 32 and the purge gas nozzles 41 and 42. The through-holes 100 at which no nozzles 31, 32, 41, and 42 are attached are hermetically sealed by a cover member (not shown).

Provision is made such that BTBAS (i.e., bis-tertiary butyl amino silane) serving as a first reactant gas and $O_3$ (ozone) serving as a second reactant gas are supplied to the reactant gas nozzles 31 and 32 through the gas supply pipes 31b and 32b, respectively, which are provided with valves and flow amount adjustment units (not shown). The reactant gas nozzle 32 is connected to a heat treatment unit 120 situated upstream alongside the vacuum container 1 as illustrated in FIG. 2 and FIG. 3. The heat treatment unit 120 is a preparatory treatment unit for heating $O_3$ gas flowing through the reactant gas nozzle 32. The heat treatment unit 120 is provided with an embedded heating unit such as a heater (not shown). With this arrangement, $O_3$ gas is heated to 300 degrees Celsius, for example. Provision is made such that $N_2$ gas (i.e., nitrogen gas) is supplied to the purge gas nozzles 41 and 42 through gas supply pipes provided with valves and flow amount adjustment units (not shown).

Each of the reactant gas nozzles 31 and 32 has gas discharge ports 33 facing downward and arranged at an interval of 10 mm, for example, along the extension of the nozzle to discharge reactant gas downwards. Each of the gas discharge ports 33 may have a diameter of 0.5 mm. Each of the purge gas nozzles 41 and 42 has gas discharge ports 40 facing downward and arranged at an interval of 10 mm, for example, along the extension of the nozzle to discharge purge gas downward. Each of the gas discharge ports 40 may have a diameter of 0.5 mm, for example. The distance between the gas discharge ports 33 of the reactant gas nozzles 31 and 32 and the wafer W is in the range of 1 to 4 mm, for example, and is preferably 2 mm. The distance between the gas discharge ports 40 of the purge gas nozzles 41 and 42 and the wafer W is in the range of 1 to 4 mm, for example, and is preferably 3 mm. The areas under the reactant gas nozzles 31 and 32 are comprised of a first process area 91 for causing BTBAS gas to be adsorbed to the wafer W and a second process area 92 for causing O3 gas to be adsorbed to the wafer W.

The purge gas nozzles 41 and 42 serve to form isolation areas D to isolate the first process area 91 and the second process area 92 from each other. As illustrated in FIG. 2 through FIGS. 4A and 4B, the top panel 11 of the vacuum container 1 has projections 4 each having a planar fan shape projecting downward, which may be defined as a pie shape made by dividing an imaginary circle drawn near the inner wall of the vacuum container 1 around the rotation center of the rotary table 2. Each of the purge gas nozzles 41 and 42 is accommodated in a groove 43 formed in the projection 4 to extend in a radial direction of the circle at a general center of the projection 4. The distances from the center axis of the purge gas nozzle 41 (or 42) to the opposite edges of the fan-shape projection 4 (i.e., one edge situated upward and the other edge situated downward in a rotation direction of the rotary table 2) are set equal to each other.

The groove 43 is formed to divide the projection 4 by half in the present embodiment. In other embodiments, the groove 43 may be formed at such a position that the section of the projection 4 situated upstream relative to the groove 43 in the rotational direction of the rotary table 2 is wider than the section of the projection 4 situated downstream relative to the groove 43.

In this configuration, a low ceiling surface 44 (first ceiling surface) that may be flat is provided as the lower surface of the projection 4 on both sides of each of the purge gas nozzles 41 and 42 in the rotational direction. On both sides of the ceiling surface 44 in the rotational direction, a ceiling surface 45 (second ceiling surface) higher than the ceiling surface 44 is situated. The projection 4 serves to create isolation space that is a narrowed space to prevent the first reactant gas and the second reactant gas from being merged by entering the space between the ceiling and the rotary table 2

In the case of the purge gas nozzle 41, for example, the isolation space prevents $O_3$ gas from intruding from upstream in the rotational direction of the rotary table 2, and also prevents BTBAS gas from intruding from downstream in the rotational direction. The phrase "prevention of gas intrusion" or the like refers to the fact that the $N_2$ gas serving as purge gas discharged from the purge gas nozzle 41 spreads into the space between the first ceiling surface 44 and the rotary table 2 to flow into adjacent space under the second ceiling surface 45 situated alongside the ceiling surface 44, so that gas in the adjacent space is unable to intrude into the narrowed space. Further, the phrase "inability of gas to intrude" not only means that the no gas whatsoever enters the space under the projection 4 from the adjacent space, but also means that the gas can enter to some extent, but the $O_3$ gas and the BTBAS gas entering from both sides are still not mixed with each other under the projection 4. As long as these conditions are maintained, the isolation area D properly achieves its purpose to isolate the atmosphere of the first process area 91 and the atmosphere of the second process area 92 from each other. The degree of narrowness of the narrowed space is such that a pressure difference between the narrowed space (i.e., space under the projection 4) and the adjacent space (i.e., space under the second ceiling surface 45) ensures the presence of the function to maintain the "inability-of-gas-to-intrude" condition. A specific size may differ depending on the area size of the projection 4, for example. It should be noted that a gas adsorbed to the wafer W passes through the isolation area D. The gas that is referred to in the expression "prevention of gas intrusion" or the like is one that is in the gas phase.

In this example, the wafer W having a diameter of 300 mm is used as a substrate to be processed. In this case, the projection 4 may be 146-mm wide in a circular direction (i.e., as measured along an arc of a circle concentric with the rotary table 2) at a distance of 140 mm from the rotation center of the rotary table 2 (i.e., at the boundary with a projection 5 which will be described later). The circumferential length of the projection 4 at the outermost point of the wafer placement areas (i.e., recesses 24) is 502 mm, for example, As illustrated in FIG. 4A, the portion of the projection 4 situated on either side of the purge gas nozzle 41 (42) has a length L in the circumferential direction that is equal to 246 mm at the above-noted outermost point.

The height h of the ceiling surface 44 that is the lower surface of the projection 4 relative to the surface of the rotary table 2 illustrated in FIG. 4A may range from about 0.5 mm to about 10 mm, and may preferably be about 4 mm. In this case, the rate of revolution of the rotary table 2 may be set equal to 1 rpm to 500 rpm, for example. In order to secure the isolation function of the isolation area D, the size of the projection and the height h of the lower surface (i.e., ceiling surface 44) of the projection 4 relative to the surface of the rotary table 2 may be determined based on results obtained by conducting experiments, depending on the range of rate of revolution of the rotary table 2. The purge gas is not limited to nitrogen (N2) gas, and may be an inert gas such as argon (Ar) gas. The purge gas is not even limited to an inert gas, and may even be hydrogen gas. As long as the gas does not affect the film deposition process, any type of gas may be used as the purge gas.

The lower surface of the top panel 11 has a projection 5 along the perimeter of the core 21 to face the rotary table 2 at the position slightly outside the core 21. The projection 5 is continuous with and seamlessly connected to the projection 4 at a point near the rotation center of the rotary table 2, and has a lower surface that is situated at the same elevation as the lower surface of the projection 4 (i.e., ceiling surface 44). FIG. 2 and FIG. 3 illustrate the top panel 11 that is sectioned through a horizontal plane at an elevation that is lower than the ceiling surface 45 but higher than the purge gas nozzles 41 and 42. The projection 5 and the projection 4 do not have to be integral, and may be provided as separate elements.

Figure 7:
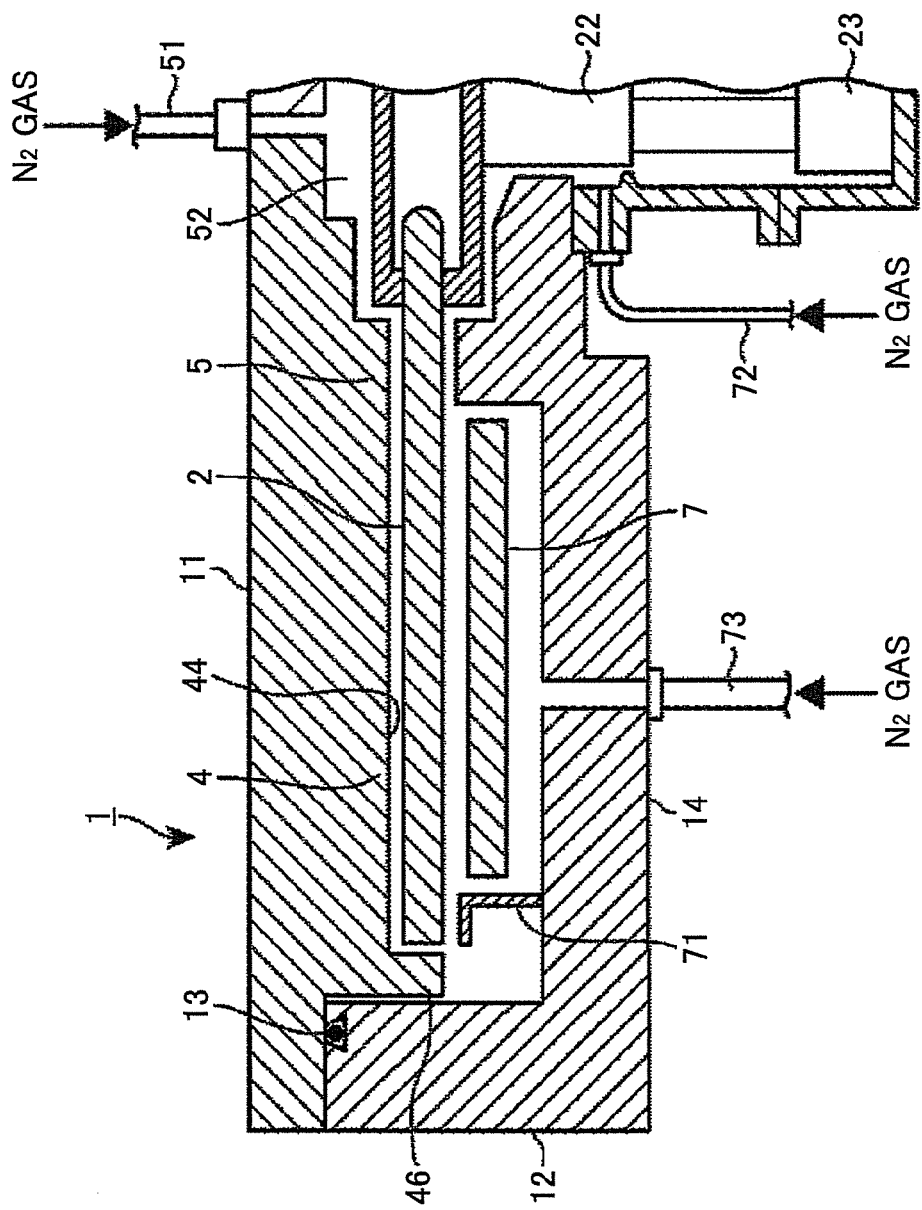
FIG. 7 is a cross-sectional view showing a portion of the film deposition apparatus.

The lower surface of the top panel 11 of the vacuum container 1, i.e., the ceiling surface situated over the wafer placement areas (i.e., recesses 24) of the rotary table 2, has the first ceiling surfaces 44 and the second ceiling surfaces 45 higher than the ceiling surfaces 44 arranged in a circumferential direction. FIG. 1 illustrates a vertical sectional view of the top panel 11 at the position where the higher ceiling surface 45 is situated. FIG. 7 illustrates a vertical sectional view of the top panel 11 at the position where the lower ceiling surface 44 is situated. The periphery of the fan-shape projection 4 (i.e., periphery of the vacuum container 1) has a bent part 46 having an L-letter shape that faces the side edge of the rotary table 2, as illustrated in FIG. 2 and FIG. 7. Since the top panel 11 having the fan-shape projection 4 is configured to be detachable from the container 12, the outer circumferential surface of the bent part 46 and the container 12 have a small gap therebetween. Like the projection 4, the bent part 46 is provided for the purpose of preventing reactant gases from intruding from both sides, thereby preventing the reaction gases from being mixed. The gap between the inner circumferential face of the bent part 46 and the side edge face of the rotary table 2 and the gap between the outer circumferential face of the bent part 46 and the container 12 are set to a similar size to the height h of the ceiling surface 44 relative to the surface of the rotary table 2. In this example, as viewed from the surface area of the rotary table 2, the inner circumferential surface of the bent part 46 appears to constitute the inner circumferential surface of the vacuum container 1.

As illustrated in FIG. 7, the inner wall of the container 12 is formed vertically in the close proximity of the outer circumferential surface of the bent part 46 at the position of the isolation area D. At the other positions where the isolation area D is not situated, the inner wall of the container 12 has a recess that appears in FIG. 1 as a step-like-shape dent in the cross-sectional view of the container 12 from the position facing the side edge of the rotary table 2 down to the position immediately above the bottom section 14. Space at this recess communicating with the first process area 91 or the second process area 92 is referred to as a first exhaust area E1 or a second exhaust area E2, respectively. At the bottom of the first exhaust area E1 and second exhaust area E2, a first exhaust outlet 61 and a second exhaust outlet 62 are formed, respectively, as illustrated in FIG. 1 and FIG. 3. The first exhaust outlet 61 and the second exhaust outlet 62 are connected through an exhaust path 63 having a valve 65 to a vacuum pump 64 serving as a vacuum exhaust unit, as illustrated in FIG. 1.

The exhaust outlets 61 and 62 are provided on both sides of the isolation area D in the rotational direction as viewed from above, so that the isolation area D properly exerts its isolation function. More specifically, the first exhaust outlet 61 is situated between the first process area and the isolation area D that is adjacently situated downstream relative to the first process area 91 in the rotational direction of the rotary table 2. Further, the second exhaust outlet 62 is situated between the second process area 92 and the isolation area D that is adjacently situated downstream relative to the second process area 92 in the rotational direction of the rotary table 2. The first exhaust outlet 61 and the second exhaust outlet 62 exhaust the respective reactant gases (i.e., BTBAS gas and $O_3$ gas) separately from each other. In the present embodiment, the exhaust outlet is disposed between the reactant gas nozzle 31 and an imaginary extension of the side edge of the isolation area D adjoining the space of the reactant gas nozzle 31 downstream in the rotation direction. The exhaust outlet 62 is disposed between the reactant gas nozzle 32 and an imaginary extension of the side edge of the isolation area D adjoining the space of the reactant gas nozzle 32 downstream in the rotation direction. Namely, the first exhaust outlet 61 is disposed between a straight line L1 shown as a chain line in FIG. 3 passing through the first process area 91 and the center of the rotary table 2 and a straight line L2 extending along the edge of the isolation area D adjoining the first process area 91 downstream in the rotation direction to pass through the center of the rotary table 2. Further, the second exhaust outlet 62 is disposed between a straight line L3 shown as a two-dot chain line in FIG. 3 passing through the second process area 92 and the center of the rotary table 2 and a straight line L4 extending along the upstream edge of the isolation area D adjoining the second process area 92 downstream in the rotation direction to pass through the center of the rotary table 2.

The number of exhaust outlets is not limited to two. For example, another exhaust outlet may be disposed between the isolation area D including the purge gas nozzle 42 and the second reactant gas nozzle 32 whose space adjoins this isolation area D downstream in the rotation direction. The number of exhaust outlets may even be four or more. In the illustrated example, the exhaust outlets 61 and 62 are situated at the position lower than the rotary table 2. Exhaustion is thus conducted through a gap between the inner wall of the vacuum container 1 and the side edge of the rotary table 2. This is only an example. The positions of the exhaust outlets 61 and 62 are not limited to the bottom section of the vacuum container 1. The exhaust outlets 61 and 62 may alternatively be formed in the sidewall of the vacuum container 1. When the exhaust outlets 61 and are formed in the sidewall of the vacuum container 1, their position may be situated higher than the rotary table 2. The provision of the exhaust outlets 61 and 62 in the above-noted arrangements causes the gases on the rotary table 2 to flow toward the outer periphery of the rotary table 2. These arrangements are thus advantageous in that the unsettling of particles is reduced compared with the arrangement in which exhaustion is performed from above the rotary table 2.

Figure 8:
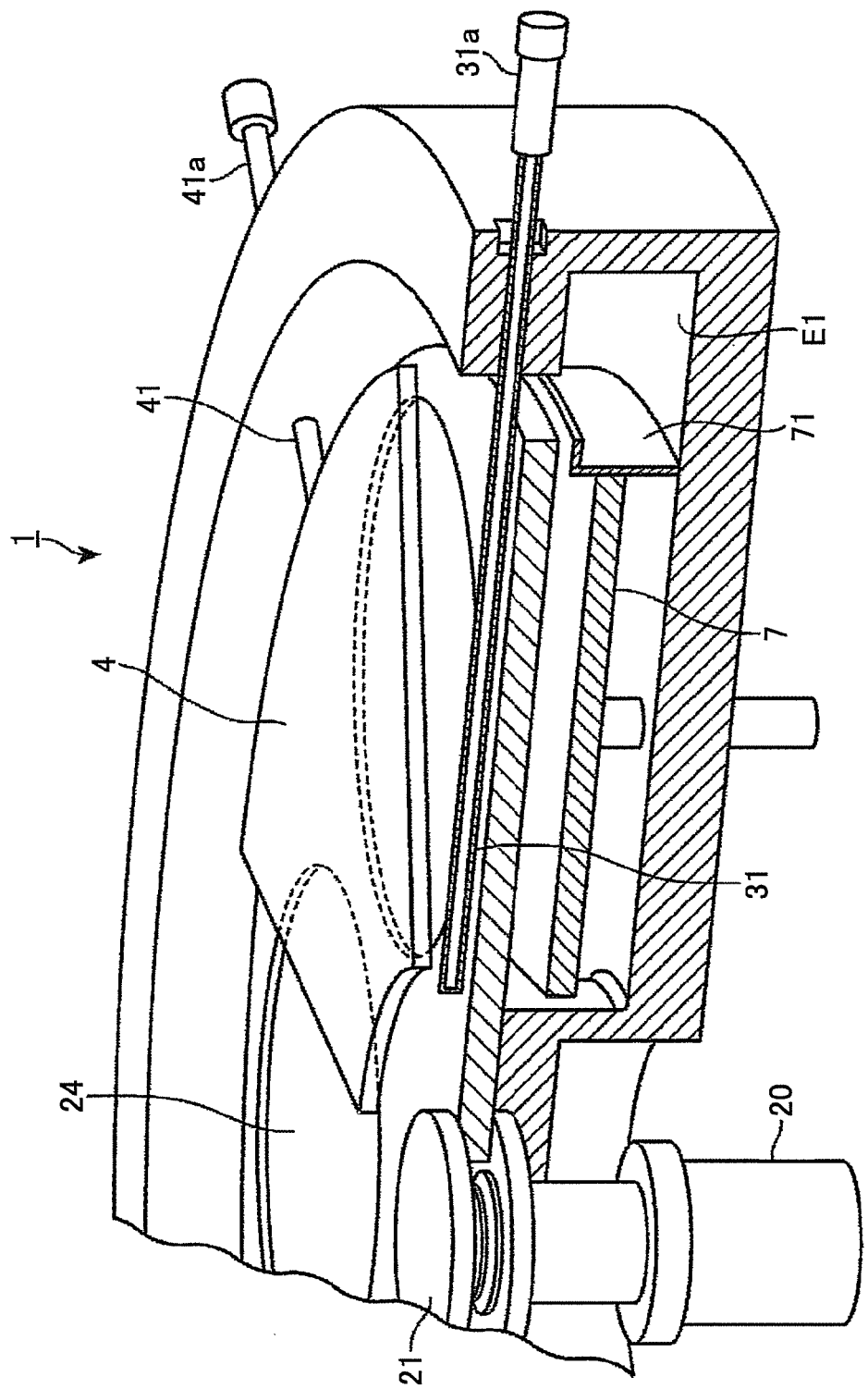
FIG. 8 is an oblique sectional view of a portion of the film deposition apparatus.

A heater unit 7 serving as a heating means is disposed in the space between the rotary table 2 and the bottom section 14 of the vacuum container 1 as illustrated in FIG. 1 and FIG. 8. The heater unit 7 heats the wafers W on the rotary table 2 through the rotary table 2 to a temperature that is determined according to the process recipes. A cover member 71 is provided under the rotary table 2 near its outer edge to cover the heater unit 7 around the entire perimeter thereof. The cover member 71 serves to separate the atmosphere of the space where the heater unit 7 is disposed from the atmosphere extending from space over the rotary table 2 to the exhaust area E. The upper end of the cover member 71 is bent outward to form a flange portion. A gap between the flange portion and the lower surface of the rotary table 2 is set to be small, so that no gas enters the inner space of the cover member 71 from outside.

The bottom section 14 has a raised structure that comes close to the lower surface of the rotary table 2 and the core 21 around the rotation center in the area that is inside the position of the heater unit 7, thereby forming a narrowed space. The through-hole formed through the bottom section 14 to accommodate the rotation shaft is configured such that a gap between the rotation shaft 22 and the inner circumferential surface of the through-hole is narrow. These narrow spaces communicate with the inner space of the case 20. The case 20 is provided with a purge gas supply pipe 72 to supply $N_2$ gas serving as a purge gas to the above-noted narrow spaces for purging purposes. Further, the bottom section 14 of the vacuum container 1 is provided with purge gas supply pipes 73 for purging the space where the heater unit 7 is disposed. The purge gas supply pipes 73 are situated at plural locations along the circumferential direction under the heater unit 7.

Figure 9:
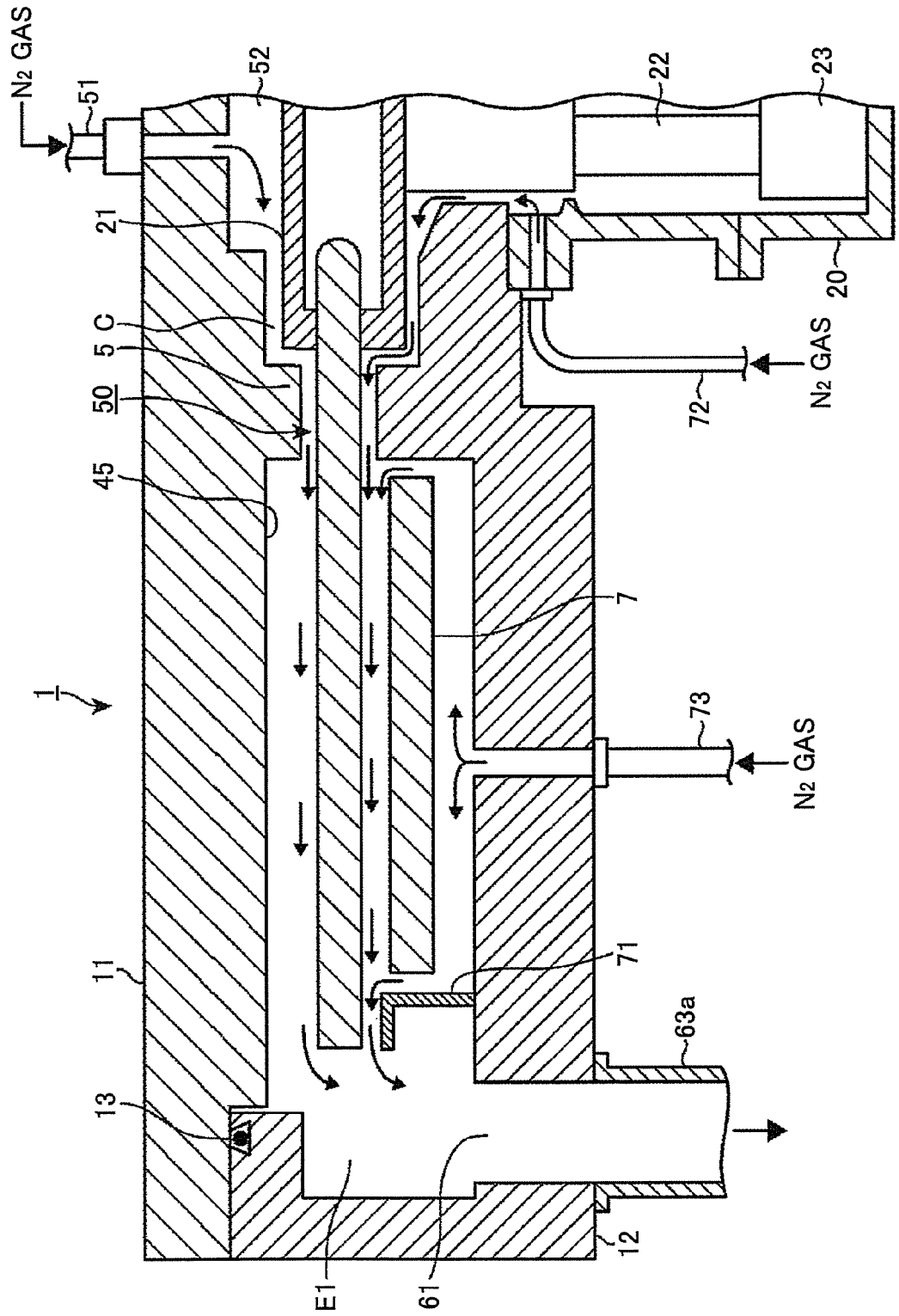
FIG. 9 is a drawing showing the flows of purge gas.

The provision of the purge gas supply pipe and the purge gas supply pipes 73 creates the flows of purge gas as illustrated by arrows in FIG. 9. The $N_2$ gas purges the space inside the case 20 and the space in which the heater unit 7 is disposed. The $N_2$ gas then flows through the gap between the rotary table 2 and the cover member 71 into the exhaust area E for exhaustion through the exhaust outlets 61 and 62. With this provision, either one of the BTBAS gas and the $O_3$ gas is prevented from flowing from one of the first process area 91 and the second process area 92 to the other area through under the rotary table 2. Namely, the above-noted purge gas also serves to exert an isolation function.

A purge gas supply unit pipe 51 is connected to the center area of the top panel 11 of the vacuum container 1 to supply $N_2$ gas serving as a purge gas to the space 52 between the top panel 11 and the core 21. This purge gas supplied to the space 52 flows through a narrow gap 50 between the projection 5 and the rotary table 2 toward the surface of the rotary table 2 where the substrate placement parts are provided, and further flows toward the periphery of the rotary table 2. Since the space enclosed by the projection 5 is filled with the purge gas, the reactant gases (i.e., BTBAS gas and O3 gas) are prevented from being mixed with each other through the center portion of the rotary table 2 situated between the first process area 91 and the second process area 92. Namely, the film deposition apparatus is provided with the center area C that is partitioned by the center portion of the rotary table 92 and the vacuum container 1. This center area C is purged by purge gas, and also discharges the purge gas to the surface of the rotary table 2 through a circumferential spout gap for the purpose of isolating atmospheres between the first process area 91 and the second process area 92. Here, the above-noted spout gap refers to the narrow gap 50 situated between the projection 5 and the rotary table 2.

Figure 10:
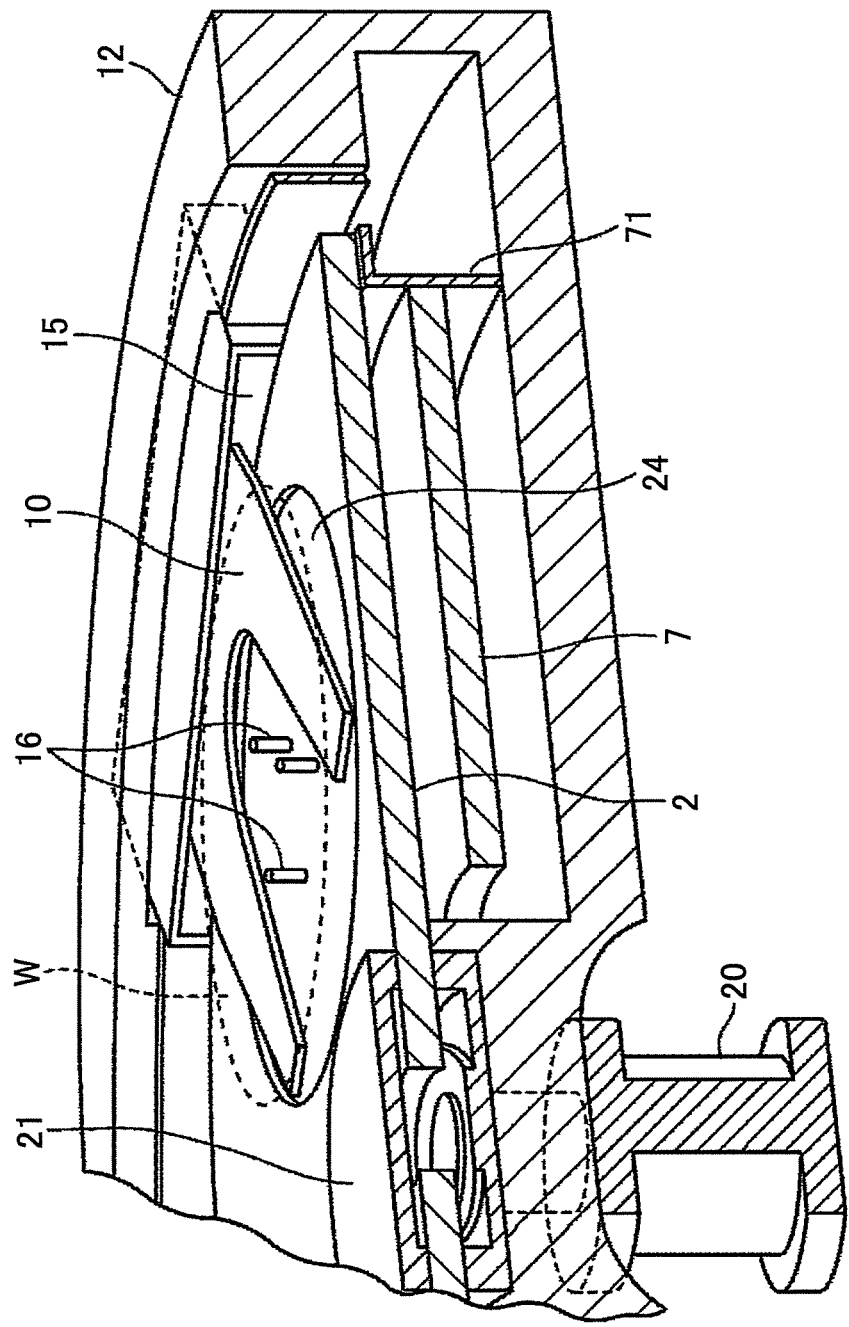
FIG. 10 is an oblique sectional view of a portion of the film deposition apparatus.

As illustrated in FIG. 2, FIG. 3, and FIG. 10, a loading port 15 is provided at the side wall of the vacuum container 1 to allow an external delivery arm 10 to load and unload the wafer W to and from the rotary table 2. The loading port 15 is opened and closed by a gate valve (not shown). The recesses 24 serving as wafer placement parts on the rotary table 2 receive the wafers W from and pass the wafers W to the delivery arm 10 at the position of the loading port 15. A lifting mechanism (not shown) that raises a wafer by pressing its lower surface with the elevation pins 16 penetrating through the recess 24 is provided under the rotary table 2 at the position of the loading port 15.

The film deposition apparatus is provided with a control unit 80 implemented by use of a computer for the purpose of controlling the overall operation of the apparatus as illustrated in FIG. 1. The control unit 80 includes a CPU, a memory, and a processing program. The memory has areas provided on a recipe-specific basis so that process conditions such as the flow rates of BTBAS gas, $O_3$ gas, and $N_2$ gas supplied through the nozzles 31, 32, 41, and 42, a process pressure, and so on are written to these areas. The processing program includes a set of instructions for reading a recipe stored in the memory and supplying control signals to various parts of the film deposition apparatus according to the retrieved recipe to perform process steps, as will be described later, to process the wafers. This program may be installed to the control unit 80 from a storage unit 85 that is a memory medium such as a hard disc, a compact disc, a magnetic optical disc, a memory card, a flexible disc, or the like.

In the following, the operation of the embodiment will be described by referring to FIG. 11 through FIG. 16. The gate valve (not shown) is opened, and the external delivery arm 10 loads the wafer N onto the recess 24 of the rotary table 2 through the loading port 15. The loading is performed by moving the elevation pins 16 extending from the bottom side of the vacuum container 1 through the holes penetrating the bottom surface of the recess 24 when the recess 24 comes to and stops at the position of the loading port 15, as illustrated in FIG. 10. The loading of a wafer W is performed while rotating the rotary table 2 intermittently, so that wafers W are placed on all the five recesses 24 of the rotary table 2. After this, the rotary table 2 is rotated clockwise at a predetermined rotation rate such as 240 rpm. The valve 65 is fully opened to depressurize the vacuum container 1, and the heater unit 7 heats the wafers W to a predetermined temperature such as 350 degrees Celsius. More specifically, the rotary table 2 may be heated by the heater unit 7 to 350 degrees Celsius in advance. The wafers W are heated to the predetermined temperature as they are placed on the rotary table 2.

Figure 11:
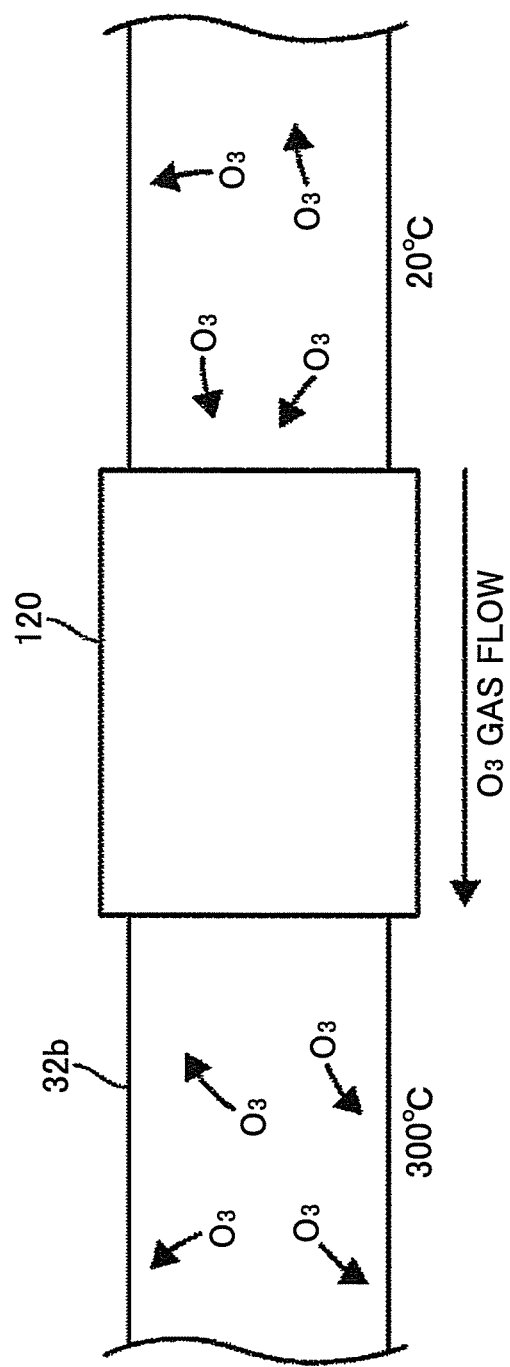
FIG. 11 is a schematic diagram showing the flow of reactant gas in the film deposition apparatus.
Figure 12:
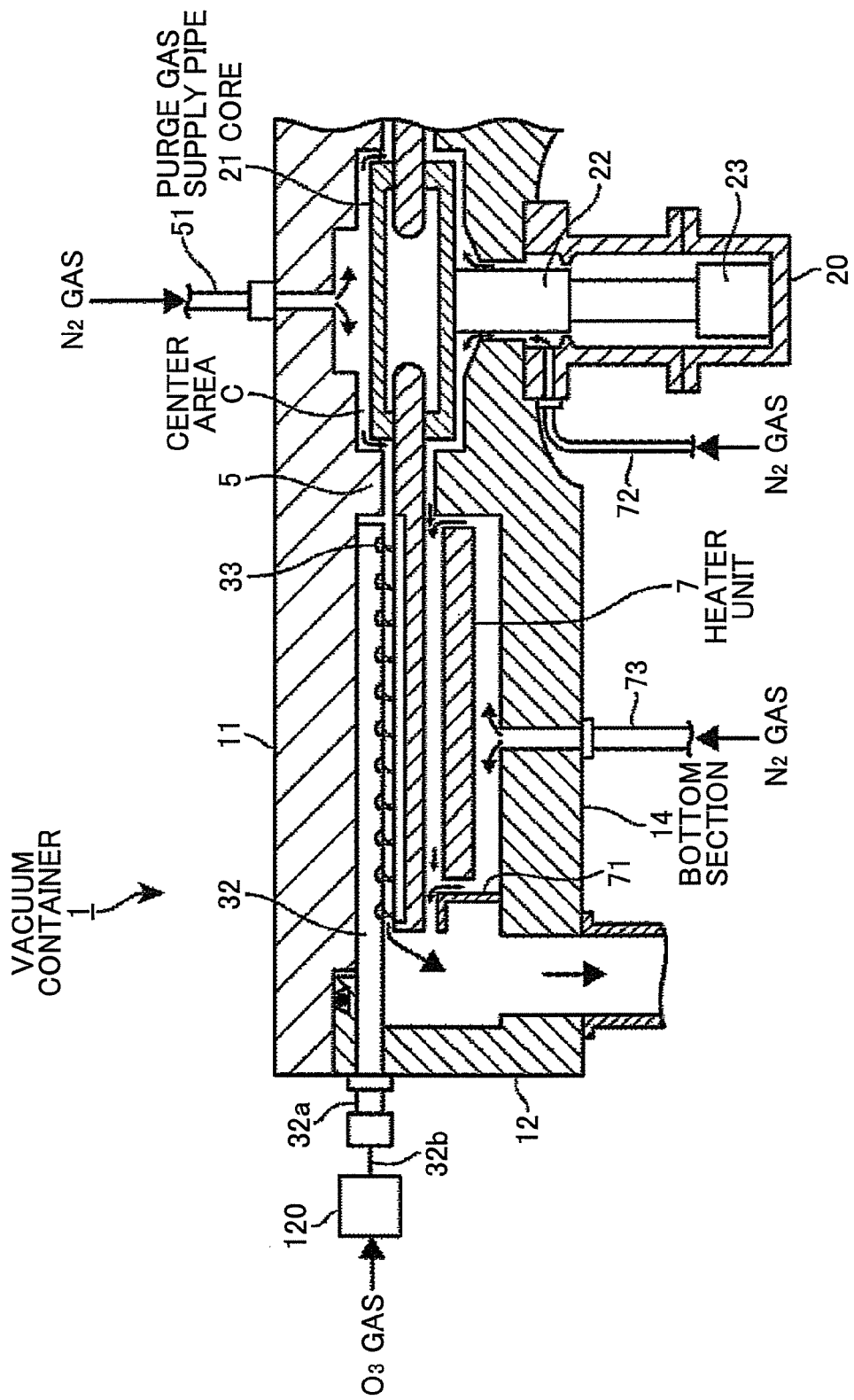
FIG. 12 is a schematic diagram showing the flow of reactant gas in the film deposition apparatus.

The degree of openness of the valve 65 is adjusted to achieve a desired degree of vacuum inside the vacuum container 1. The first reactant gas nozzle 31 and the second reactant gas nozzle 32 then supply BTBAS gas and $O_3$ gas at 200 sccm and 10000 sccm, respectively, to the inner space of the vacuum container 1. In so doing, the heat treatment unit 120 is set such as to adjust the temperature of the $O_3$ gas to 300 degrees Celsius. As illustrated in FIG. 11, thus, O3 gas heated to this preset temperature and thus activated is supplied to the inner space of the vacuum container 1. Further, the gas discharge ports 33 are formed on the nozzle 32 (31) over the entire extension of the wafer W from the outer edge of the rotary table 2 toward the center as illustrated in FIG. 12. The gas discharge ports 33 are situated close to the wafer W. Thus, high density reactant gas with an even density distribution is supplied to the wafer W. The purge gas nozzles 41 and 42 supply $N_2$ gas into the inner space of the vacuum container 1 at 10000 sccm, for example. Further, the purge gas supply pipe 51 and the purge gas supply pipe 72 supply $N_2$ gas at a predetermined flow rate to the center area C and the previously-noted narrowed space, respectively.

The wafers W alternately pass through the first process area 91 and the second process area 92 due to the rotation of the rotary table 2. The BTBAS gas is adsorbed, and, then, the $O_3$ gas is adsorbed to the wafers W, so that the BTBAS molecules are oxidized to form one or more molecular layers of silicon oxide. Through such a process, silicon oxide molecular layers are formed one over another to form a thin film comprised of a silicon oxide film having a predetermined thickness. The temperature of the heated wafers W is rather low as previously described. However, the $O_3$ gas is heated and activated by the heat treatment unit 120 prior to injection into the vacuum container 1. Accordingly, the BTBAS molecules adsorbed to the surfaces of the wafers W are reliably oxidized at high speed. As previously described, further, high density reactant gas with an even density distribution is supplied to the wafer W. The adsorption and oxidization of reactant gas on the surfaces of the wafers W are fast, so that a thin film having an even thickness and even film quality is formed over the entire surface of each wafer W even if the rotary table 2 is rotated at a fast rate.

Figure 13:
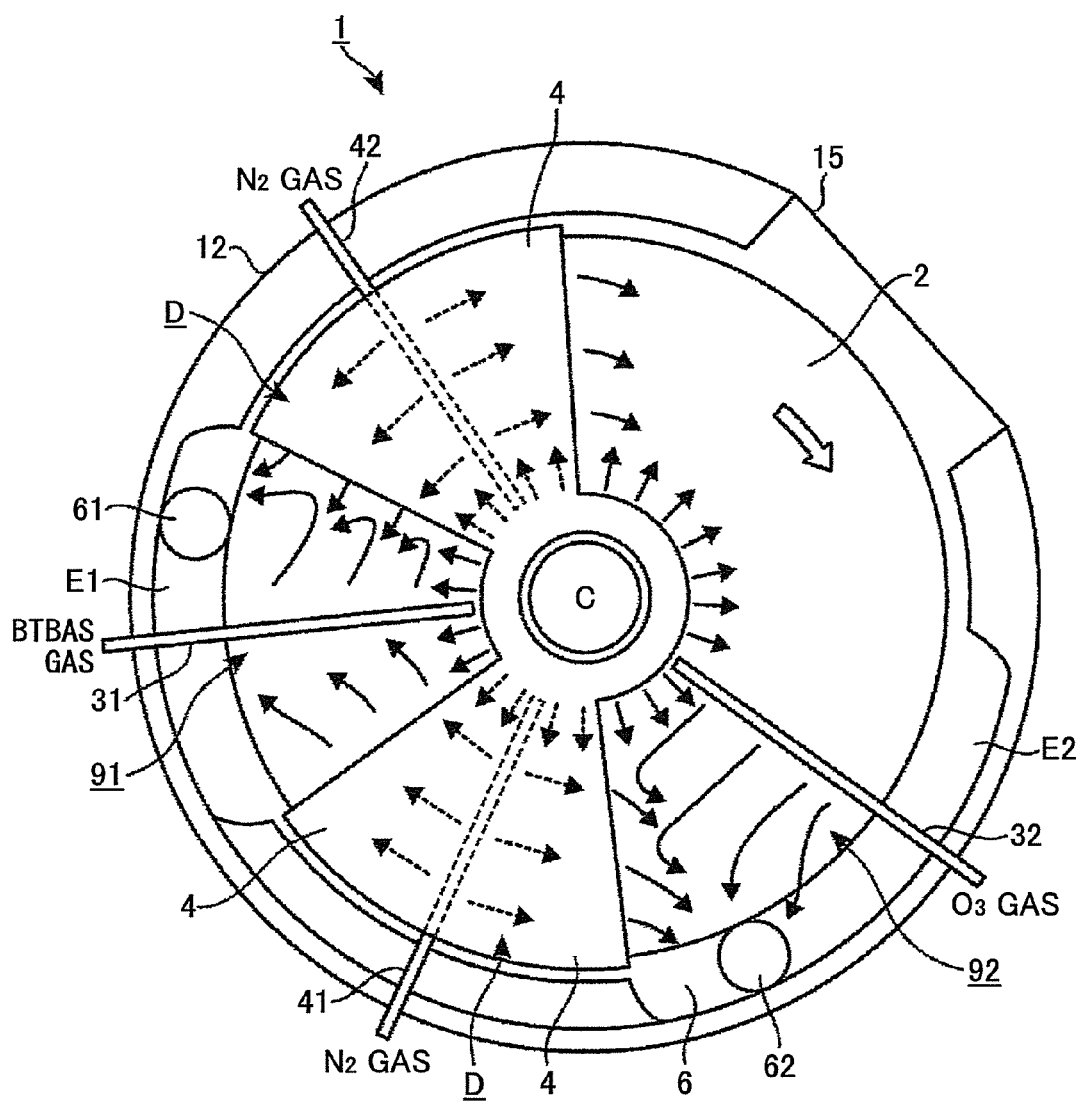
FIG. 13 is an illustrative drawing showing the way a first reactant gas and a second reactant gas are exhausted while being separated by purge gas.

The $N_2$ gas serving as purge gas is supplied to the space between the first process area 91 and the second process area 92, and is also supplied to the center area C. As illustrated in FIG. 13, thus, the BTBAS gas and O3 gas are separately exhausted without being mixed. In the isolation area D, the gap between the bent part 46 and the side edge of the rotary table 2 is narrow as previously described. Because of this, the BTBAS gas and the $O_3$ gas are not mixed even through the periphery of the rotary table 2. Accordingly, the atmosphere of the first process area 91 and the atmosphere of the second process area 92 are completely isolated from each other, so that the BTBAS gas is exhausted only through the exhaust outlet 61, and the $O_3$ gas is exhausted only through the exhaust outlet 62. In this manner, the BTBAS gas and the $O_3$ gas do not mix with each other in any space, even over the wafers W.

In this example, the inner circumferential wall of the container 12 has a dent to provide wider space in the space under the ceiling surface 45 in which one of the reactant gas nozzles 31 and 32 is situated. A corresponding one of the exhaust outlets 61 and 62 is situated under this wider space. Accordingly, the pressure inside the space under the second ceiling surface 45 is lower than the pressures inside the narrow spaces under the ceiling surface 44 and within the center area C.

Since the space under the rotary table 2 is purged by $N_2$ gas, gases entering the exhaust area E do not go through the space under the rotary table 2. For example, the BTBAS gas does not flow into the space in which the $O_3$ gas is discharged. When a film deposition process is completed, the supply of gases is stopped, followed by fully evacuating the inner space of the vacuum container. The rotation of the rotary table 2 is then stopped, and the delivery arm 10 is used to successively unload the wafers W in reversed order from when the wafers W are loaded.

An example of processing parameters will be described in the following. The rotation rate of the rotary table 2 is in the range of 1 rpm to 500 rpm, for example, in the case of wafers W having a 300-mm diameter being used as substrates to be processed. The amount of $N_2$ gas flow through the purge gas supply pipe 51 at the center of the vacuum container 1 is 5000 sccm, for example. The number of cycles of reactant gas supply with respect to one wafer, i.e., the number of times the wafer passes through each of the first process area 91 and the second process area 92, may vary according to a desired film thickness. An example of a typical number may be 600.

Figure 14B:
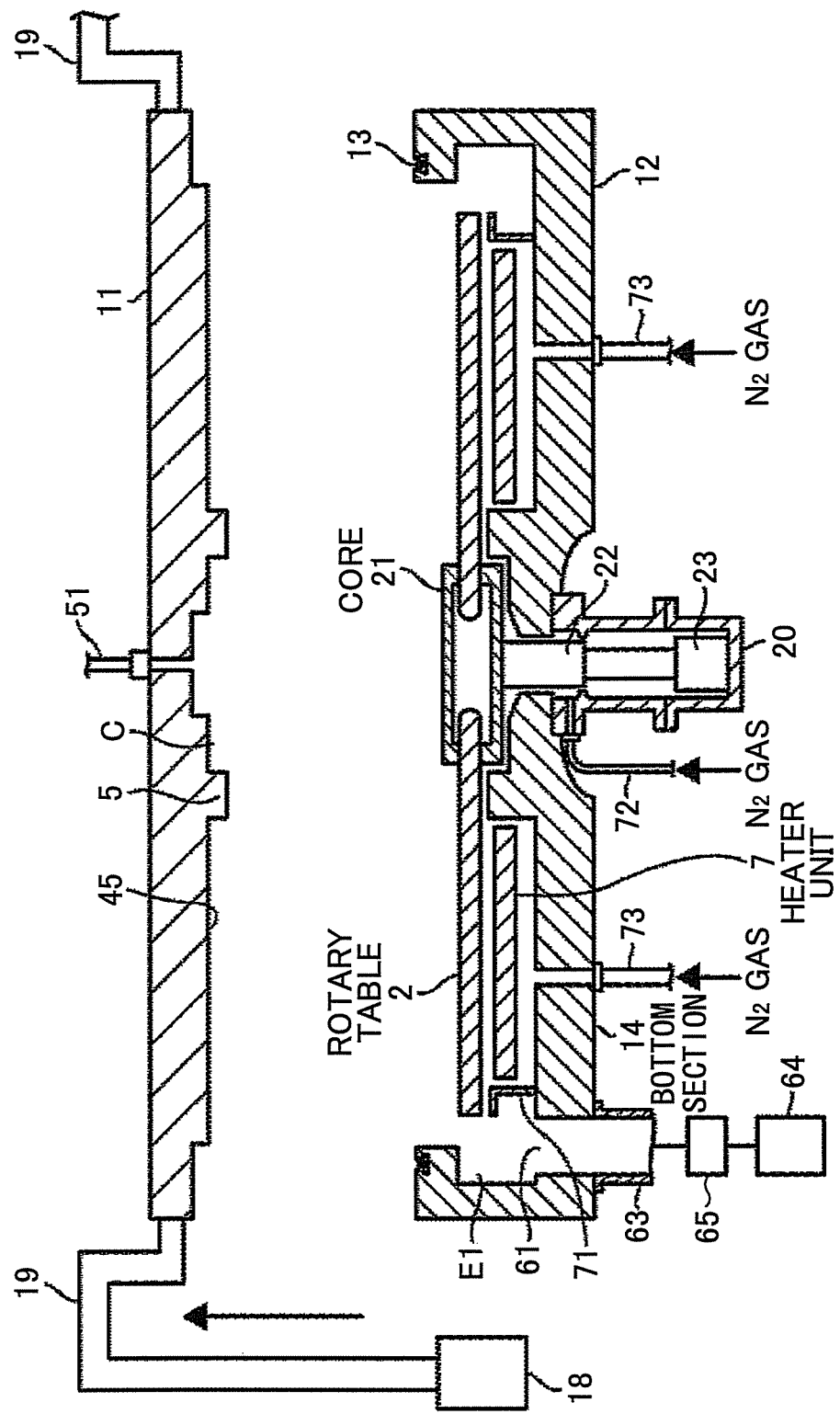
Figure 15:
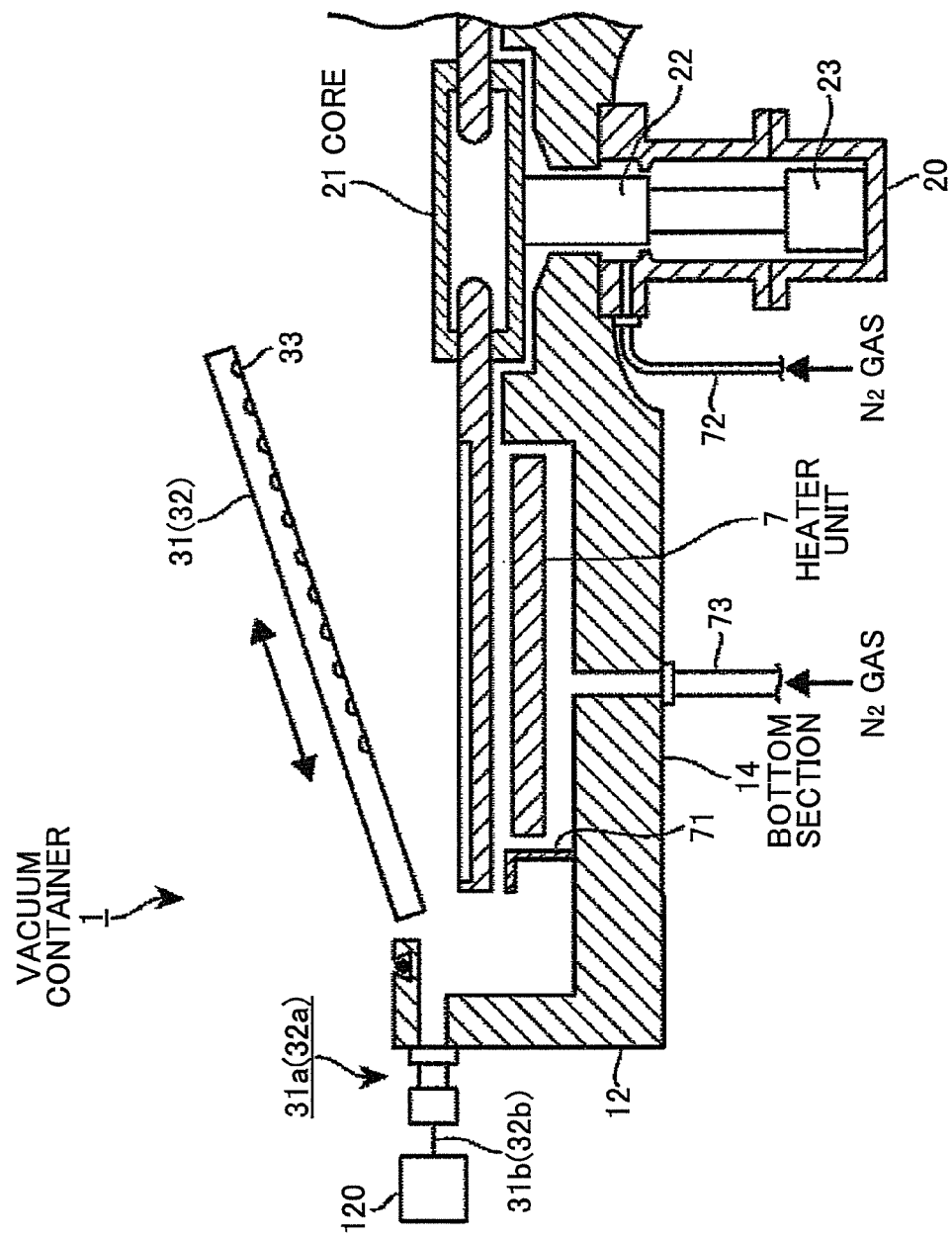
FIG. 15 is a cross-sectional view showing maintenance work that is performed with respect to the film deposition apparatus.
Figure 16:
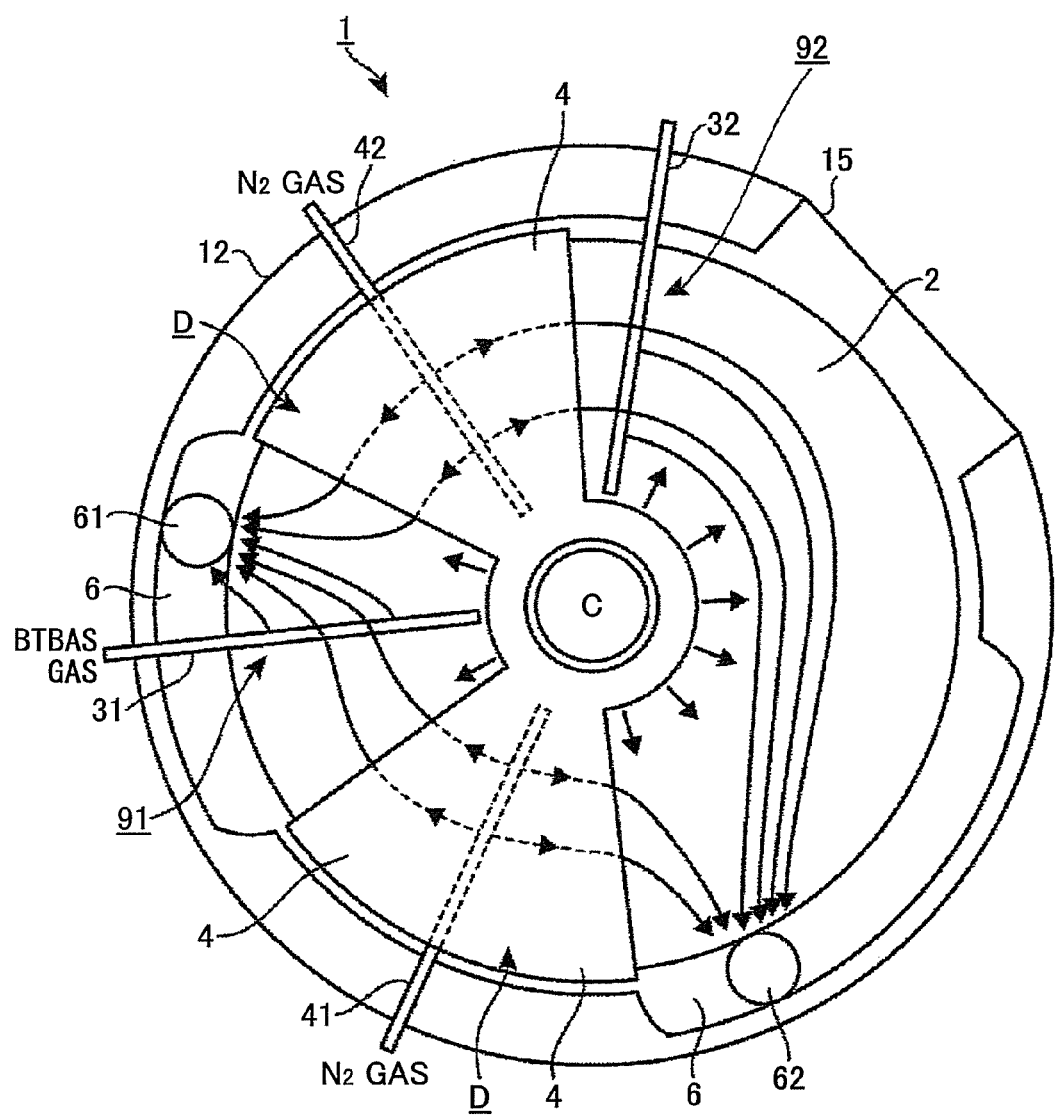
FIG. 16 is a horizontal sectional view showing an example of the film deposition apparatus in which a nozzle attachment position is changed.

When maintenance work is to be performed with respect to the interior of the vacuum container 1, the opening-&-closing mechanism 18 is used to lift the top panel 11 from the position illustrated in FIG. 14A to the position illustrated in FIG. 14B. The nozzles 31 and 32 may be replaced, or may be moved to other attaching positions. In such a case, the joint unit 103 is pulled out of the wall of the vacuum container 1, so that the nozzles 31 and 32 are removed from inside the vacuum container 1 as illustrated in FIG. 15. If nozzles 31 and 32 are to be newly installed, new nozzles 31 and 32 are attached in a reverse order from the order when the nozzles 31 and 32 are removed. If the nozzles 31 and 32 are to be moved to different attaching positions, the cover members (not shown) attached to the through-holes 100 of the side wall of the vacuum container 1 are removed at the positions where the new nozzles 31 and 32 are to be attached. The nozzles 31 and 32 are then attached from inside the vacuum container 1 by use of the outer sleeve 101, the inner sleeve 105, and the O rings 104 for each nozzle. Further, the cover members (not shown) are attached to the through-holes 100 at the positions where the nozzles 31 and 32 have been removed. FIG. 16 illustrates an example in which the nozzle position is changed. In the film deposition apparatus illustrated in FIG. 16, the nozzle 32 is attached to a through-hole 100 situated upstream relative to the loading port 15 in the rotation direction of the rotary table 2. This film deposition apparatus also works properly, such that a thin film is formed by repeating a cycle in which BTBAS gas is adsorbed to the surfaces of the wafers W and oxidized by $O_3$ gas while exhausting these reactant gases without mixing them.

According to the embodiment described above, the reactant gas nozzles 31 and 32 having the gas discharge ports 33 formed in the longitudinal direction are attached to the through-holes 100 of the outer side wall of the vacuum container 1 for the purpose of forming a thin film by supplying two types of reactant gases (i.e., BTBAS gas and $O_3$ gas) to the surfaces of the wafers W. In this configuration, the gas supply pipes 31b and 32b for supplying the reactant gases are not connected to the top panel 11. When the top panel 11 is lifted for maintenance work to be performed with respect to the interior of the vacuum container 1, there is no need to detach gas supply pipes (i.e., gas supply pipes 31b and 32b). Maintenance work is thus easily performed. Further, residuals of the reactant gases that may be left inside the gas supply pipes would not contribute to the creation of particles due to the absence of needless gas pipe handling. Further, the reactant gas pipes are attached to the side wall of the vacuum container 1. For a preparatory treatment that is performed for a reactant gas, a preparatory treatment unit, e.g., the heat treatment unit 120, may properly be situated alongside the vacuum container 1. This arrangement eliminates the need for the heat treatment unit 120 to be lifted together with the top panel 11 at the time of performing maintenance work. The power required of the opening-&-closing mechanism 18 may thus be small. The opening-&-closing mechanism 18 may thus be simplified compared to the case in which the heat treatment unit 120 is placed on the top panel 11. Further, there is no need to provide space for the heat treatment unit 120 over the vacuum container 1. Latitude in selecting the place for installment of this film deposition apparatus is thus increased.

Attaching holes (i.e., through-holes 100) for shared use by the nozzles 31 and 32 and nozzles 41 and 42 are arranged in the circumferential direction in the side wall of the vacuum container 1. This allows the nozzles 31, 32, 41, and 42 to be moved to different attaching positions. The contact time during which the wafer W is in contact with a given reactant gas may thus be adjusted by this arrangement. The types and flow amounts of reactant gases to be used may be taken into consideration to select proper positions for the nozzles 31, 32, 41, and 42. Accordingly, the adjustment of the apparatus may easily be performed to form a desired thin film. When the attaching positions of the nozzles 31, 32, 41, and 42 are changed, the positions of the projection 4 and the exhaust outlets 61 and 62 may also be changed.

The nozzles 31 and 32 are provided in close proximity of the wafers W to extend from the through-holes 100 toward the rotation center of the rotary table 2. This makes it possible to increase the density of reactant gases in the vicinity of the wafers W, thereby ensuring rapid adsorption of a reactant gas to the surfaces of wafers W and rapid oxidization of this reactant gas. This arrangement allows the rotary table 2 to be rotated at high speed, thereby repeating a cycle comprised of the BTBAS gas adsorption and the BTBAS gas oxidization in a short time period at high speed. The speed of film deposition is thus increased compared with the case in which reactant gases are supplied from the top panel 11 of the vacuum container 1 without using the nozzles 31 and 32.

Moreover, the nozzles 31 and 32 having proper arrangement and intervals of the gas discharge ports 33 may be selected for respective reactant gases. Accordingly, the density of the reactant gases along the extension of the nozzles 31 and 32 may properly be adjusted. This serves to provide even film thickness and quality over the surfaces of the wafers W.

Further, removal of the nozzle 31 (or 32, 41, 42) is performed by use of the inner space of the vacuum container 1 after lifting the top panel 11. There is thus no need to provide space beside the vacuum container 1 for accommodating the entire extension of the nozzle 31. This serves to achieve efficient use of space.

Moreover, plural wafers W are arranged in a circular direction of the rotary table 2. The rotary table 2 is rotated to cause the wafers W to pass through the first process area 91 and the second process area 92 in sequence, thereby performing the ALD (or MLD) to perform a film deposition process at high throughput. The isolation area D having a low ceiling surface is disposed between the first process area 91 and the second process area 92 in the circular direction. Further, a purge gas is discharged from the center area C towards the periphery of the rotary table 2 wherein the center area C is partitioned by the rotation center portion of the rotary table 2 and the vacuum container 1. The purge gas dispersing into both sides of the isolation area D, the purge gas discharged from the center area C, and the reactant gases are exhausted through the space between the inner circumferential wall of the vacuum container 1 and the side edge of the rotary table 2. This arrangement successfully prevents the mixing of the reactant gases, thereby achieving a satisfactory film deposition process. Further, the generation of reaction products over the rotary table 2 is prevented or significantly suppressed, so that the generation of particles is suppressed. It should be noted that the rotary table 2 may be configured to have only one wafer W placed thereon.

Figure 17:
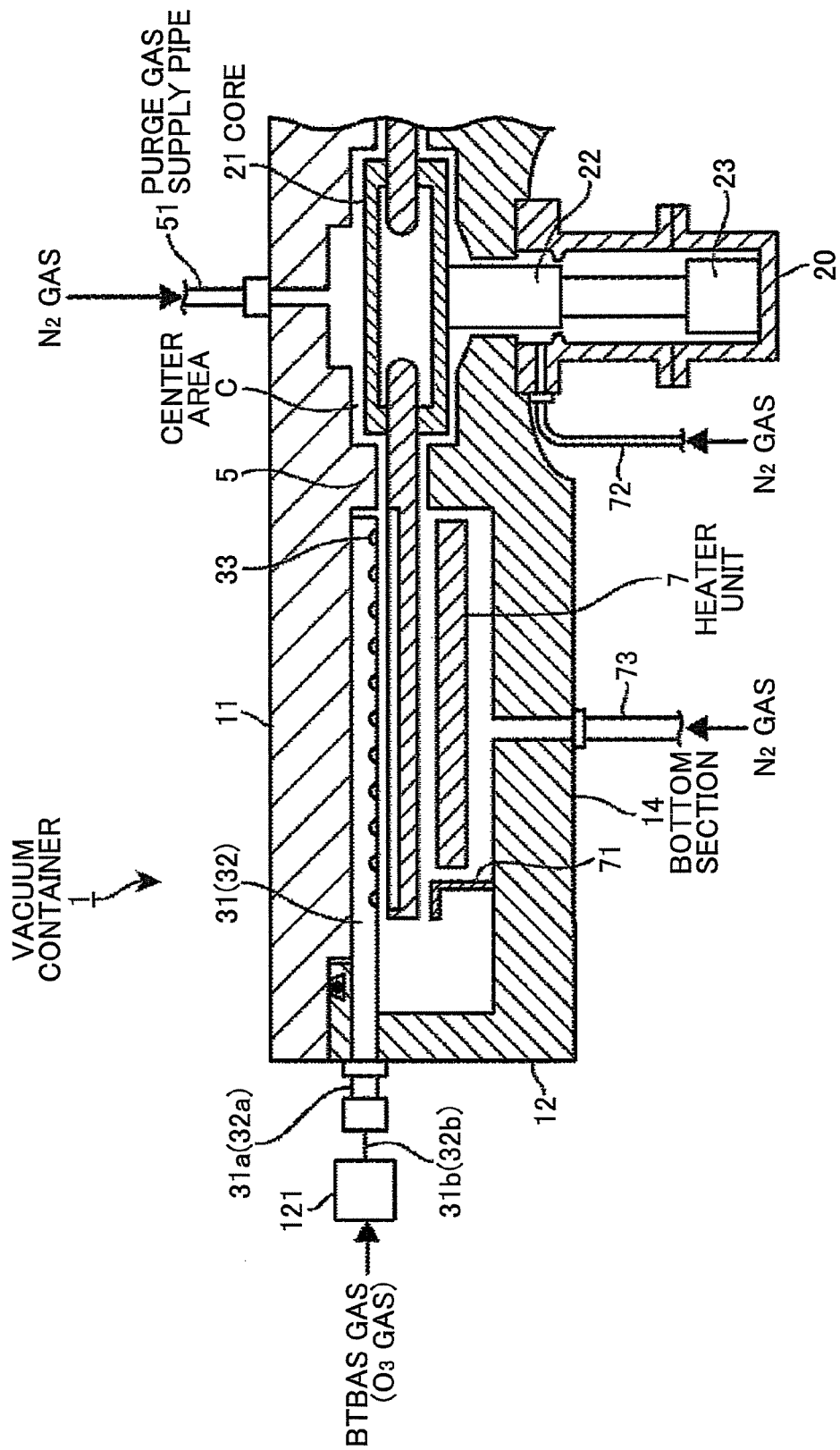
FIG. 17 is a cross-sectional view showing another example of the film deposition apparatus.

In the example described heretofore, the heat treatment unit 120 is provided as a preparatory treatment unit. As illustrated in FIG. 17, a plasma treatment unit 121 having a high-frequency power supply (not shown) may be provided for the purpose of creating reactant gas plasma. In this case, the plasma treatment unit 121 may be provided on the side of the nozzle 31 that supplies BTBAS gas. This may be done by replacing the nozzle 32 or by keeping the nozzle 32.

Moreover, a lifting mechanism for lifting the rotation shaft 22 of the rotary table 2 may be provided to adjust a gap between the gas discharge ports 33 and the wafers W within the range of 1 mm to 5 mm, for example. In such a case, a lifting-and-lowering shaft having engaging projections extending in a vertical direction may be inserted into the rotation shaft 22, so that the rotary table 2 may be supported by the lifting-and-lowering shaft in a vertically slidable manner. The inner surface of the rotation shaft 22 may be configured to have recesses (not shown) extending in the vertical direction that engages these engaging projections. The lifting mechanism (not shown) adjusts the elevation of the rotary table 2 by use of the lifting-and-lowering shaft. After the adjustment, the rotary table 2 is rotated together with the lifting-and-lowering shaft.

Applied process gases may include, in addition to the examples described heretofore, DSC (Dichlorosilane), HCD (Hexachlorodisilane), TMA (Trimethylaluminium), 3DMAS (Trisdimethylaminosilane), TEMAZ (Tetrakisethylmethylaminozirconium), TEMHF (Tetrakisethylmethylamidohafnium), Sr(THD)$_2$ (Strontium bis-tetramethylheptanedionate), Ti(MPD(THD))$_2$ (titanium methylpentanedionatobistetramethylheptanedionato), and monoaminosilane.

The present invention is not only applicable to an ALD process, but also applicable to other processes. For example, the present invention may be applied to a CVD process in which a first film is deposited by suspending a wafer W in the first process area 91 for a predetermined time, followed by depositing a second film by suspending the wafer W in the second process area 92 for a predetermined time. In this case, a thin film comprised of the first films and the second films alternately stacked one over another in a multilayered structure is formed, thereby providing the same advantage.

Moreover, a portion of the ceiling surface 44 of the isolation area D that is situated upstream relative to the purge gas nozzle 41 or 42 in the rotation direction of the rotary table 2 may preferably have a varying width in the rotation direction that increases toward the outer edge. This is because the flow of gas running toward the isolation area D from upstream due to the rotation of the rotary table 2 increases toward the outer edge. From this point of view, it is preferable to have a fan-shape projection 4 as described heretofore.

Figure 18A:
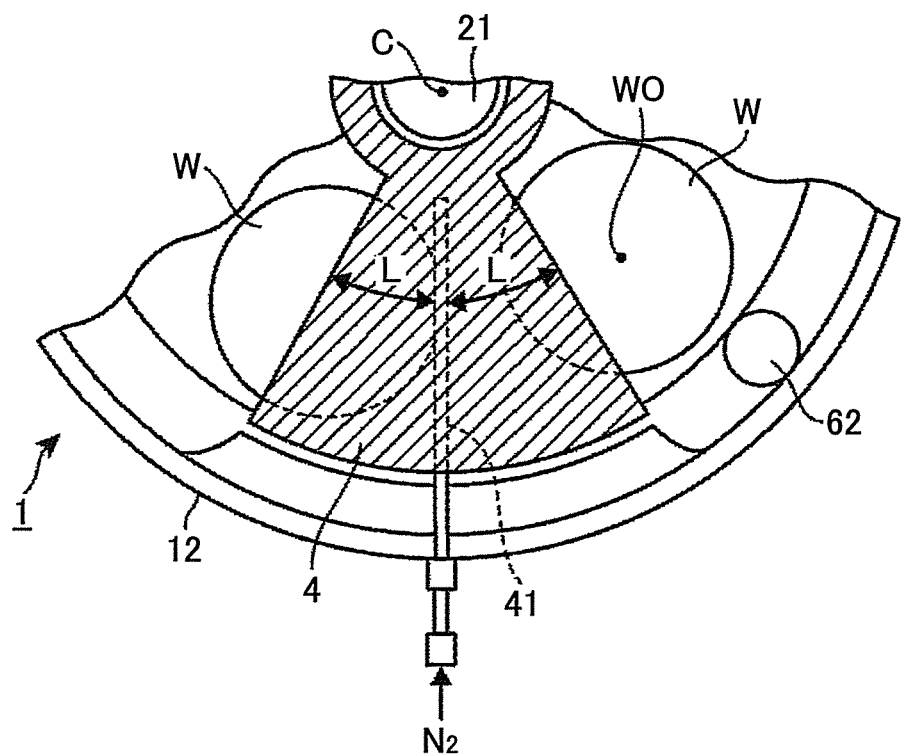
FIGS. 18A and 18B are illustrative drawings showing examples of the dimensions of a projection used for an isolation area.
Figure 18B:
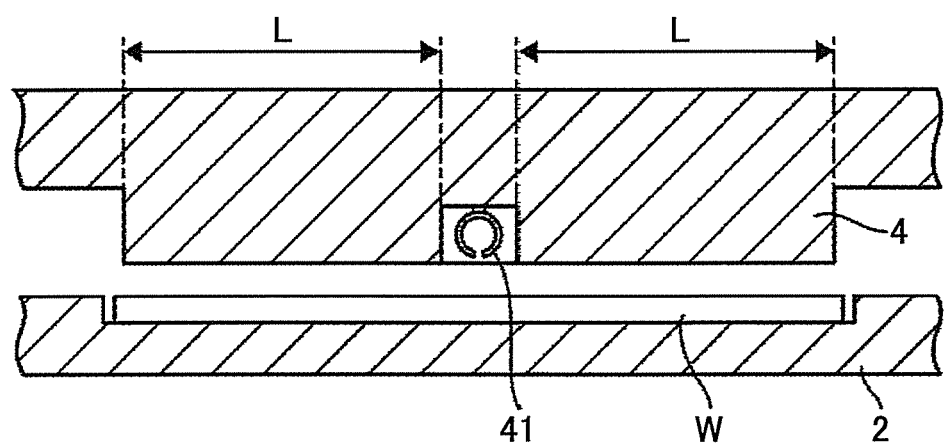

In FIGS. 18A and 18B illustrating the purge gas nozzle 41 as a representative, the ceiling surface 44 that forms a narrow space on either side of the purge gas nozzle 41 (or 42) may preferably have a length L of 50 mm in the circular direction of the rotary table 2 at the position where the center WO of the wafer W passes when the wafer W used as a substrate to be processed has a diameter of 300 mm, for example. In order to effectively prevent reactant gases from intruding from the sides of the projection 4 into the space (narrow space) under the projection 4, the height h that is the distance between the first ceiling surface 44 and the rotary table 2 may be decreased if the above-noted length L is decreased. The height h that is the distance between the first ceiling surface 44 and the rotary table 2 may be set to a certain size. The speed of the rotary table 2 is higher toward the periphery of the rotary table 2. Accordingly, the length L required to sufficiently prevent the intrusion of reactant gases increases as its radial position moves away from the rotation center. In consideration of this, if the length L at the position where the center WO of the wafer W passes is smaller than 50 mm, the distance h between the first ceiling surface 44 and the rotary table 2 may need to be significantly reduced. Accordingly, a mechanism may need to be devised to suppress the fluctuation of the rotary table 2 such that the rotating rotary table 2 or the wafer W does not come in contact with the ceiling surface 44. The higher the rate of rotation of the rotary table 2, the more likely the reactant gases intrude into the space under the projection 4 from the upstream side of the projection 4. The use of a length L that is shorter than 50 mm may not be preferable in terms of throughput because such an arrangement requires the rate of rotation to be decreased. It is thus preferable to use the length L that is longer than 50 mm, but even the length L that is shorter than 50 mm would not eliminate the desired advantage. Namely, the length L is preferably from $\frac{1}{10}$ to $\frac{1}{1}$ of the diameter of the wafer W, and is more preferably longer than approximately $\frac{1}{6}$ of the diameter.

Despite the preferred configuration in which the low ceiling surface 44 is situated on both sides of a purge gas supply unit in the rotation direction, the projection 4 may not have to be provided on both sides of the purge gas nozzles 41 and 42. The purge gas nozzles 41 and 42 may create air curtains by discharging N$_2$ gas downward. Such air curtains may isolate the process areas 91 and 92 from each other.

The heating unit for heating a wafer W is not limited to a heater using a resistance heating element, and may be a lamp-based heating apparatus. The heating unit may be situated above the rotary table 2, rather than situated below the rotary table 2, or may be situated above and below the rotary table 2. The heating unit may not be provided if the reaction of reactant gases occurs at low temperature, e.g., at room temperature.

Figure 19:
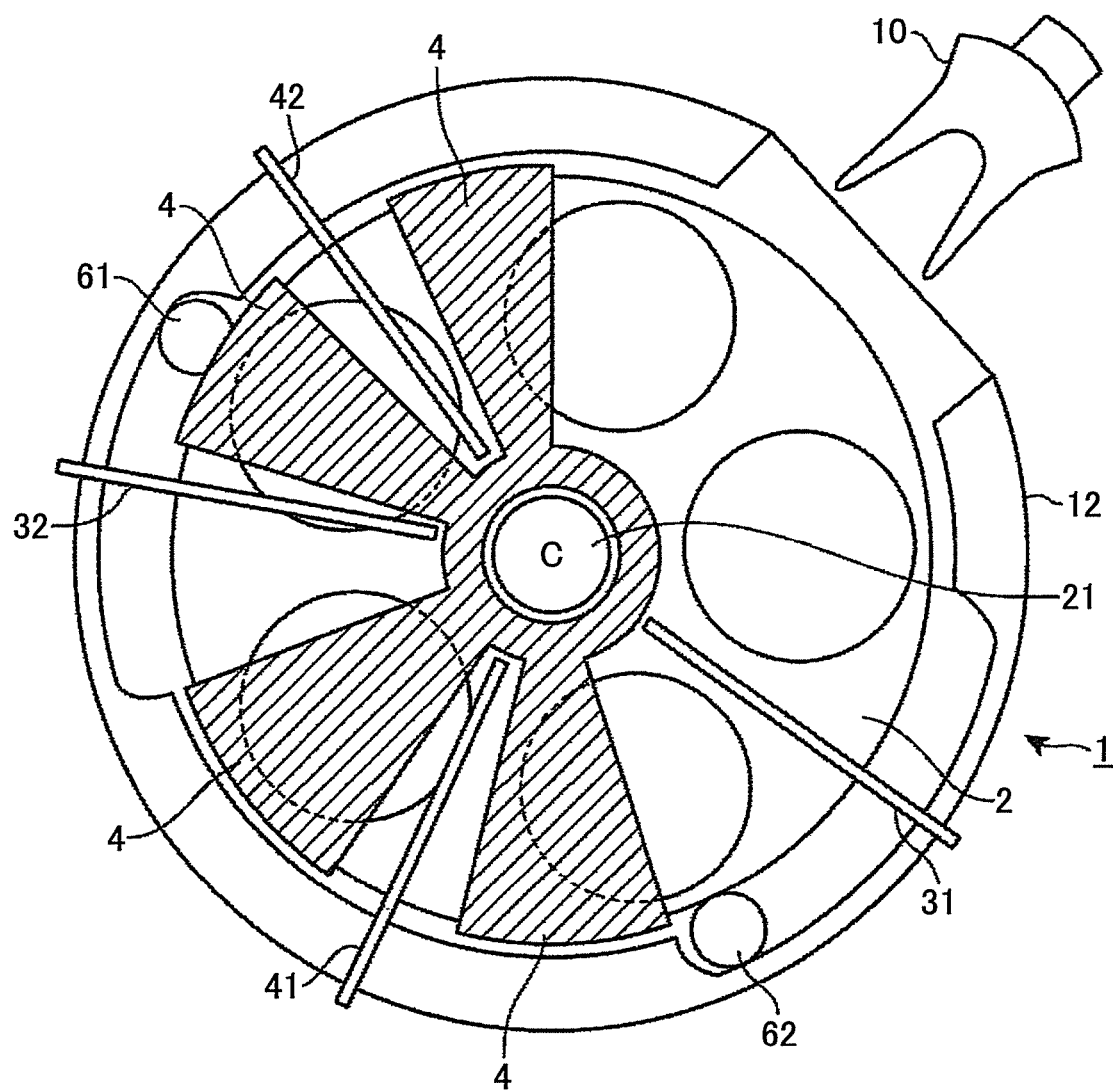
FIG. 19 is a horizontal sectional view of the film deposition apparatus according to another embodiment of the present invention.

In the following, a description will be given of other examples of layouts of the isolation areas D and the process areas 91 and 92 different from the layouts of the above-described embodiments. As previously described, the isolation area D may be a fan-shape projection 4 that is divided into halves in the rotation direction, with the purge gas nozzle (or 42) situated between these halves. FIG. 19 is a plan view showing an example of such a configuration. In this configuration, the distance between the fan-shape projection 4 and the purge gas nozzle 41 (or 42) and the size of the fan-shape projection 4 may be determined by taking into account the discharge rates of purge gas and reactant gases such as to allow the isolation area D to exert an effective isolation function.

In the embodiments described heretofore, the first process area 91 and the second process area 92 each have a ceiling surface that is higher than the ceiling surface of the isolation area D. In at least one of the first process area 91 and the second process area 92, a ceiling surface may be configured to face the rotary table 2 on both sides of a reactant gas supply unit in the rotation direction as in the case of the isolation area D so as to form space that prevents the intrusion of gas into a gap between the ceiling surface and the rotary table 2. Such a ceiling surface may be lower than the ceiling surfaces (i.e., ceiling surfaces 45) situated on both sides of the isolation area D in the rotation direction, e.g., may be set to the same height as the first ceiling surface 44 of the isolation area D Further, low ceiling surfaces may be provided on both sides of the reactant gas nozzle 31 (or 32), such that the fan-shape projections 4 are provided all over the rotary table 2, except for the positions at which the purge gas nozzles 41 and 42 and the reactant gas nozzles 31 and 32 are situated.

The present invention is not limited to the use of two types of reactant gases, and may be applied to a case in which three or more types of reactant gases are supplied to a substrate in sequence. In this case, a first reactant gas nozzle, a purge gas nozzle, a second reactant gas nozzle, a purge gas nozzle, a third reactant gas nozzle, and a purge gas nozzle may be arranged in a circular direction in the vacuum container 1 in the order listed, with the isolation areas covering the positions of these purge gas nozzles being configured as in the heretofore-described embodiments.

Figure 20:
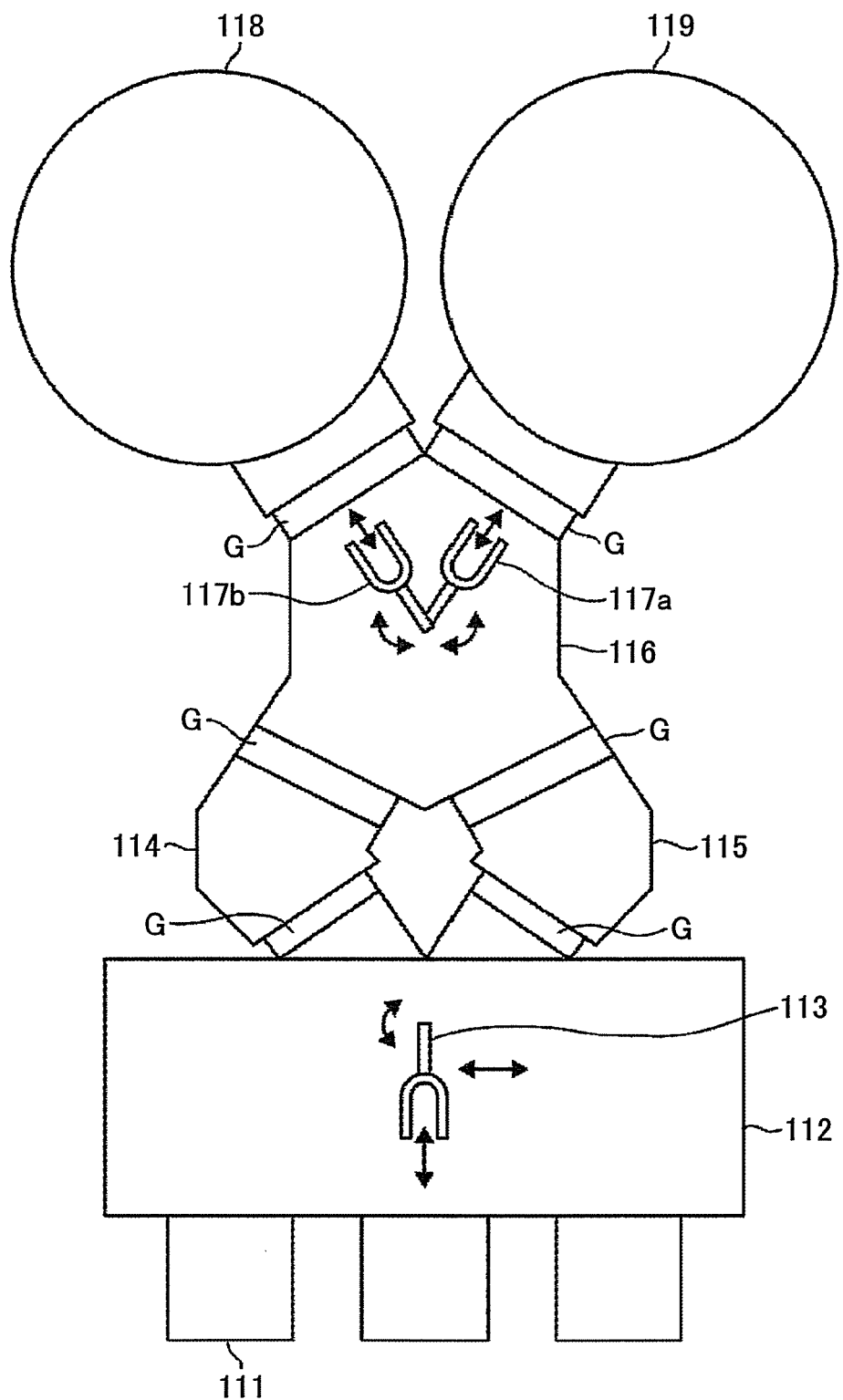
FIG. 20 is a schematic plan view showing an example of a substrate processing system using the film deposition apparatus of the present invention.

FIG. 20 is a drawing illustrating a substrate processing apparatus that employs the film deposition apparatus described heretofore. FIG. 20 shows a sealed-type delivery container 111 referred to as a "hoop" for containing 25 wafers W, for example, an atmosphere delivery chamber 112 containing a delivery arm 113, load lock chambers (vacuum preparation chambers) 114 and 115 operable to be switched between air atmosphere and vacuum atmosphere, a vacuum delivery chamber 116 containing two delivery arms 117, and film deposition apparatuses 118 and 119 according to the heretofore-described embodiments. The delivery container 111 is delivered from another place, and is placed at a loading/unloading port having a platform (not illustrated). After the delivery container 111 is placed in the atmosphere delivery chamber 112, an opening/closing mechanism (not shown) opens the hatch. The delivery arm 103 then takes wafers W out of the delivery container 111. The wafers W are then loaded to the load lock chamber 114 (115), an interior space of which is then switched from air atmosphere to vacuum atmosphere. The delivery arm 117 takes the wafers out of the load lock chamber, and delivers the wafers to one of the film deposition apparatus 118 and 119. Then, the film deposition process previously described is performed. In this manner, two film deposition apparatuses of the heretofore-described embodiments may be provided, each of which is configured to process five wafers, for example. The provision of plural film deposition apparatuses makes it possible to perform ALD (or MLD) at high throughput.

In the following, a second aspect of the present invention will be described. A certain type of film deposition method used in semiconductor manufacturing processes repeats plural cycles, each of which causes a first reactant gas to be adsorbed to the surface of a semiconductor wafer (hereinafter referred to as a "wafer") serving as a substrate in vacuum atmosphere and then switches the supplied gas to a second reactant gas to form one or more layers of atoms or molecules through reaction of these two gases. The repetition of cycles creates layers one over another thereby to form a film on the substrate. Such a process is referred to as the ALD (Atomic Layer Deposition) or MLD (Molecular Layer Deposition). This process can control a film thickness with high precision by adjusting the number of cycles. High homogeneity of film quality over the extent of the surface is obtainable, thereby helping to create a thin semiconductor device.

Such a film deposition method may be preferred when forming a highly dielectric material for use as a gate oxide film, for example. When forming a silicon oxide film (i.e., $SiO_2$ film), for example, bis-tertiary butyl amino silane (hereinafter referred to as "BTBAS") may be used as a first reactant gas (i.e., source gas), and ozone gas ($O_3$) may be used as a second reactant gas (i.e., oxidant gas).

As apparatuses for practicing the above-noted film deposition method may be configured such that a gas shower head is provided over a center area in a vacuum container. Reactant gases are caused to flow from above the center of a substrate, and the residual reactant gases and by-product materials are exhausted from the bottom of the process chamber. Such a film deposition method requires a lengthy time for gas replacement by use of a purge gas. Further, a few hundred cycles may be necessary. The total process time can thus be very long. An apparatus and method that can perform the process at high throughput is thus desired.

As disclosed in Patent Document 2 and 3 previously described, there is an apparatus that uses a circular platform on which plural substrates are placed in a circular direction, and that supplies reactant gases one after another to the substrates while rotating the platform, thereby forming a film. Patent Document 3, for example, discloses a configuration in which reactant gases are supplied into a reaction chamber from the ceiling part of the reaction chamber, and process spaces sectioned from each other in the circular direction of the platform are provided to receive respective, different reaction gases.

Patent Document 2 discloses a configuration in which plural reaction gas nozzles, e.g., two reaction gas nozzles, for discharging respective, different reactant gases toward the platform are disposed on a ceiling part of the chamber, and the platform is rotated to cause substrates placed thereon to pass under the reactant gas nozzles, thereby supplying reactant gases alternately to each wafer to form a thin film. Film deposition apparatuses of this type do not require a process step of purging reactant gases. Also, plural substrates can be processed by performing each of a loading operation, a vacuum evacuation operation, and an unloading operation only once. This arrangement can thus improve throughput by reducing the time required for these operations.

Figure 40:
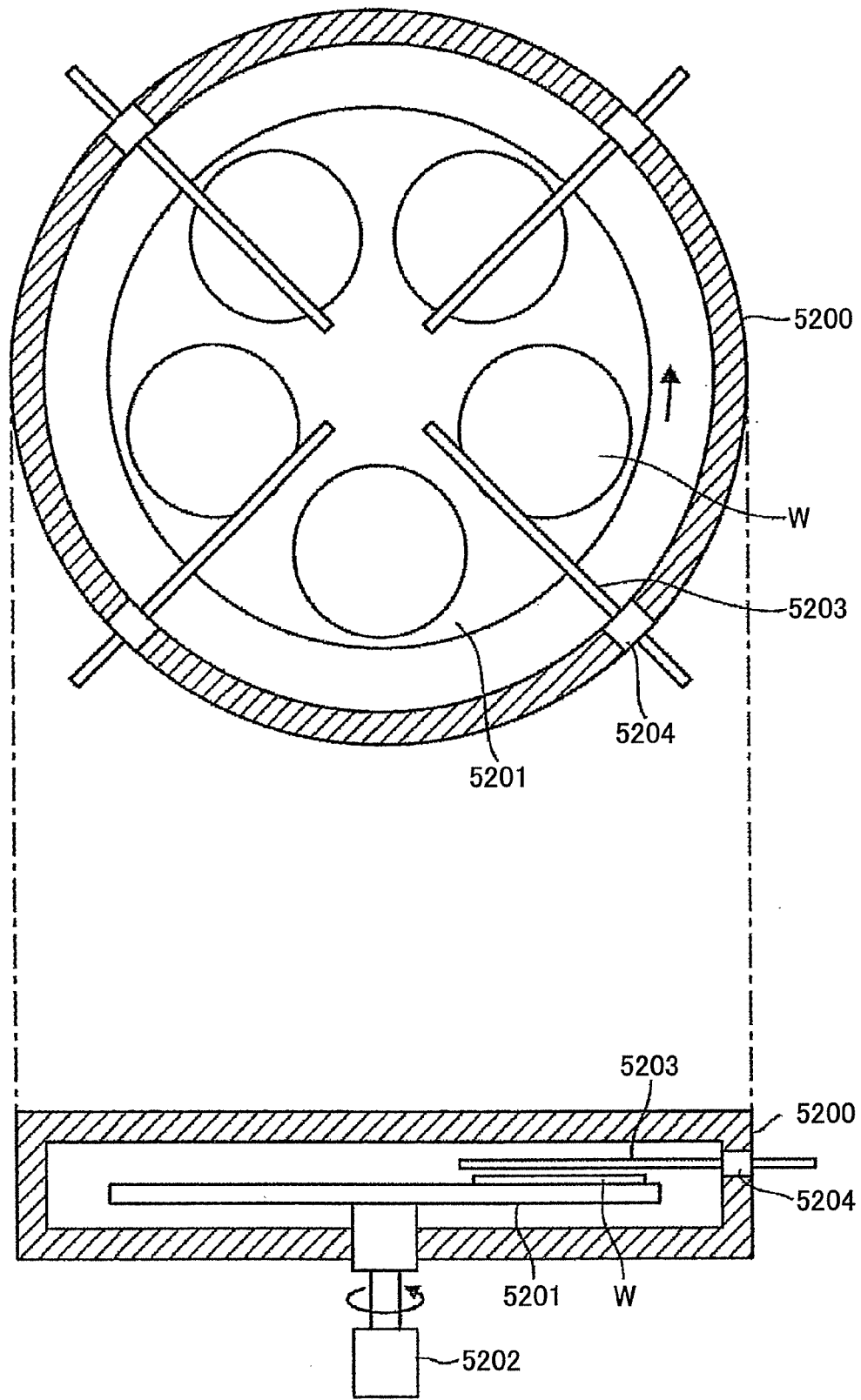
FIG. 40 is a drawing showing an example of a film deposition apparatus in which a rotary platform is provided, and reactant gas nozzles are mounted to a side wall of the process container.

In the configuration in which reactant gas nozzles are disposed on the ceiling part of the process chamber, all the gas nozzles end up being removed for the purpose of detaching the ceiling part from the process chamber at the time of maintenance work. This may cause increases in the time and manual labor required for maintenance work. In consideration of this, the inventors of the present invention have been studying a configuration in which gas nozzles are disposed on the side wall of the process chamber to extend horizontally from the side wall to near the center of the process chamber as illustrated in FIG. 40. FIG. 40 shows a process container 5200, a rotary table 5201 rotating around a vertical axis and supporting wafers W placed tehreon, a drive system 5202 for rotating the rotary table, gas nozzles 5203, and attaching members 5204 to which the gas nozzles 5203 are attached. Each of the gas nozzles 5203 has gas discharge ports formed at predetermined intervals on the bottom face of the nozzle for downward discharge of reactant gas.

Together with a recent increase in substrate size, the wafer W may be 300 mm in diameter, and such a large wafer W is subjected to film deposition. In the configuration in which the gas nozzles 5203 are disposed on the side wall of the process container 5200, long gas nozzles 5203 are necessary because the gas nozzles 5203 need to extend from the side wall to near the center of the rotary table 5201 for the purpose of supplying reactant gases over the entire surface of the wafers placed on the rotary table 5201. As a result, a moment is large at the distal ends of the gas nozzles 5203 when the proximal ends of the gas nozzles 5203 are supported by the side wall of the process container 5200. The distal ends may thus drop due to the weight of nozzles.

Figure 41:
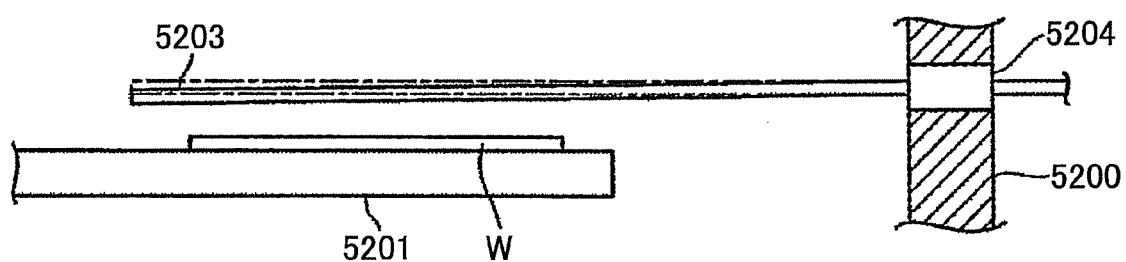
FIG. 41 is a partial cross-sectional view showing a reactant gas nozzle of the film deposition apparatus illustrated in FIG. 40.

As illustrated in FIG. 41, thus, the gas nozzle 5203 inclines such that the distal end is lower than the proximal end, resulting in the distance between the gas nozzle 5203 and the surface of the wafer W varying in the longitudinal direction of the nozzle. With the amount of supply of reactant gas from the gas discharge ports being constant in the longitudinal direction of the gas nozzle 5203, thus, the density of reactant gas on the surface of the wafer may be uneven due to the fact that the gas nozzle 5203 is closer to the wafer W toward the distal end than toward the proximal end. In order for reactant gas to be efficiently adsorbed to the wafer W, the gas nozzle 5203 is provided preferably in close proximity to the wafer W. Due to such an arrangement, the distal end of the gas nozzle 5203 may have a risk of touching the wafer W.

Moreover, the long gas nozzle 5203 means that the amount of discharged gas is larger toward the proximal end than toward the distal end of the gas nozzle 5203 as the proximal end is closer to the gas supply source. As a result, the density of reactant gas may be lower at the center area than at the perimeter area of the process container 5200. In consideration of this, it may be viable to deliberately bring the distal end of the gas nozzle 5203 closer to the rotary table 5201 than the proximal end, thereby providing a condition that facilitates adsorption of reactant gas. Accordingly, it may be preferable to provide a configuration in which the inclination of the gas nozzle 5203 relative to the horizontal axis is adjusted such as to adjust the distance between the gas nozzle 5203 and the wafer W in the longitudinal direction of the gas nozzle 5203.

It is thus desired to provide a film deposition apparatus that can adjust the inclination of a gas nozzle relative to the horizontal axis.

Figure 21:
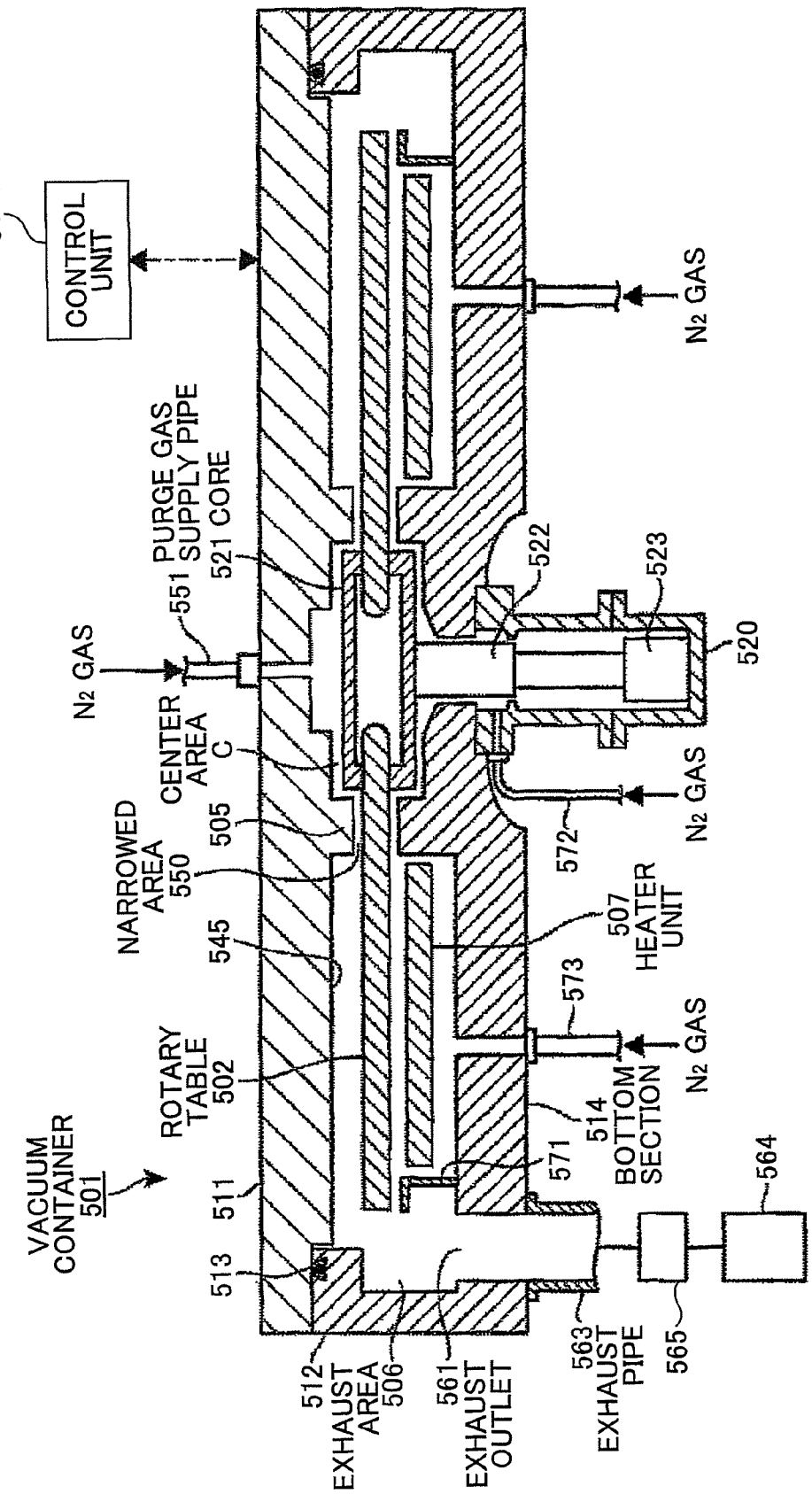
FIG. 21 is a cross-sectional view of a film deposition apparatus according to an embodiment of the present invention taken along an line I-I illustrated in FIG. 23.
Figure 23:
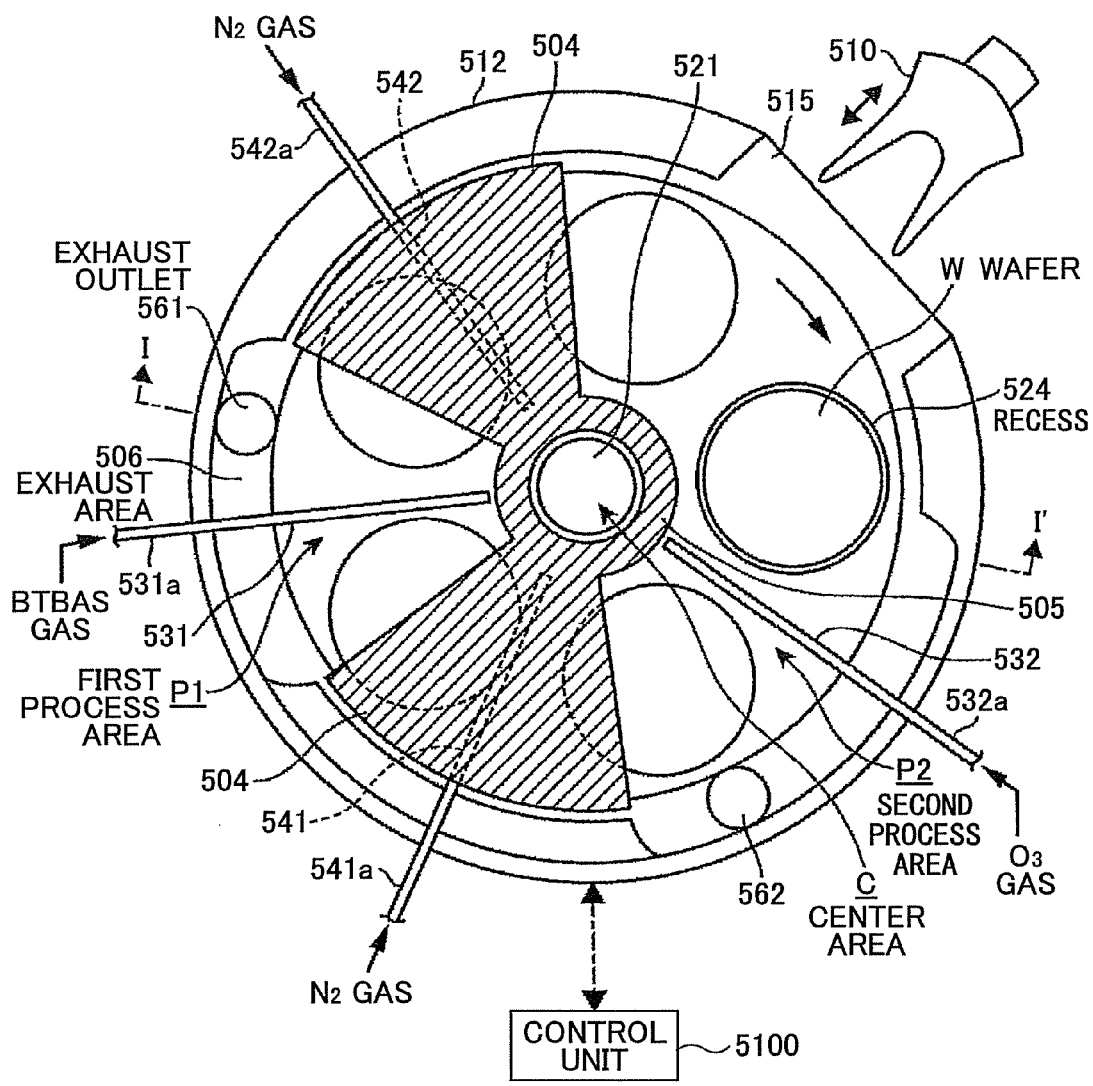
FIG. 23 is a horizontal sectional view of the film deposition apparatus.

A film deposition apparatus according to an embodiment of the second aspect of the present invention includes a vacuum container 21 having a generally flat circular shape and a rotary table 502 serving as a substrate placement unit situated in the vacuum container 501 with a rotation center thereof at a general center of the vacuum container 501, as illustrated in FIG. 21, which shows a cross-sectional view taken along the line I-I' illustrated in FIG. 23. The vacuum container 501 includes a container 512 and a top panel 511 detachable from the container 512. The top panel 511 is pressed against the container 512 due to reduced interior pressure, with the O ring 513 intervening therebetween to serve as a sealant, thereby maintaining the airtight condition. When disconnecting the top panel 511 from the container 512, a manipulation mechanism (not shown) is used to lift the top panel 511.

The rotary table 502 is fixed at its center to the core 521 having a cylindrical shape. The core 521 is fixedly mounted to the top end of the rotation shaft 522 that vertically extends. The rotation shaft 522 penetrates through a bottom section 514 of the vacuum container 501, and has its bottom end attached to a drive unit 523. The drive unit 523 rotates the rotation shaft 522 clockwise around a vertical axis. The rotation shaft 522 and the drive unit 523 serve as a movement unit, and are accommodated in a case 520 having a cylindrical shape with an opening at the top. The case 520 has a flange portion at the top, which is attached to the bottom surface of the bottom section 514 of the vacuum container 501 in an airtight manner. The atmosphere inside the case 520 is thus hermetically isolated from the exterior atmosphere.

Figure 22:
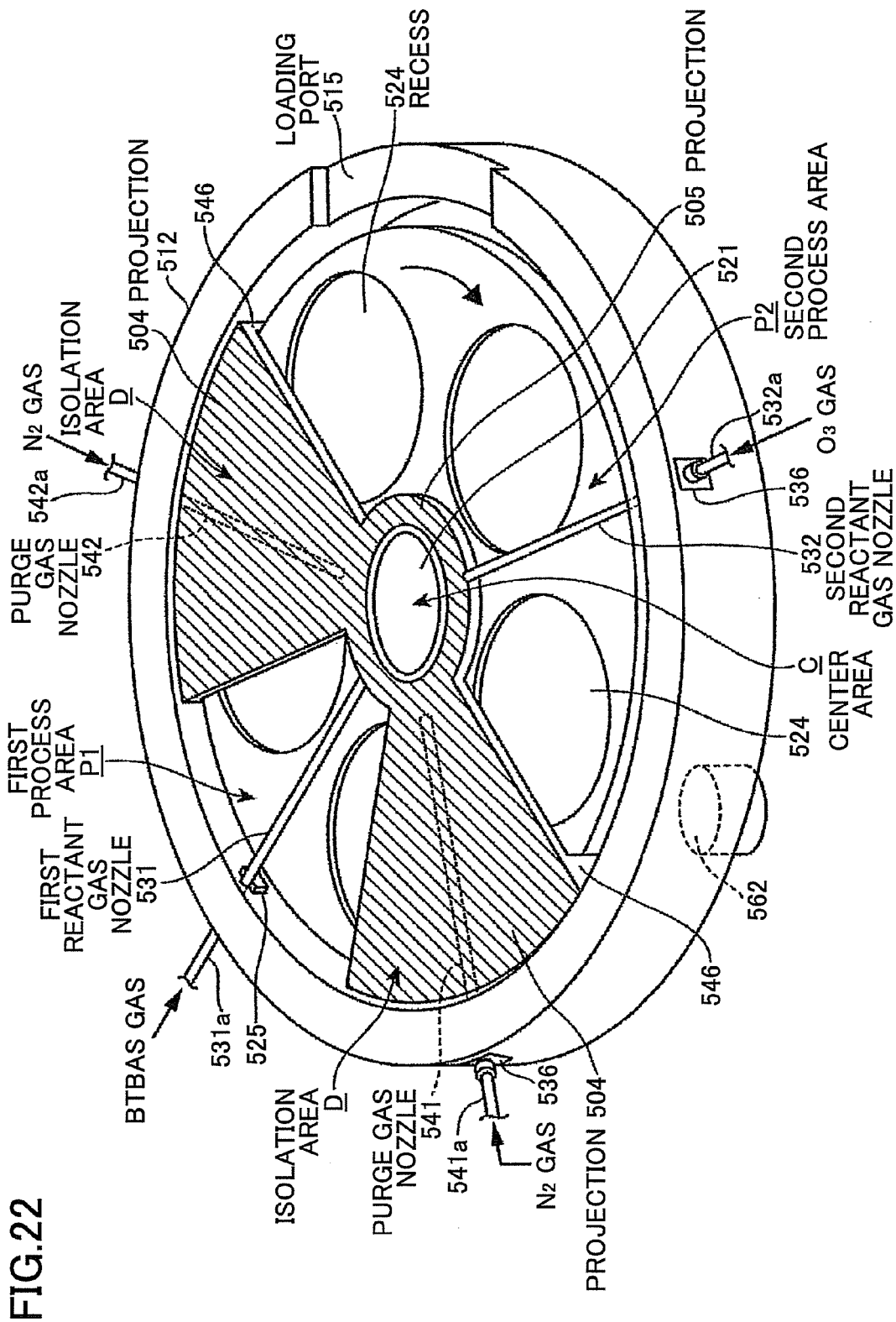
FIG. 22 is an oblique perspective view showing a schematic configuration of the inside of the film deposition apparatus.

Recesses 524 each having a circular shape are formed in the surface of the rotary table 502 as illustrated in FIG. 22 and FIG. 23, so that wafers, which may be five substrates, for example, can be placed therein in a circular direction (i.e., circumferential direction). For the sake of convenience of illustration, FIG. 23 shows only one wafer W in one of the recesses 524. FIGS. 4A and 4B are development views in which a rotary table is sectioned along a concentric circle and developed in a horizontal direction. As illustrated in FIG. 4A, the diameter of the recess 524 is slightly larger than the diameter of the wafer, e.g., larger by a margin of 4 mm, and the depth of the recess 24 is configured to be substantially equal to the thickness of the wafer. When the wafer is placed in the recess 524, thus, the upper surface of the wafer and the upper surface of the rotary table 502 (i.e., in the places where no wafer is placed) are flush with each other. If there is a large difference in elevation between the surface of the wafer and the surface of the rotary table 502, a step created by such a difference causes pressure variation. For the purpose of achieving an even film thickness over the extent of the surface, the surface of the wafer and the surface of the rotary table 502 may preferably have the same elevation (i.e., flush with each other). The provision that the wafer surface and the surface of the rotary table 502 may preferably be flush with each other may include a situation in which these surfaces are at the same elevation, or have a difference in elevation within a margin of 5 mm. It is preferable, however, that a difference in elevation between these surfaces be set as close to zero as processing precision allows. Through-holes (not shown) are formed at the bottom surface of the recesses 524, so that three elevating pins (see FIG. 32) are inserted through the holes for the purpose of elevating the wafer from the bottom surface of the wafer, as will be described later.

The recesses 524 serve to position wafers in order to prevent them from being thrown outwardly by a centrifugal force associated with the rotation of the rotary table 502. The substrate placement area (i.e., wafer placement area) is not limited to a recess. Alternatively, guide members for embracing the circumferential edge of the wafer may be arranged on the rotary table 502 in a circular direction. When a chuck mechanism such as an electrostatic chuck is provided in the rotary table 502 to achieve wafer adhesion, the places to which wafers are adhered serve as the substrate placement areas.

As illustrated in FIG. 22 and FIG. 23, a first reactant gas nozzle 531, a second reactant gas nozzle 532, and two purge gas nozzles 541 and 542 are situated at intervals along the circumferential direction of the vacuum container 501 (i.e., the circular direction of the rotary table 502) to extend in the radial directions above the areas where the recesses 524 of the rotary table 502 pass. The reactant gas nozzles 531 and 523 and purge gas nozzles 541 and 542 may be attached to the side wall of the vacuum container 501 (i.e., the side wall of the container 512). These gas nozzles 531, 532, 541, and 542 extend approximately in a horizontal direction from the side wall of the vacuum container 501 (i.e., the side wall of the container 512) to near the center. The areas under the reactant gas nozzles 531 and 532 are comprised of a first process area P1 for causing BTBAS gas to be adsorbed to the wafer and a second process area P2 for causing $O_3$ gas to be adsorbed to the wafer.

Figure 25A:
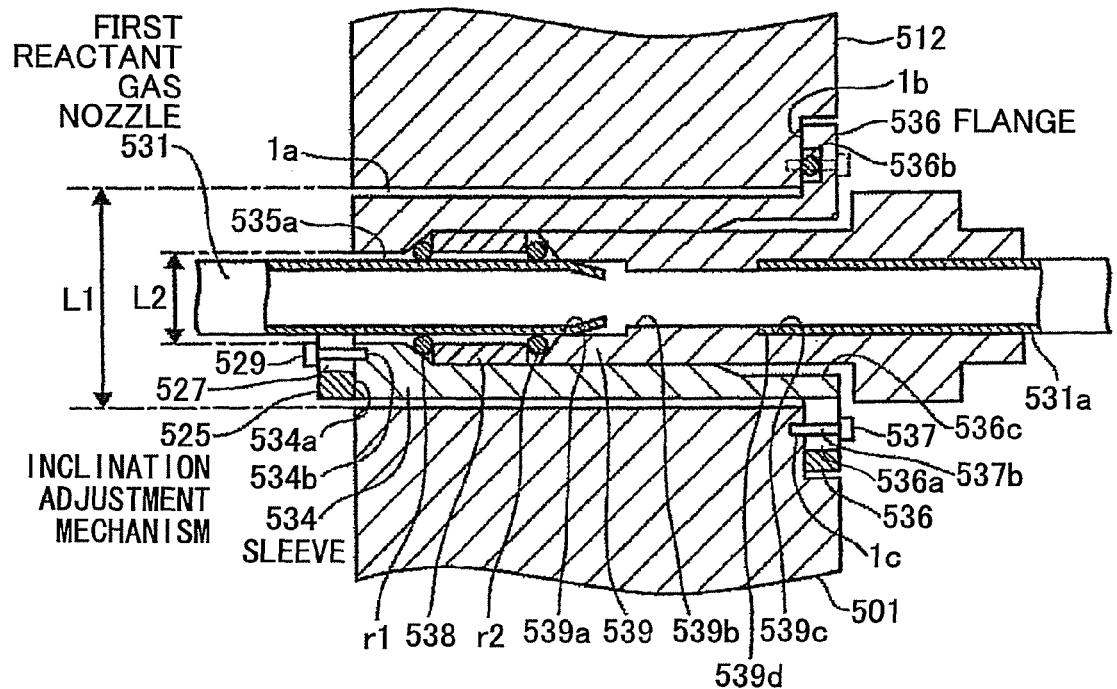
FIGS. 25A and 25B are cross-sectional views for illustrating mechanisms for attaching a reactant gas nozzle.

In the following, a description will be given of the attaching structure for the reactant gas nozzles 531 and 532 and the purge gas nozzles 541 and 542 by referring to FIGS. 25A and 25B through FIG. 29. Since the attaching structure is the same for the reactant gas nozzles 531 and 532 and the purge gas nozzles 541 and 542, the reactant gas nozzle 531 will be used as an example. As illustrated in FIG. 25A, the side wall of the container 512 of the vacuum container 501 has a sleeve 534 that is used to attach the reactant gas nozzle 531 to the side wall from outside the vacuum container 501. The sleeve 534 has a flange 536. The flange 536 is threadably mounted to the side wall of the vacuum container 501 (i.e., container 512) by use of position adjustment screws 537, so that the sleeve 534 is fixedly mounted to the vacuum container 501. In this example, the sleeve 534 serves as an insertion hole into which one end of the reactant gas nozzle 531 is inserted.

The side wall of the container 512 has an opening 1a into which the sleeve 534 is mounted. In this example, the attaching position of the sleeve 534 is coarsely adjustable as will be described later, so that an inner diameter L1 of the opening 1a is made larger than the outer diameter of the sleeve 534 by such a margin as to allow the movement of the sleeve 534 for coarse adjustment.

A portion 535a of the sleeve 534 that has an opening on the inner side of the vacuum container 501 receives one end of the reactant gas nozzle 531 from inside the vacuum container 501 (i.e., from the inner-wall side of the vacuum container 501). In so doing, it is preferable for the reactant gas nozzle 531 to be smoothly inserted and supported from below on the proximal side. It is further preferable that the height of the support position is adjusted to adjust the angle of the reactant gas nozzle 531 relative to the horizontal axis inside the vacuum container 501. In consideration of this, the inner diameter L2 of the portion 535a is designed to be slightly larger than the outer diameter of the reactant gas nozzle 531 to permit latitude in the movement of the reactant gas nozzle 531 for fine adjustment. Further, a joint member 539 is inserted into the sleeve 534 from outside the vacuum container 501 (i.e., from the outer wall side of the vacuum container 501), with an intervening inner sleeve 538. The portion 535a, the inner sleeve 538, and the joint member 539 are arranged inside the sleeve 534 in the order listed from inside the vacuum container 501.

The joint member 539 is provided for the purpose of coupling the reactant gas nozzle 531 to a gas supply pipe 531a that supplies reactant gas to the reactant gas nozzle 531. The inner diameter of an end 539a of the joint member 539 is set substantially equal to the outer diameter of one end of the reactant gas nozzle 531.

In this example, the inner diameter of the joint member 539 becomes narrower than the outer diameter of the gas supply pipe 531a at a position outside the point where the end of the reactant gas nozzle 531 is situated. A portion 539c outside this narrowed portion has an inner size approximately the same as the outer diameter of the gas supply pipe 531a. An end of the gas supply pipe 531a is inserted into the portion 539c of the joint member 539 from outside the vacuum container 501, so that this end of the gas supply pipe 531a is in contact with and stopped by a step 539d formed by the narrowed portion 539b.

Further, O rings r1 and r2 serving as sealing members are provided on both sides of the inner sleeve 538 inside the sleeve 534. When the end of the reactant gas nozzle 531 is inserted into the sleeve 534, the reactant gas nozzle 531 is fixed through its gravitational force by pressing the O rings r1 and r2, which are situated between the sleeve 534 and the reactant gas nozzle 531. With this arrangement, the end of the reactant gas nozzle 531 is fixedly mounted in the sleeve 534 while hermetically sealing the interior of the vacuum container 501. In this manner, the present embodiment provides the O rings r1 and r2 serving as sealing members between the sleeve 534 and the reactant gas nozzle 531.

Figure 26:
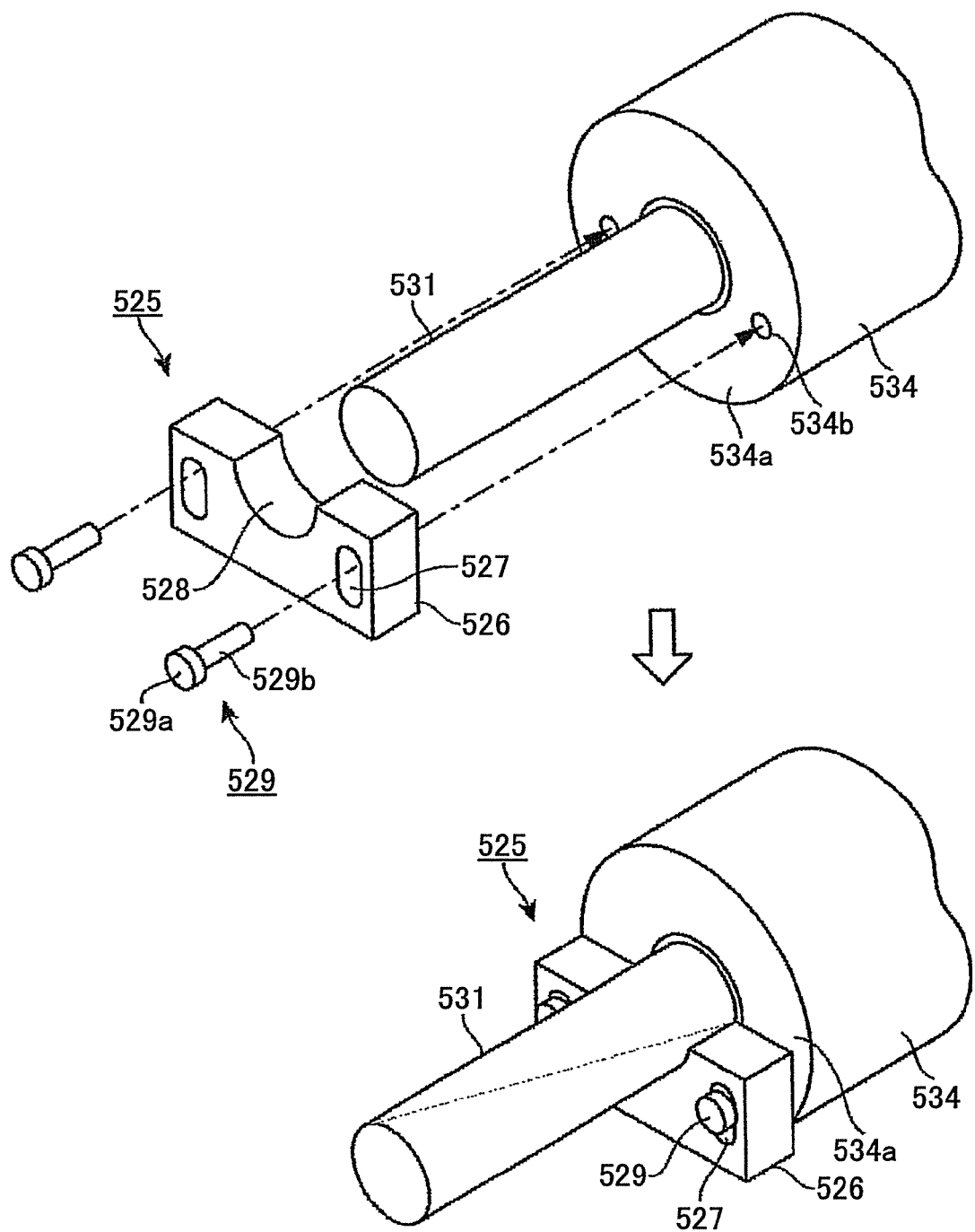
FIG. 26 is an oblique perspective view showing the reactant gas nozzle.

Inside the vacuum container 501, an inclination adjustment mechanism 525 is provided. The inclination adjustment mechanism 525 serves to adjust the inclination of the reactant gas nozzle 531 relative to the horizontal axis. The inclination adjustment mechanism 525 supports the reactant gas nozzle 531 from below at a point that is closer to the inner space of the vacuum container 501 than the portion inserted into the vacuum container 501. The inclination adjustment mechanism 525 is provided inside the vacuum container 501 to adjust the height of the support point. Specifically, the inclination adjustment mechanism 525 includes a support member 526 that is an aluminum (Al) plate for supporting the reactant gas nozzle 531 from below, and further includes holes 527 formed in the support member 526, as illustrated in FIG. 26. The support member 526 has a recess 528 having a shape conforming to the shape of the reactant gas nozzle 531, so that the lower side of the reactant gas nozzle 531 engages the recess 528.

Figure 27A:
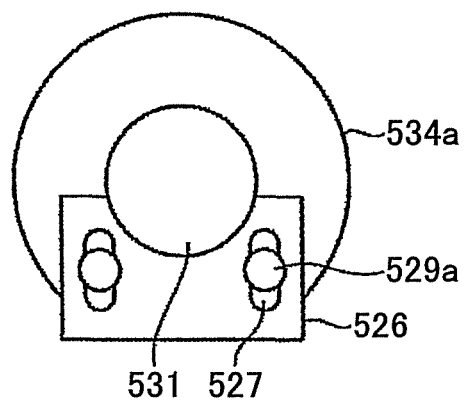
FIGS. 27A and 27B are a front elevation view and a back elevation view, respectively, of a mechanism for attaching a reactant gas nozzle.

The support member 526 is threadably mounted by use of inclination adjustment screws 529 to the interior of the vacuum container 501, i.e., to an inner wall portion 534a of the sleeve 534 that constitutes part of the inner wall of the vacuum container 501. The holes 527 and the inclination adjustment screws 529 have relative sizes as illustrated in FIG. 26 and FIG. 27A, which shows a joint point between the inclination adjustment mechanism 525 and the sleeve 534 as viewed from inside the vacuum container 501. Namely, the vertical extension of the holes 527 is longer than the diameter of the screw rods 529b of the inclination adjustment screws 529, and the heads 529a of the inclination adjustment screws 529 have a size that does not pass through the holes 527. Screw holes 534b are formed in the inner wall portion 534a of the sleeve 534 to receive the inclination adjustment screws 529. The inclination adjustment screws 529 are screwed into the screw holes 534b through the holes 527 of the support member 526, thereby mounting the support member 526 at a vertical position that is adjusted. With this arrangement, the inclination of the reactant gas nozzle 531 relative to the horizontal axis is adjusted.

The support member 526 is mounted at a position that is vertically adjusted relative to the position of the screw holes 534b of the vacuum container 501 within the range corresponding to the vertical extension of the holes 527. The adjustment of this mount position makes it possible to adjust how much the proximal side of the reactant gas nozzle 531 is raised by the inclination adjustment mechanism 525, i.e., to adjust the height of the support point of the inclination adjustment mechanism 525 supporting the reactant gas nozzle 531.

Figure 28A:
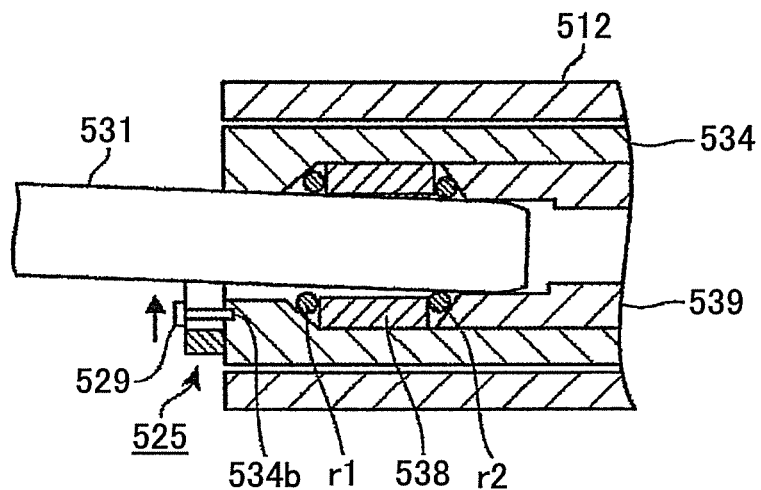
FIGS. 28A and 28B are cross-sectional views for illustrating examples of an attached reactant gas nozzle.

The inclination adjustment mechanism 525 supports the reactant gas nozzle 531 at the position that is situated closer to the inner space of the vacuum container 501 than the mount position at which the reactant gas nozzle 531 is mounted to the vacuum container 501 through the O rings r1 and r2. When adjustment is made to raise the support point higher than the mount point, the proximal side (i.e., support point) of the reactant gas nozzle 531 is raised as illustrated in FIG. 28A within the range permitted by the gap between the reactant gas nozzle 531 and the sleeve 534. In this manner, the inclination of the reaction gas nozzle 531 relative to the horizontal axis is adjusted such that the distal side of the reaction gas nozzle 531 is situated higher than the proximal side.

Figure 28B:
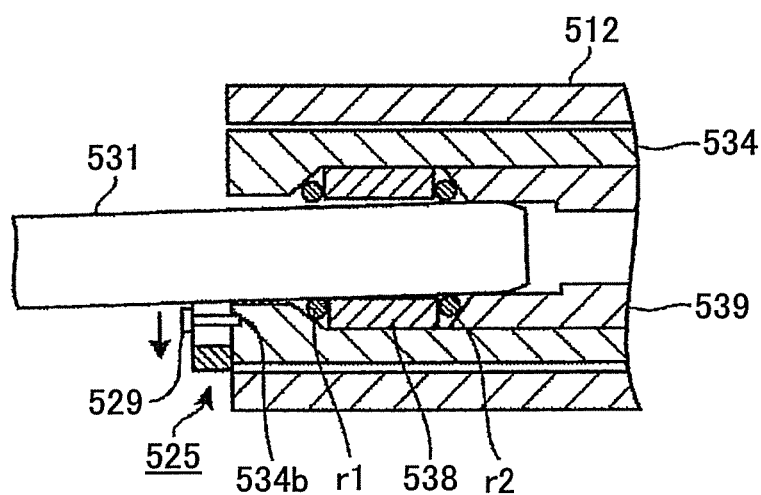
Figure 29:
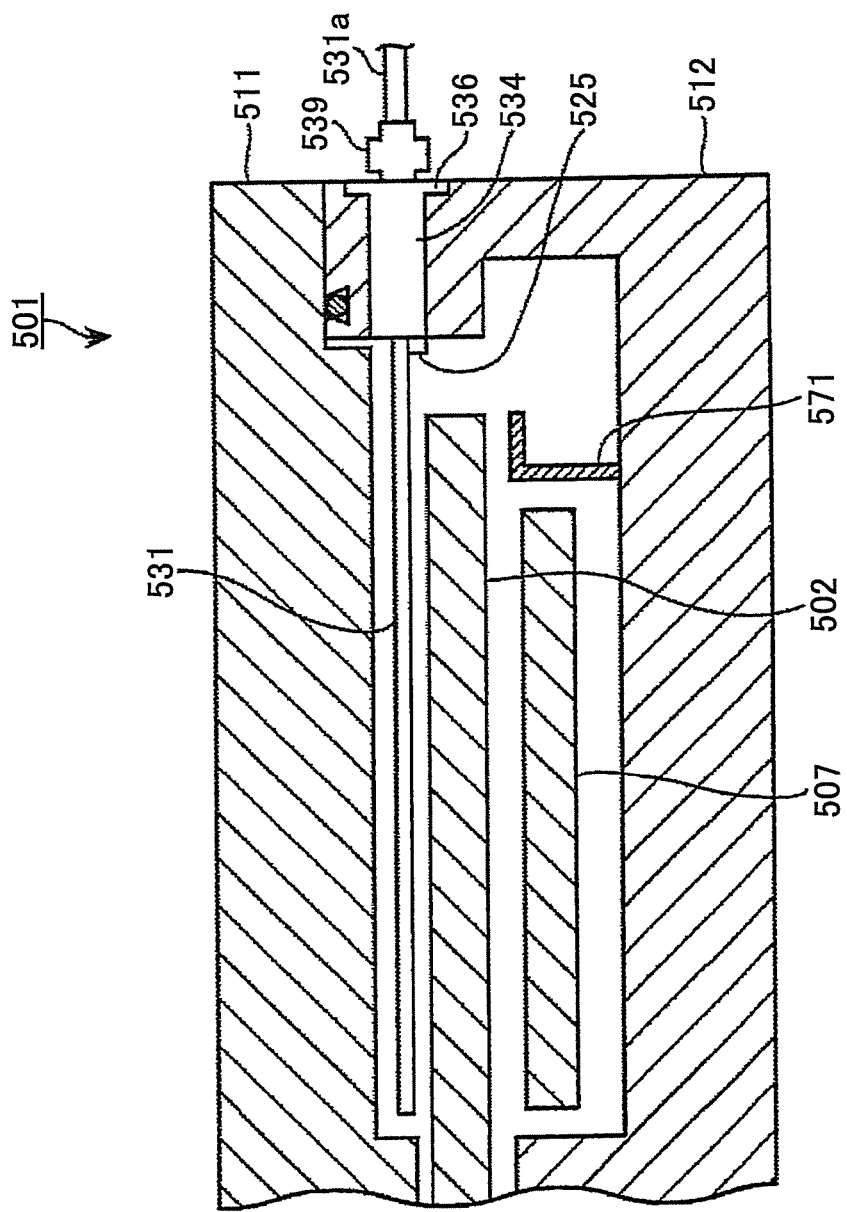
FIG. 29 is a cross-sectional view for illustrating an example of an attached reactant gas nozzle.

When adjustment is made by the inclination adjustment mechanism 525 to set the support point lower than the mount point, the proximal side (i.e., support point) of the reactant gas nozzle 531 is lowered as illustrated in FIG. 28B within the range permitted by the gap between the reactant gas nozzle 531 and the sleeve 534. In this manner, the angle of the reactant gas nozzle 531 relative to the horizontal axis is adjusted such that the distal end of the reactant gas nozzle 531 is situated lower than the proximal side.

The reactant gas nozzle 531 that extends in a radial direction of the rotary table 502 has a length of 350 mm, for example. When the height of the support point of the reactant gas nozzle 531 is adjusted by the inclination adjustment mechanism 525, the distal end of the reactant gas nozzle 531 moves a greater distance than the distance that the proximal end moves through adjustment. The vertical extension of the holes 527 is determined by taking into consideration the size of the gap between the reactant gas nozzle 531 and the sleeve 534 and the required adjustment range of the reactant gas nozzle 531. Even when the inclination of the reactant gas nozzle 531 is adjusted, the hermetic sealing of the vacuum container 501 is maintained because of the O rings r1 and r2 situated on both sides of the inner sleeve 538. At least one of the O rings r1 and r2 serves as a sealing member as illustrated in FIGS. 28A and 28B.

Figure 25B:
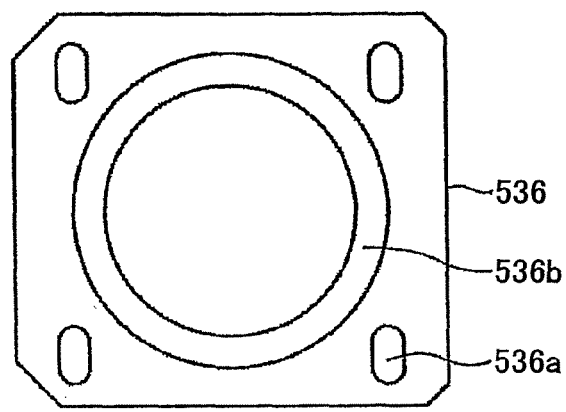

The flange 536 of the sleeve 534 is threadably mounted to the outer wall of the vacuum container 501 by use of the position adjustment screws 537 and position adjustment holes 536a. In this example, a recess 1b is formed in the outer wall of the vacuum container 501 at the position corresponding to the flange 536, so that the flange 536 is attached to the recess 1b. The recess 1b has screw holes 1c into which the position adjustment screws 537 are to be screwed. An O ring r3 serving as a sealing member is provided at the surface of the recess 1b that comes in contact with the flange 536. With this arrangement, the sleeve 534 is mounted to the vacuum container 501 in an airtight manner. In this example, the flange 536 has a recess 536b for accommodating the O ring r3. The position adjustment holes 536a of the flange 536 are formed at positions that do not interfere with the recess 536b for the O ring r3 as viewed from outside the vacuum container 501 as illustrated in FIG. 25B.

Figure 27B:
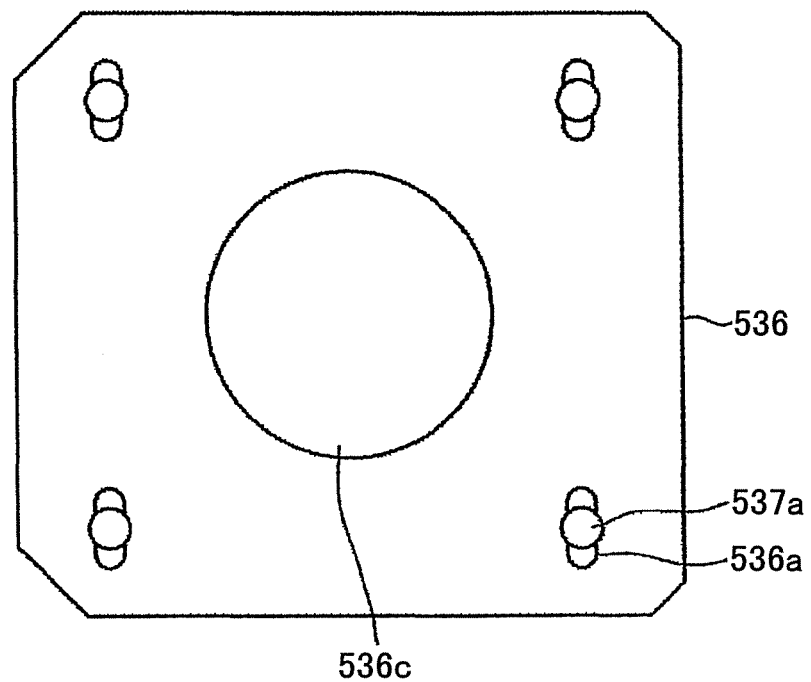

The position adjustment holes 536a and the position adjustment screws 537 have relative sizes as illustrated in FIG. 27B, which shows the flange 536 as viewed from outside the vacuum container 501. Namely, the vertical extension of the position adjustment holes 536a is longer than the diameter of the screw rods 537b of the position adjustment screws 537, and the heads 529a of the position adjustment screws 537 have a size that does not pass through the holes 536a. FIG. 27B illustrates an opening 536c of the sleeve 534 for accommodating the joint member 539.

In this manner, the sleeve 534 is mounted to the vacuum container 501 by screwing the position adjustment screws 537 into the screw holes 1c formed on the outer wall of the vacuum container 501 via the position adjustment holes 536a of the flange 536, so that the mount position of the flange 536 is coarsely adjustable. Namely, the flange 536 is mounted at a position that is vertically adjusted relative to the position of the screw holes 1c of the vacuum container 501 within the range corresponding to the vertical extension of the position adjustment holes 536a. The vertical position of the sleeve 534 is thus adjustable by adjusting this mount position. The size of the position adjustment holes 536a is determined in response to the required adjustment range of the sleeve 534.

In this configuration, the sleeve 534 is inserted first into the opening 1a of the vacuum container 501 from outside the vacuum container 501. The O rings r1 and r2 and the inner sleeve 538 are then placed inside the sleeve 534, followed by mounting the joint member 539. After this, the reactant gas nozzle 531 is mounted to the joint member 539 from inside the vacuum container 501, and, then, the gas supply pipe 531a is mounted from outside the vacuum container 501. The inclination adjustment mechanism 525 is then attached to support the reactant gas nozzle 531 from below, thereby adjusting the inclination of the reactant gas nozzle 531. In so doing, the mount position of the flange 536 of the sleeve 534 is adjusted to coarsely adjust the inclination of the sleeve 534, and the mount position of the inclination adjustment mechanism 525 is further adjusted. With this arrangement, the height of the support position to support the reactant gas nozzle 531 is adjusted to adjust the inclination of the reactant gas nozzle 531 relative to the horizontal axis, such that the dropping of the distal end of the reactant gas nozzle 531 is prevented. Namely, the distance between the reactant gas nozzle 531 and the surface of the rotary table 502 is adjusted to be approximately the same along the extension of the reactant gas nozzle 531. The reactant gas nozzle 531 has been used as an example for the purpose of explaining the mount mechanism. The same mount mechanism is also used to mount the reactant gas nozzle 532 and the purge gas nozzles 541 and 542 to the vacuum container 501.

The reactant gas nozzles 531 and 532 are connected through the gas supply pipes 531a and 532a to a gas supply source for supplying BTBAS (i.e., bis-tertiary butyl amino silane) gas serving as a first reactant gas and a gas supply source for supplying $O_3$ (ozone) gas serving as a second reactant gas (not shown), respectively. Further, the purge gas nozzles 541 and 542 are connected through purge gas supply pipes 541a and 542a, respectively, to a gas supply source (not shown) for supplying $N_2$ gas (i.e., nitrogen gas). In this example, the second reactant gas nozzle 532, the purge gas nozzle 541, the first reactant gas nozzle 531, and the purge gas nozzle 542 are arranged clockwise in the order listed.

The purge gas nozzles 541 and 542, which are purge gas supply units, serve to form isolation areas D to isolate the first process area P1 and the second process area P2 from each other. As illustrated in FIG. 22 through FIGS. 24A and 24B, the top panel 511 of the vacuum container 501 has projections 504 each having a planar fan shape projecting downward, which may be defined as a pie shape made by dividing an imaginary circle drawn near the inner wall of the vacuum container 501 around the rotation center of the rotary table 502. Each of the purge gas nozzles 541 and 542 is accommodated in a groove 543 formed in the projection 504 to extend in a radial direction of the circle at a general center of the projection 504. The distances from the center axis of the purge gas nozzle 541 (or 542) to the opposite edges of the fan-shape projection 504 (i.e., one edge situated upward and the other edge situated downward in the rotation direction) are set equal to each other. The groove 543 is formed to divide the projection 504 by half in the present embodiment. In other embodiments, the groove 543 may be formed at such a position that the section of the projection 504 situated upstream relative to the groove 543 in the rotational direction of the rotary table 502 is wider than the section of the projection 504 situated downstream relative to the groove 543.

In this configuration, a low ceiling surface 544 (first ceiling surface) that may be flat is provided as the lower surface of the projection 504 on both sides of each of the purge gas nozzles 541 and 542 in the rotational direction. Further, ceiling surfaces 545 (second ceiling surfaces) higher than the ceiling surface 544 are situated on both sides of the ceiling surface 544 in the rotation direction. The projection 504 serves to create isolation space that is a narrowed space to prevent the first reactant gas and the second reactant gas from being merged by entering the space between the ceiling and the rotary table 502

In the case of the purge gas nozzle 541, for example, the isolation space prevents $O_3$ gas from intruding from upstream in the rotational direction of the rotary table 502, and also prevents BTBAS gas from intruding from downstream in the rotational direction. The phrase "prevention of gas intrusion" or the like refers to the fact that the $N_2$ gas serving as purge gas discharged from the purge gas nozzle 541 spreads into the space between the first ceiling surface 544 and the rotary table 502 to flow into adjacent space under the second ceiling surface 545 situated alongside the ceiling surface 544, so that gas in the adjacent space is unable to intrude into the narrowed space. Further, the phrase "inability of gas to intrude" not only means that the no gas whatsoever enters the space under the projection 504 from the adjacent space, but also means that the gas can enter to some extent, but the $O_3$ gas and the BTBAS gas entering from both sides are still not mixed with each other under the projection 504. As long as such an effect is achieved, the isolation area D exerts its function to isolate the atmosphere of the first process area P1 and the atmosphere of the second process area P2 from each other. The degree of narrowness of the narrowed space is such that a pressure difference between the narrowed space (i.e., space under the projection 504) and the adjacent space (i.e., space under the second ceiling surface 545) ensures the presence of the function to maintain the "inability-of-gas-to-intrude" condition. Specific size may differ depending on the area size of the projections 504 and the like. It should be noted that a gas adsorbed to the wafer passes through the isolation area D. The gas that is referred to in the expression "prevention of gas intrusion" or the like is one that is in the gas phase.

The lower surface of the top panel 511 has a projection 505 along the perimeter of the core 521 to face the rotary table 502 at the position slightly outside the core 521. The projection 505 is continuous with and seamlessly connected to the projection 504 at a point near the rotation center, and has a lower surface that is situated at the same elevation as the lower surface of the projection 504 (i.e., ceiling surface 544). FIG. 22 and FIG. 23 illustrate the top panel 511 that is sectioned through a horizontal plane at an elevation that is lower than the ceiling surface 545 but higher than the purge gas nozzles 541 and 542. The projection 505 and the projection 504 do not have to be integral, and may be provided as separate elements.

In this example, the wafer W having a diameter of 300 mm is used as a substrate to be processed. In this case, the projection 504 may be 146-mm wide in a circular direction (i.e., as measured along an arc of a circle concentric with the rotary table 502) at a distance of 140 mm from the rotation center on the boundary with the projection 505. The circumferential length of the projection 4 at the outermost point of the wafer placement areas (i.e., recesses 524) is 502 mm, for example. As illustrated in FIG. 24A, the portion of the projection 504 situated on either side of the purge gas nozzle 541 (542) has a length L in the circumferential direction that is equal to 246 mm at the above-noted outermost point.

The height h of the ceiling surface 544 that is the lower surface of the projection 504 relative to the surface of the rotary table 502 illustrated in FIG. 24A may range from about 0.5 mm to about 10 mm, and may preferably be about 4 mm. In this case, the rate of revolution of the rotary table 502 may be set equal to 1 rpm to 500 rpm, for example. In order to secure the isolation function of the isolation area D, the size of the projection 504 and the height h of the lower surface (i.e., ceiling surface 544) of the projection 504 relative to the surface of the rotary table 502 may be determined based on results obtained by conducting experiments, depending on the range of rates of revolution of the rotary table 502.

The portion of the reactant gas nozzles 531 and 532 and the purge gas nozzles 541 and 542 extending in the vacuum container 501 has a length of 350 mm. Spouts 533 and 540 having a diameter of 0.5 mm, for example, and downwardly facing are formed at 10-mm intervals, for example, along the extension of the gas nozzles (see FIGS. 24A and 24B). The reactant gas nozzles 531 and 532 and purge gas nozzles 541 and 542 may be positioned to extend horizontally to face the rotary table 502. In such a case, the distance between these gas nozzles 531, 532, 541, and 542 and the surface of the rotary table 502 is set approximately equal to 2 mm, for example. The purge gas is not limited to $N_2$ gas, and may be an inert gas such as Ar gas. The purge gas is not even limited to an inert gas, and may even be hydrogen gas. As long as the gas does not affect the film deposition process, any type of gas may be used as the purge gas.

Figure 30:
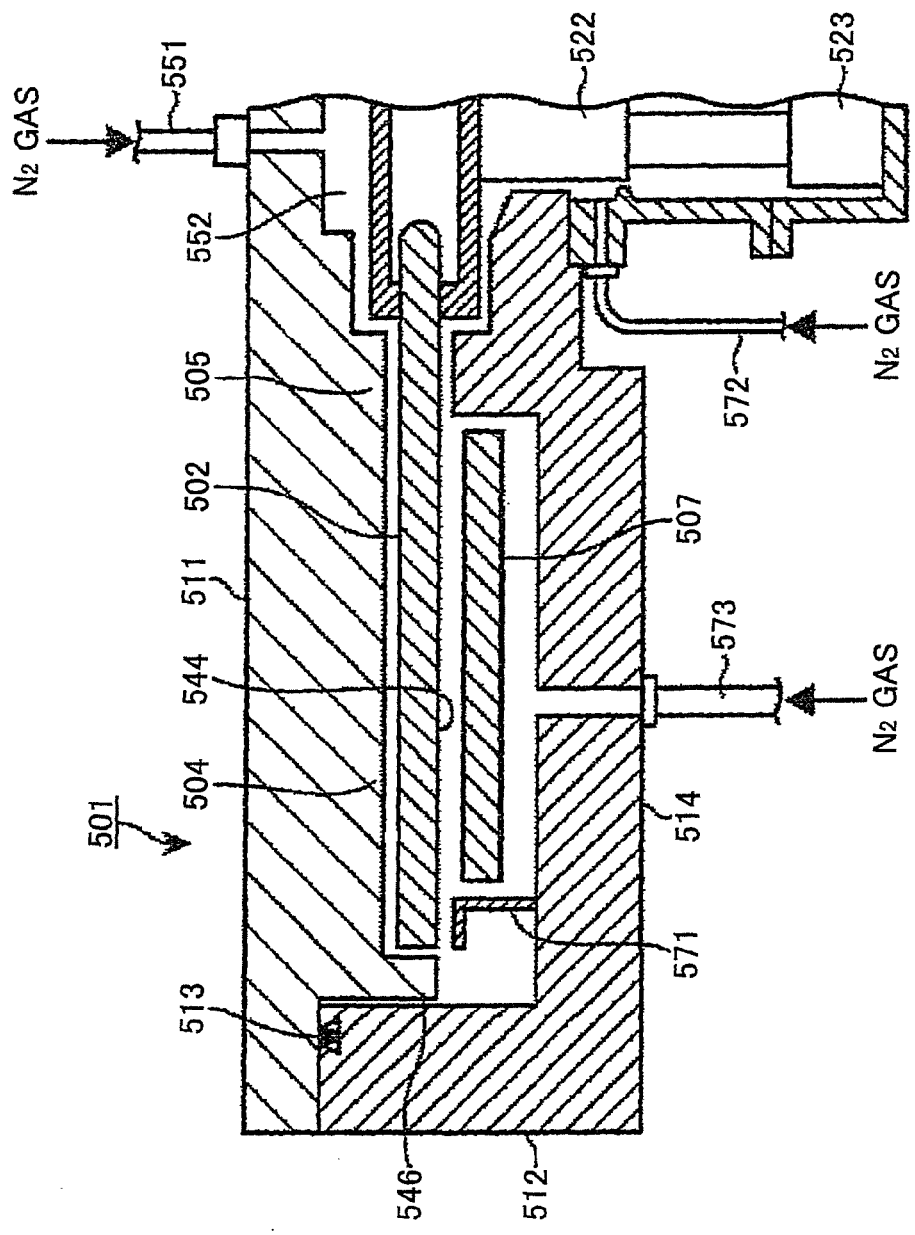
FIG. 30 is a cross-sectional view showing a portion of the film deposition apparatus.

The lower surface of the top panel 511 of the vacuum container 501, i.e., the ceiling surface situated over the wafer placement areas (i.e., recesses 524) of the rotary table 502, has the first ceiling surfaces 544 and the second ceiling surfaces 545 higher than the ceiling surfaces 544 arranged in a circumferential direction. FIG. 21 illustrates a vertical sectional view of the top panel 511 at the position where the higher ceiling surface 545 is situated. FIG. 30 illustrates a vertical sectional view of the top panel 511 at the position where the lower ceiling surface 544 is situated. The periphery of the fan-shape projection 504 (i.e., periphery of the vacuum container 501) has a bent part 546 having an L-letter shape that faces the side edge of the rotary table 502, as illustrated in FIG. 22 and FIG. 30. Since the top panel 511 having the fan-shape projection 504 is configured to be detachable from the container 512, the outer circumferential surface of the bent part 546 and the container 512 have a small gap therebetween. Like the projection 504, the bent part 546 is provided for the purpose of preventing reactant gases from intruding from both sides, thereby preventing the reaction gases from being mixed. The gap between the inner circumferential face of the bent part 546 and the side edge face of the rotary table 502 and the gap between the outer circumferential face of the bent part 546 and the container 512 are set to a similar size to the height h of the ceiling surface 544 relative to the surface of the rotary table 502. In this example, as viewed from the surface area of the rotary table 502, the inner circumferential surface of the bent part 546 appears to constitute the inner circumferential surface of the vacuum container 501.

As illustrated in FIG. 30, the inner wall of the container 512 is formed vertically in the close proximity of the outer circumferential surface of the bent part 546 at the position of the isolation area D. At the other positions where the isolation area D is not situated, the inner wall of the container 512 has a recess that appears in FIG. 21 as a step-like-shape dent in the cross-sectional view of the container 512 from the position facing the side edge of the rotary table 502 down to the position immediately above the bottom section 514. This dent portion is referred to as an exhaust space 506. At the bottom of the exhaust space 506 are provided two exhaust outlets 561 and 562 as illustrated in FIG. 21 and FIG. 23, for example. The exhaust outlets 561 and 562 are connected through exhaust pipes 563 to a common vacuum pump 564 serving as a vacuum exhaust unit. In FIG. 21, a pressure adjustment unit 565 may be provided separately for each of the exhaust outlets 561 and 562, or may be shared. The exhaust outlets 561 and 562 are provided on both sides of the isolation area D in the rotational direction as viewed from above, so that the isolation area D properly exerts its isolation function, thereby exhausting the respective reactant gases (BTBAS gas and $O_3$ gas) separately from each other. In this example, the exhaust outlet 561 is disposed between the reactant gas nozzle 531 and the isolation area D adjoining the space of the reactant gas nozzle 531 downstream in the rotation direction. The exhaust outlet 562 is disposed between the reactant gas nozzle 532 and the isolation area D adjoining the space of the reactant gas nozzle 532 downstream in the rotation direction.

The number of exhaust outlets is not limited to two. For example, another exhaust outlet may be disposed between the isolation area including the purge gas nozzle 542 and the second reactant gas nozzle 532 whose space adjoins this isolation area D downstream in the rotation direction. The number of exhaust outlets may even be four or more. In the illustrated example, the exhaust outlets 561 and 562 are situated at the position lower than the rotary table 502. Exhaustion is thus conducted through a gap between the inner wall of the vacuum container 501 and the side edge of the rotary table 502. This is only an example. The positions of the exhaust outlets 561 and 562 are not limited to the bottom section of the vacuum container 501. The exhaust outlets 561 and 562 may alternatively be formed in the sidewall of the vacuum container 501. When the exhaust outlets 561 and 562 are formed in the sidewall of the vacuum container 501, their position may be situated higher than the rotary table 502. The provision of the exhaust outlets 561 and 562 in the above-noted arrangements causes the gases on the rotary table 502 to flow toward the outer periphery of the rotary table 502. These arrangements are thus advantageous in that the unsettling of particles is reduced compared with the arrangement in which exhaustion is performed from above the rotary table 502.

Figure 32:
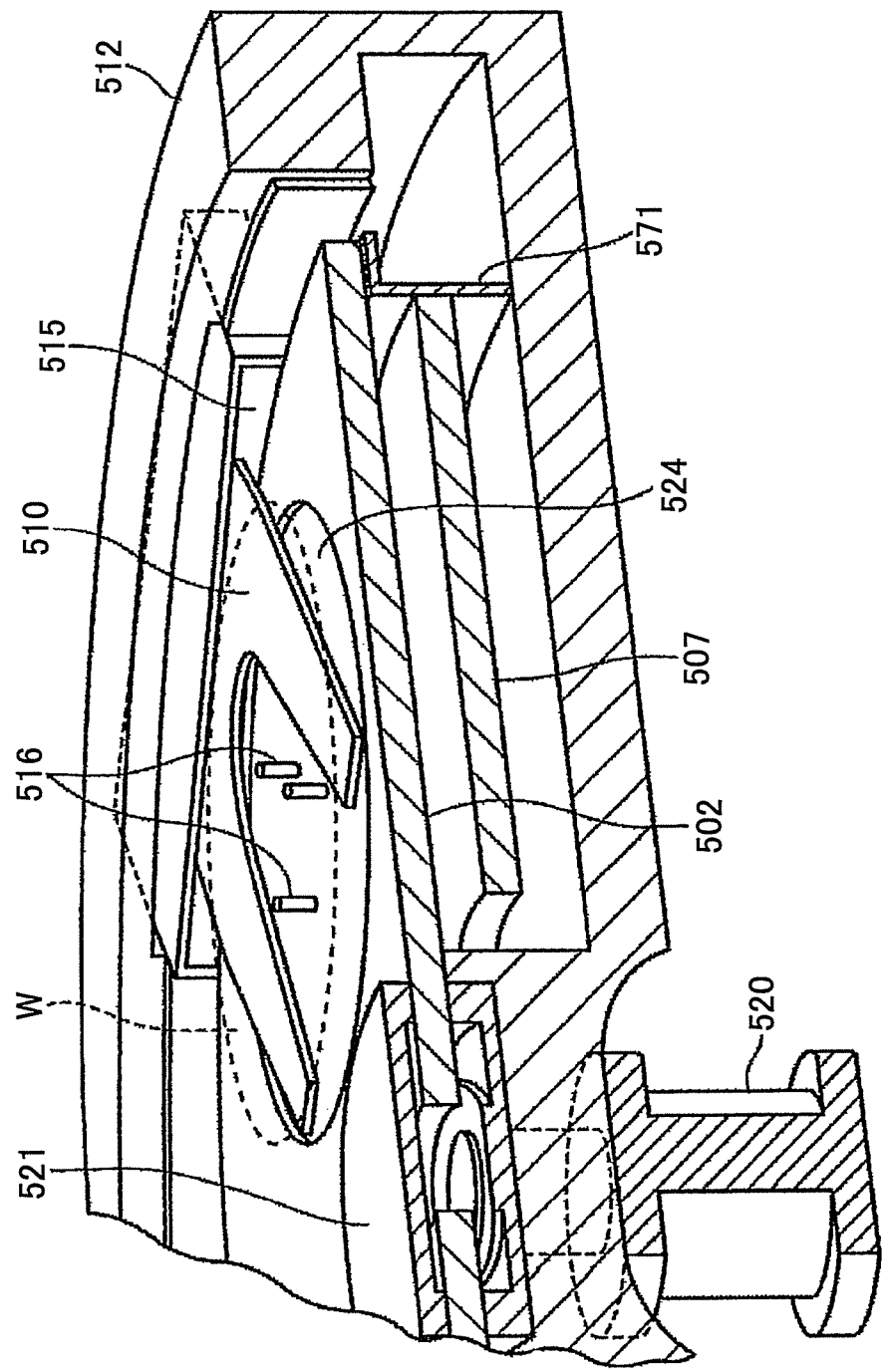
FIG. 32 is an oblique sectional view of a portion of the film deposition apparatus.

A heater unit 507 serving as a heating means is disposed in the space between the rotary table 502 and the bottom section 514 of the vacuum container 501 as illustrated in FIG. 21 and FIG. 32. The heater unit 507 heats the wafers on the rotary table 502 through the rotary table 502 to a temperature that is determined according to the process recipes. A cover member 571 is provided under the rotary table 502 near its outer edge to cover the heater unit 507 around the entire perimeter thereof. The cover member 571 serves to separate the atmosphere of the space where the heater unit 507 is disposed from the atmosphere extending from space over the rotary table 502 to the exhaust area 506. The upper end of the cover member 571 is bent outward to form a flange portion. A gap between the flange portion and the lower surface of the rotary table 502 is set to be small, so that no gas enters the inner space of the cover member 571 from outside.

The bottom section 514 has a raised structure that comes close to the lower surface of the rotary table 502 and the core 521 around the rotation center in the area that is inside the position of the heater unit 507, thereby forming a narrowed space. The through-hole formed through the bottom section 514 to accommodate the rotation shaft 522 is configured such that a gap between the rotation shaft 522 and the inner circumferential surface of the through-hole is narrow. This narrow space communicates with the inner space of the case 520. The case 520 is provided with a purge gas supply pipe 572 to supply $N_2$ gas serving as a purge gas to the above-noted narrow spaces for purging purposes. Further, the bottom section 514 of the vacuum container 501 is provided with purge gas supply pipes 573 for purging the space where the heater unit 507 is disposed. The purge gas supply pipes 573 are situated at plural locations along the circumferential direction under the heater unit 507.

Figure 31:
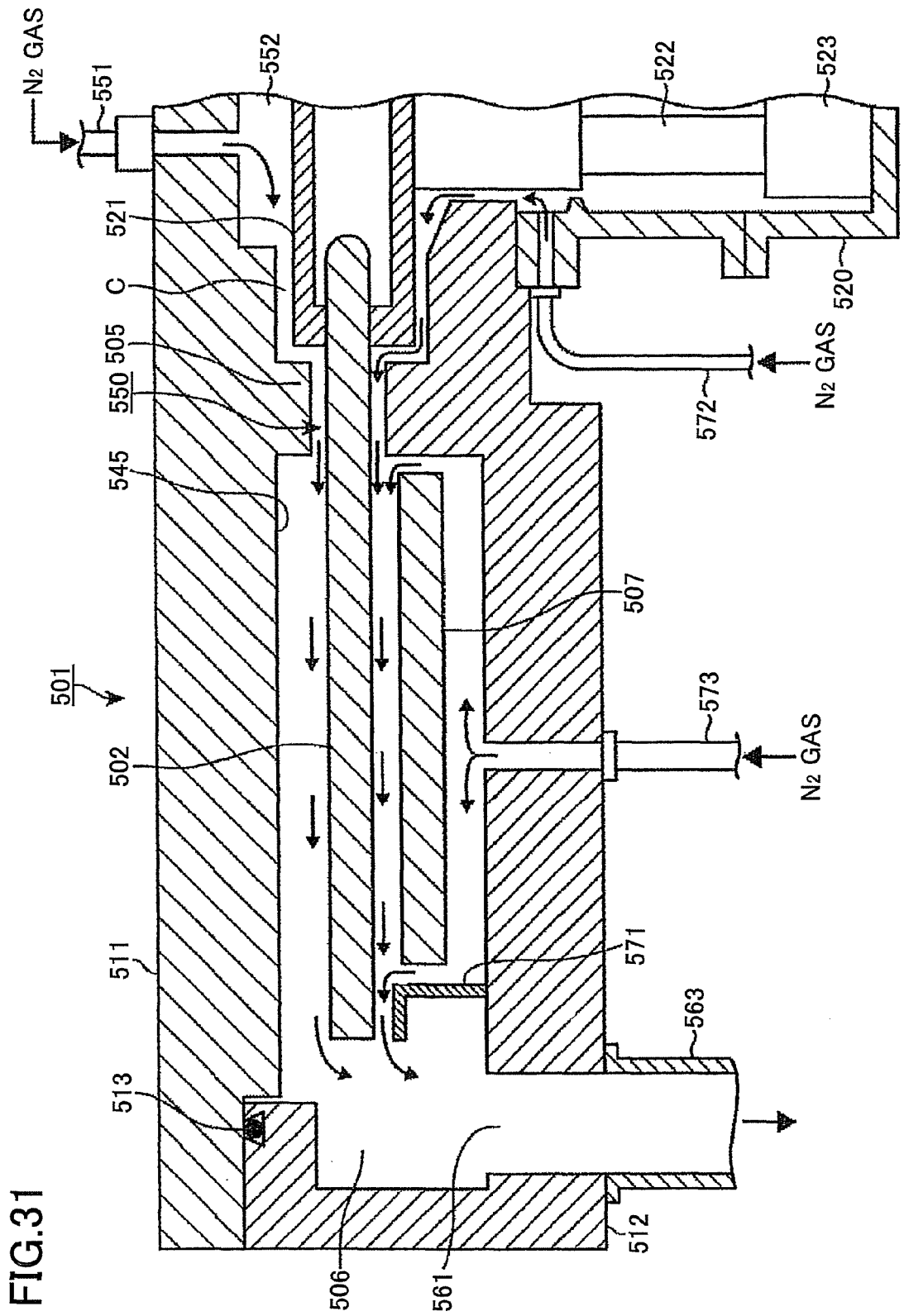
FIG. 31 is a drawing showing the flows of purge gas.

The provision of the purge gas supply pipe 572 and the purge gas supply pipes 573 creates the flows of purge gas as illustrated by arrows in FIG. 31. The $N_2$ gas purges the space inside the case 520 and the space in which the heater unit 507 is disposed. The $N_2$ gas then flows through the gap between the rotary table 502 and the cover member 571 into the exhaust area 506 for exhaustion through the exhaust outlets 561 and 562. With this provision, either one of the BTBAS gas and the $O_3$ gas is prevented from flowing from one of the first process area P1 and the second process area P2 to the other area through under the rotary table 502. Namely, the above-noted purge gas also serves to exert an isolation function.

A purge gas supply unit pipe 551 is connected to the center area of the top panel 511 of the vacuum container 501 to supply $N_2$ gas serving as a purge gas to the space 552 between the top panel 511 and the core 521. This purge gas supplied to the space 552 flows through a narrow gap 550 between the projection 505 and the rotary table 502 toward the surface of the rotary table 502 where the substrate placement parts are provided, and further flows toward the periphery of the rotary table 502. Since the space enclosed by the projection 505 is filled with the purge gas, the reactant gases (i.e., BTBAS gas and O3 gas) are prevented from being mixed with each other through the center portion of the rotary table 502 situated between the first process area P1 and the second process area P2. Namely, the film deposition apparatus is provided with the center area C that is partitioned by the center portion of the rotary table 502 and the vacuum container 501. This center area C is purged by purge gas, and also discharges the purge gas to the surface of the rotary table 502 through a circumferential spout gap for the purpose of isolating atmospheres between the first process area P1 and the second process area P2. Here, the above-noted spout gap refers to the narrow gap 550 situated between the projection 505 and the rotary table 502.

As illustrated in FIG. 22, FIG. 23, and FIG. 32, a loading port 515 is provided at the side wall of the vacuum container 501 to allow an external delivery arm 510 to load and unload the substrate wafer to and from the rotary table 502. The loading port 515 is opened and closed by a gate valve (not shown). The recesses 524 serving as wafer placement parts on the rotary table 502 receive the wafers W from and pass the wafers W to the delivery arm 510 at the position of the loading port 515. A lifting mechanism (not shown) that raises a wafer by pressing its lower surface with the elevation pins 516 penetrating through the recess 524 is provided under the rotary table 502 at the position of the loading port 515.

The film deposition apparatus of this embodiment is provided with a control unit 5100 implemented by use of a computer for the purpose of controlling the overall operation of the apparatus. The control unit 5100 has a memory in which a program for operating the apparatus is stored. This program includes a set of instruction steps for performing the operation of the apparatus as will be described later. This program may be installed to the control unit 5100 from a memory medium such as a hard disc, a compact disc, a magnetic optical disc, a memory card, a flexible disc, or the like.

In the following, the operation of the above-described embodiment will be described. The gate valve (not shown) is opened, and the external delivery arm 510 loads a wafer W onto a recess 524 of the rotary table 502 through the loading port 515. The loading is performed by moving the elevation pins 516 extending from the bottom side of the vacuum container 501 through the holes penetrating the bottom surface of the recess 524 when the recess 524 comes to and stops at the position of the loading port 515, as illustrated in FIG. 32. The loading of a wafer W is performed while rotating the rotary table 502 intermittently, so that wafers W are placed on all the five recesses 524 of the rotary table 502. The vacuum pump 564 depressurizes the inner space of the vacuum container 501 to a predetermined pressure, and the heater unit 507 heats the wafers W to a predetermined temperature while the rotary table 502 is rotated clockwise. More specifically, the rotary table 502 may be heated by the heater unit 507 to 300 degrees Celsius in advance. The wafers W are heated as they are placed on the rotary table 502. After confirming by use of a temperature sensor (not shown) that the temperature of the wafers W is set to the preset temperature, the first reactant gas nozzle 531 and the second reactant gas nozzle 532 discharge BTBAS gas and $O_3$ gas, respectively, and the purge gas nozzles 541 and 542 discharge $N_2$ gas serving as purge gas.

Each of the wafers W passes alternately through the first process space P1 including the first reactant gas supply unit 531 and the second process space P2 including the second reactant gas supply unit 532 due to the rotation of the rotary table 502. The BTBAS gas is adsorbed, and, then, the $O_3$ gas is adsorbed, so that the BTBAS molecules are oxidized to form one or more molecule layers of silicon oxide. Through such a process, silicon oxide molecule layers are formed one over another to form a silicon oxide film having a predetermined thickness.

During this operation, the purge gas supply pipe 551 also supplies $N_2$ gas serving as purge gas. As a result, the $N_2$ gas is discharged from the center area C through the gap between the projection 505 and the center portion of the rotary table 502 to flow over the surface of the rotary table 502. In this example, the inner circumferential wall of the container 512 has a dent to provide wider space in the space under the ceiling surface 545 in which one of the reactant gas nozzles 531 and 532 is situated. A corresponding one of the exhaust outlets 561 and 562 is situated under this wider space. Accordingly, the pressure inside the space under the second ceiling surface 545 is lower than the pressures inside the narrow spaces under the ceiling surface 544 and within the center area C.

Figure 33:
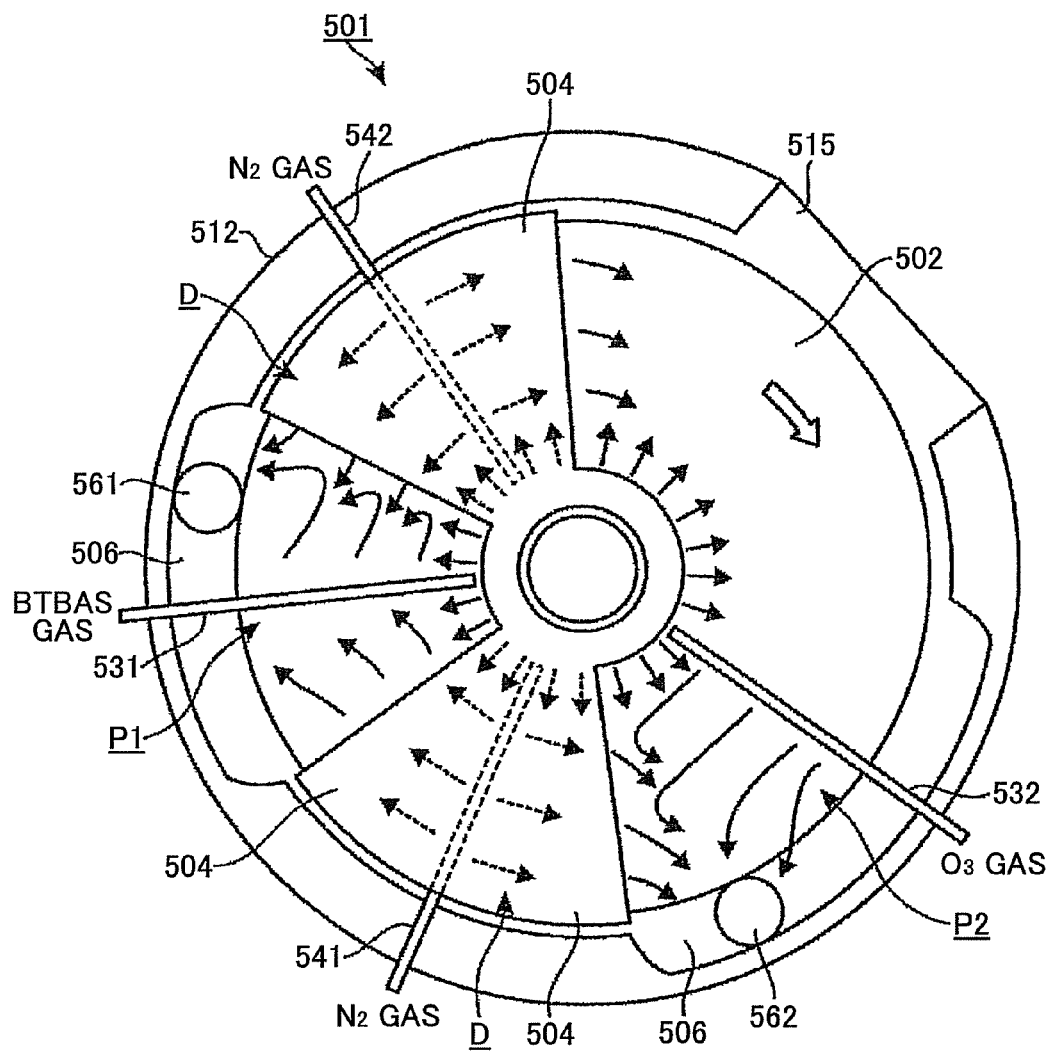
FIG. 33 is an illustrative drawing showing the way a first reactant gas and a second reactant gas are exhausted while being separated by purge gas.

FIG. 33 illustrates the flows of gases that are discharged from the respective units. Further, the $O_3$ gas discharged downwardly from the second reactant gas nozzle 532 comes in contact with the surface of the rotary table 502 (i.e., the surfaces of the wafers W and the surface of the area where no wafer is placed) to partially flow downstream in the rotation direction over the surface of the rotary table 502. This $O_3$ gas is guided by the flow of the $N_2$ gas discharged from the center area C and the sucking force of the exhaust outlet 562 so as to flow toward the exhaust outlet 562. Some of the $O_3$ gas, however, goes toward the adjacent isolation area D situated downstream, and would possibly enter the area under the projection 504 having a fan shape. However, the height and circumferential length of the ceiling surface 544 of the projection 504 are designed such that the intrusion of gas into the space under the ceiling surface 544 is prevented under the operating conditions corresponding to operating process parameters inclusive of the amount of gas flows. Accordingly, as illustrated in FIG. 24B, the $O_3$ gas cannot flow into the space under the ceiling surface 544 having a fan shape. Even if the $O_3$ gas enters this space, it cannot go near the purge gas nozzle 541. The O3 gas is pushed back upstream in the rotation direction by the $N_2$ gas discharged from the purge gas nozzle 41 into the second process area P2. As a result, this $O_3$ gas, together with the $N_2$ gas discharged from the center area C, enter the exhaust space 506 by passing through the gap between the side edge of the rotary table 502 and the inner circumferential wall of the vacuum container 501 for exhaustion through the exhaust outlet 562.

Further, the BTBAS gas discharged downwardly from the first reactant gas nozzle 531 flows downstream in the rotation direction over the surface of the rotary table 502. The BTBAS gas cannot flow into the space under the fan-shape projection 504 situated downstream in the rotation direction. Even if the BTBAS gas enters this space, it is pushed back toward the second process area P1. As a result, this BTBAS gas, together with the $N_2$ gas discharged from the center area C, enter the exhaust space 506 by passing through the gap between the side edge of the rotary table 502 and the inner circumferential wall of the vacuum container 501 for exhaustion through the exhaust outlet 561. Namely, each isolation area D prevents the intrusion of the BTBAS gas and $O_3$ gas serving as reactant gases in the atmosphere, whereas the gas molecules adsorbed to the wafers pass through the isolation area, i.e., through the space under the fan-shape projection 504 having the ceiling surface 544, thereby contributing to the film formation.

Moreover, the BTBAS gas in the first process area P1 (and the $O_3$ gas in the second process area P2) would possibly enter the center area C. As illustrated in FIG. 33, however, purge gas is discharged from the center area C toward the perimeter of the rotary table 502. This purge gas thus prevents the intrusion of the BTBAS gas. Even if the BTBAS gas finds its way into the center area C, the BTBAS gas is pushed back. In this manner, the BTBAS gas is prevented from entering the second process area P2 (or the first process area P1) through the intervening center area C.

In the isolation area D, the periphery edge of the fan-shape projection 504 is bent downward, so that the gap between the bent part 546 and the side surface of the rotary table 502 is very narrow, thereby substantially preventing the passage of gases. Accordingly, the BTBAS gas in the first process area P1 (or $O_3$ gas in the second process area P2) is prevented from entering the second process area P2 (or the first process area P1) by going through the periphery space of the rotary table 502. The two isolation areas D thus completely isolate the atmosphere of the first process area P1 and the atmosphere of the second process area P2 from each other, so that the BTBAS gas is exhausted through the exhaust outlet 561, and the $O_3$ gas is exhausted through the exhaust outlet 562. In this manner, the two reactant gases, e.g., the BTBAS gas and the $O_3$ gas in this example, do not mix with each other in any space even over the wafers W. Since the space under the rotary table 502 is purged by $N_2$ gas in this example, gases entering the exhaust area 506 do not go through the space under the rotary table 502. For example, the BTBAS gas does not flow into the space in which the $O_3$ gas is discharged. After the completion of a film deposition process, each wafer is unloaded by the delivery arm 510 in an order reverse to the order when each wafer is loaded.

An example of processing parameters will be described in the following. The rate of revolution of the rotary table 502 may be 1 rpm to 300 rpm when the wafer W subjected to processing has a diameter of 300 mm. The process pressure may be 1067 Pa (i.e., 8 Torr). The temperature of the heated wafer W may be 350 degrees Celsius. The flow amounts of BTBAS gas and $O_3$ gas may be 100 sccm and 10000 sccm, respectively. The flow amount of $N_2$ gas through the purge gas nozzles 541 and 542 may be 20000 sccm. The flow amount of $N_2$ gas through the purge gas supply pipe 551 at the center portion of the vacuum container 501 may be 5000 sccm. The number of cycles of reactant gas supply with respect to one wafer, i.e., the number of times the wafer passes through each of the first process area P1 and the second process area P2, may vary according to a desired film thickness. An example of a typical number may be 600.

In the above-described embodiment, plural wafers W are arranged in a circular direction of the rotary table 502. The rotary table 502 is rotated to cause the wafers W to pass through the first process area P1 and the second process area P2 in sequence, thereby performing the ALD (or MLD) to perform a film deposition process at high throughput. The isolation area D having a low ceiling surface is disposed between the first process area P1 and the second process area P2 in the circular direction. Further, a purge gas is discharged from the center area C towards the periphery of the rotary table 502 wherein the center area C is partitioned by the rotation center portion of the rotary table 502 and the vacuum container 501. The purge gas dispersing into both sides of the isolation area D, the purge gas discharged from the center area C, and the reactant gases are exhausted through the space between the inner circumferential wall of the vacuum container 501 and the side edge of the rotary table 502. This arrangement successfully prevents the mixing of the reactant gases, thereby achieving a satisfactory film deposition process. Further, the generation of reaction products over the rotary table 502 is prevented or significantly suppressed, so that the generation of particles is suppressed. It should be noted that the rotary table 502 may be configured to have only one wafer W placed thereon.

Moreover, the first reactant gas nozzle 531 and the second reactant gas nozzle 532 that extend in the radial directions of the rotary table 502 are supported from below on the proximal side by the inclination adjustment mechanism 525 that is vertically movable. With this arrangement, the inclination of the first and second reactant gas nozzles 531 and 532 relative to the horizontal axis is adjusted. In a configuration in which one end of each of the first and second reactant gas nozzles 531 and 532 are inserted into the side wall of the vacuum container 501 for fixed mounting, gaps for permitting smooth insertion of the gas nozzles 531 and 532 are provided between the reactant gas nozzles 531 and 532 and the side wall of the vacuum container 501. Further, O rings are provided for the purpose of closing the gaps to maintain hermetic sealing.

In this configuration, the ends of the reactant gas nozzles 531 and 532 are supported by the O rings. Since the O rings are made of elastic material, the O rings are deformed as all the weight of the reactant gas nozzles 531 and 532 are imposed thereon in the configuration in which all the weight of the reactant gas nozzles 531 and 532 are supported by the ends of the reactant gas nozzles 531 and 532 inserted into the side wall. At the mount point of the reactant gas nozzles 531 and 532, thus, the reactant gas nozzles 531 and 532 are fixed in a downwardly inclined position. Since the reactant gas nozzles 531 and 532 are long, the moment at their distal ends is large. A small inclination at the mount point thus creates a large drop at the proximal end.

In consideration of this, the inclination adjustment mechanism 525 is provided to support the reactant gas nozzles 531 and 532 on the proximal side thereof at the position closer to the inner space of the vacuum container than the mount point. With this arrangement, the reactant gas nozzles 531 and 532 are supported not only by the O rings r1 and r2 but also by the inclination adjustment mechanism 525, so that weight is distributed to the O rings r1 and r2 and to the inclination adjustment mechanism 525. Further, the support member 526 of the inclination adjustment mechanism 525 is made of aluminum, which does not deform upon receiving the weight of the reactant gas nozzles 531 and 532, thereby providing a sturdy support for the proximal side of the reactant gas nozzles 531 and 532.

As the mount position of the inclination adjustment mechanism 525 is adjustable in a vertical direction, the adjustment of height of the support point that is situated more inside than the mount point of the reactant gas nozzles 531 and 532 makes it possible to adjust the inclination of the reactant gas nozzles 531 and 532 relative to the horizontal axis. With the proper adjustment of inclination of the reactant gas nozzles 531 and 532 to suppress the dropping at their distal ends, the distance between the reactant gas nozzles 531 and 532 and the surfaces of the wafers W placed on the rotary table 502 is adjusted to be constant along the extension of the reactant gas nozzles 531 and 532. If the amount of reactant gases discharged toward the surface of the rotary table 502 from the reactant gas nozzles 531 and 532 is constant in the longitudinal direction of the reactant gas nozzles 531 and 532, then the density of reactant gases supplied from the reactant gas nozzles 531 and 532 is made constant over the wafers W. With this arrangement, the amount of reactant gases supplied from the reactant gas nozzles and adsorbed by the wafers may be adjusted to be constant across the surface of a given wafer, thereby achieving a satisfactory film deposition process.

Figure 34:
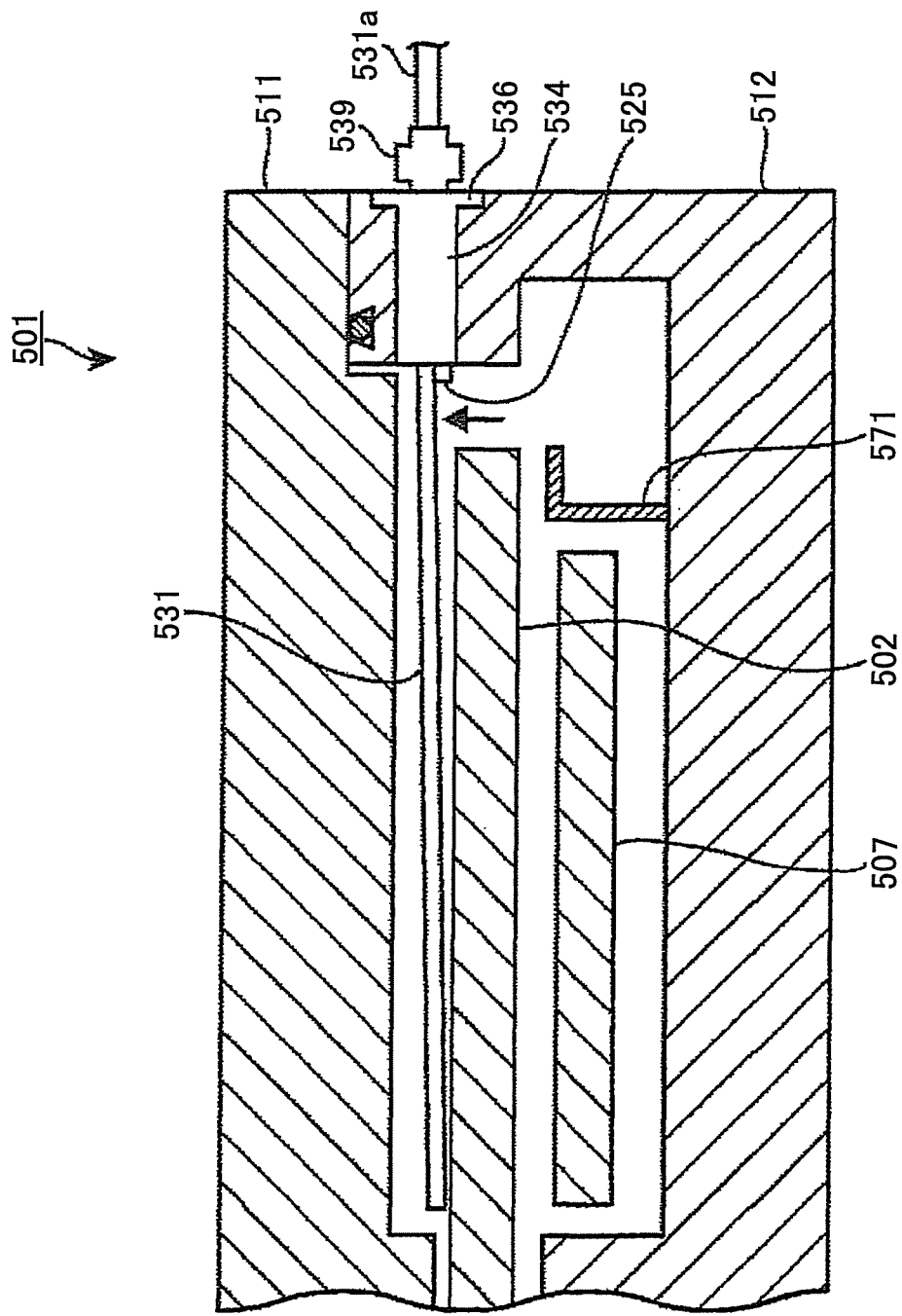
FIG. 34 is a cross-sectional view for illustrating another example of an attached reactant gas nozzle.

Moreover, the long gas nozzle 531 or 532 means that the amount of discharged gas is larger toward the proximal end than toward the distal end of the gas nozzle 531 or 532 as the proximal end is closer to the gas supply source. As a result, the density of reactant gas may be lower at the center area than at the perimeter area of the vacuum container 501. In this case, the inclination of the reactant gas nozzles 531 and 532 may be adjusted such that the distal sides of the first and second reactant gas nozzles 531 and 532 are situated closer to the surfaces of the wafers placed on the rotary table 502 than are the proximal sides thereof as illustrated in FIG. 34. The distal sides are closer to the surfaces of the wafers W than the proximal sides of the reactant gas nozzles 531 and 532, thereby providing an environment that is more conducive to adsorption of reactant gas. This achieves the deposition of a film having constant thickness over the surfaces of the wafers W. A satisfactory film deposition process is thus achieved.

In an ALD or MLD process, it is preferable to place the reactant gas nozzles 531 and 532 in close proximity to the wafers W in order for the reactant gases to be promptly adsorbed to the surfaces of the wafers W. The adjustment of inclination of the reactant gas nozzles 531 and 532 relative to the horizontal axis makes it easier to create an environment that is conducive to the constant adsorption of reactant gases to the surfaces of the wafers W, and also serves to prevent the distal ends of the reactant gas nozzles 531 and 532 to drop and come in contact with the wafers W. The above-described configuration is thus particularly effective in this regard.

Further, the flange 536 of the sleeve 534 is mounted to the vacuum container 501 by screwing the position adjustment screws 537 via the position adjustment holes 536a of the flange 536, so that the mount position of the flange 536 is adjustable in a vertical direction. When the inclination of the reactant gas nozzles 531 and 532 is adjusted, thus, the coarse adjustment of the mount position of the sleeve 534 and the fine adjustment of the mount position of the inclination adjustment mechanism 525 are performed in combination with each other. This provides a wide adjustable range while achieving highly precise adjustment. The mount position of the sleeve 534 is adjusted first, and, then, the inclination adjustment mechanism 525 is used to finely adjust the inclination of the reactant gas nozzles 531 and 532. The adjustable range provided by the inclination adjustment mechanism 525 is limited to some extent, thereby making it easier to perform inclination adjustment.

Figure 35:
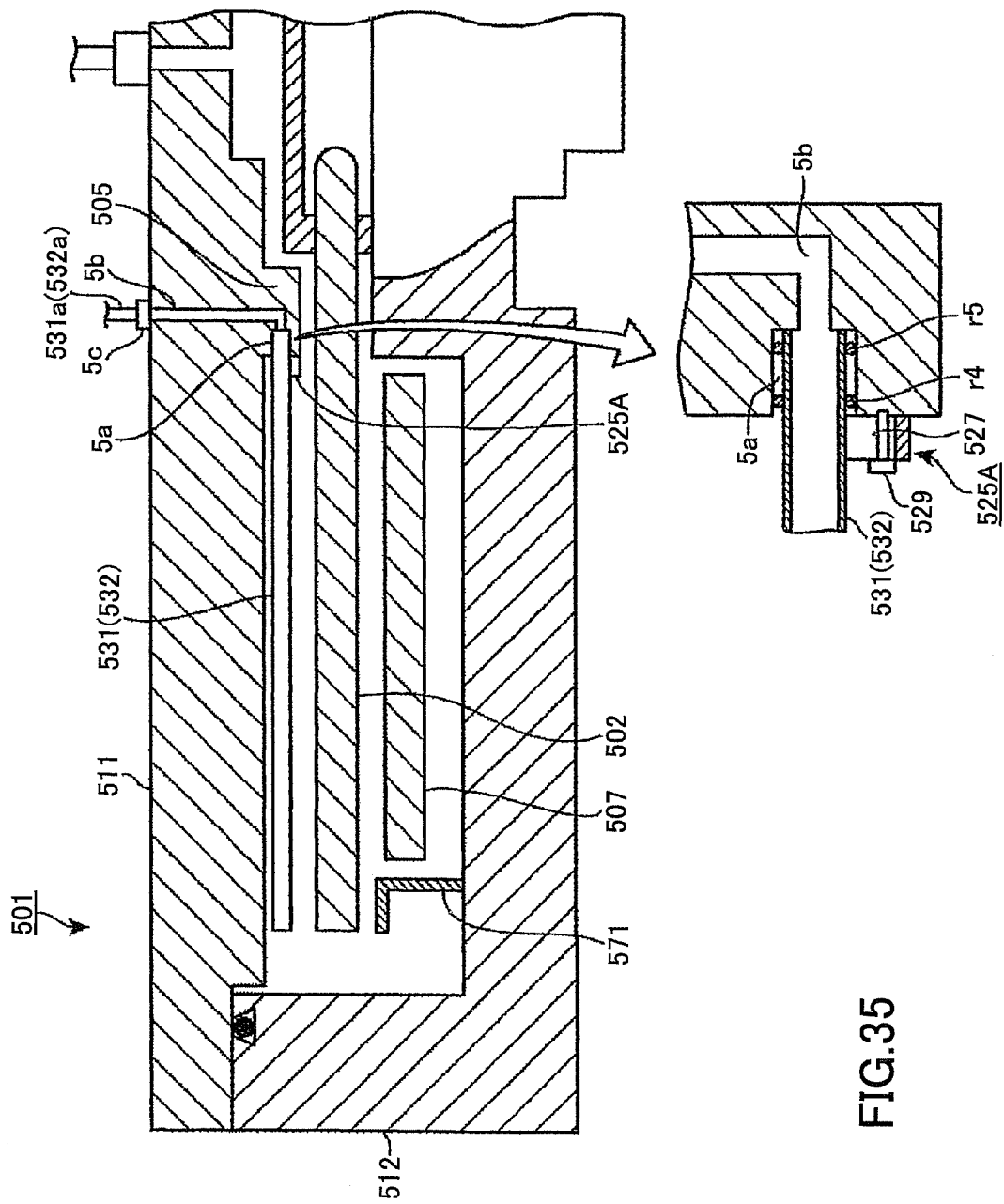
FIG. 35 is a cross-sectional view of a portion of the film deposition apparatus according to another embodiment of the present invention.
Figure 36:
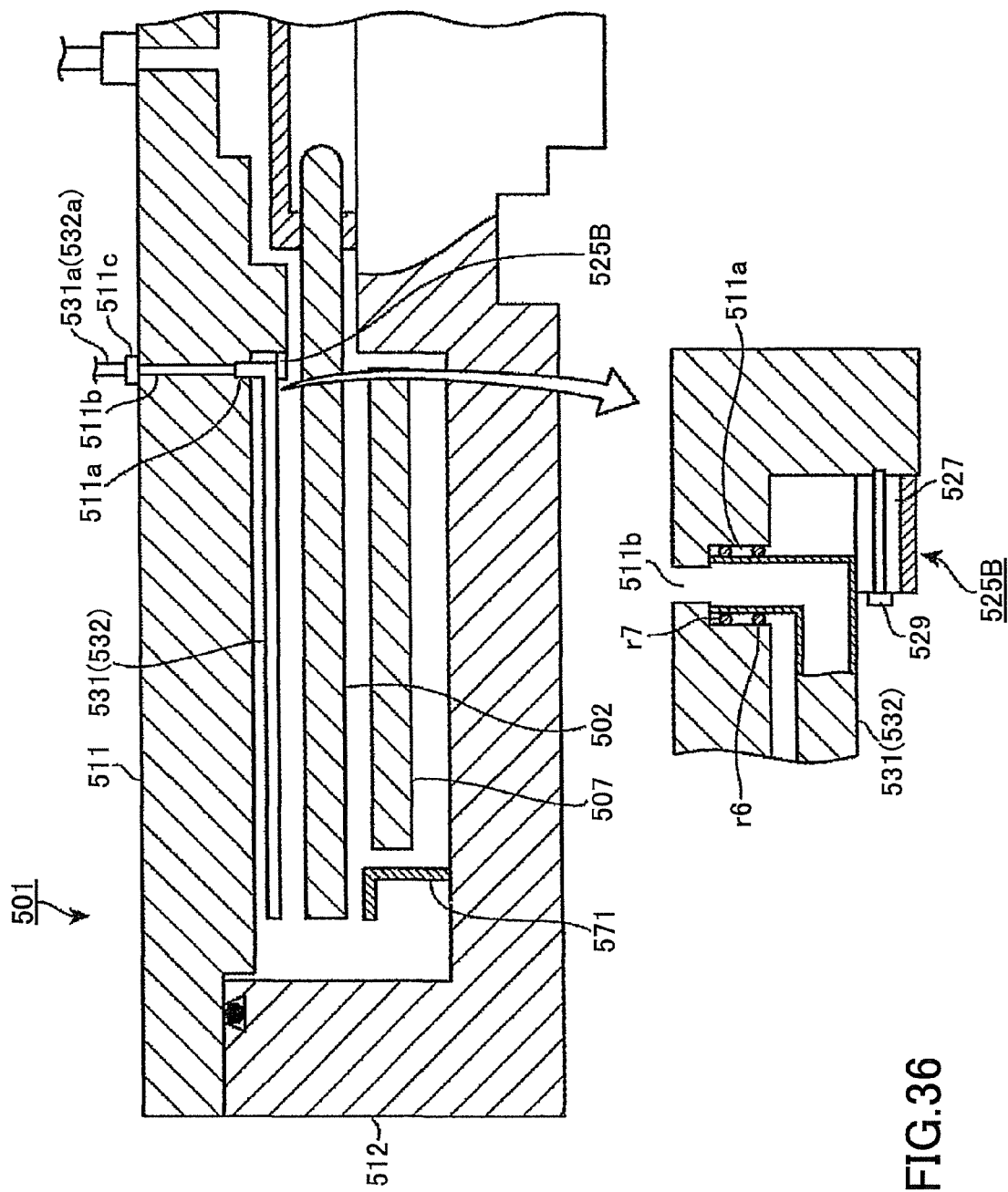
FIG. 36 is a cross-sectional view of a portion of the film deposition apparatus according to another embodiment of the present invention.

Further, the reactant gas nozzles 531 and 532 may be supported at the center portion of the vacuum container 501 as illustrated in FIG. 35 and FIG. 36. In these examples, the reactant gas nozzles 531 and 532 are attached to the center of the vacuum container 501 to horizontally extend from the center portion toward the perimeter edge of the rotary table 502. In the example illustrated in FIG. 35, the proximal ends of the reactant gas nozzles 531 and 532 are attached to the projection 505 of the top panel 511. The outer wall of the projection 505 has a recess 5a formed therein serving as an insertion hole into which the end of the reactant gas nozzle 531 (or 532) is inserted. A gas supply path 5b is formed through the top panel 511 that is connected to the reactant gas nozzle 531 (or 532) via the recess 5a. The other end of the gas supply path 5b has an opening at the exterior of the top panel 511, and is connected to the reactant gas supply pipe 531a (or 532a) through a joint unit 5c. The reactant gas nozzles 531 and 532 are supported from below on the proximal side thereof by the inclination adjustment mechanism 525A mounted on the projection 505, so that the inclination of the reactant gas nozzles 531 and 532 relative to the horizontal axis is adjustable. In FIG. 35, O rings r4 and r5 are also provided.

In the example illustrated in FIG. 36, one end of the reactant gas nozzle 531 (or 532) is mounted to the top panel 511, for example. The lower surface of the top panel 511 has a recess 511a formed therein serving as an insertion hole into which the end of the reactant gas nozzle 531 (or 532) is inserted. A gas supply path 511b is formed through the top panel 511 that is connected to the reactant gas nozzle 531 (or 532) via the recess 511a. The other end of the gas supply path 511b has an opening at the exterior of the top panel 511, and is connected to the reactant gas supply pipe 531a (or 532a) through a joint unit 511c. The reactant gas nozzles 531 and 532 are supported from below on the proximal side thereof by the inclination adjustment mechanism 525B mounted on the projection 505, so that the inclination of the reactant gas nozzles 531 and 532 relative to the horizontal axis is adjustable. In FIG. 36, O rings r4 and r5 are also provided. The inclination adjustment mechanisms 525A and 525B has a configuration similar to the configuration of the inclination adjustment mechanism 525.

Figure 37:
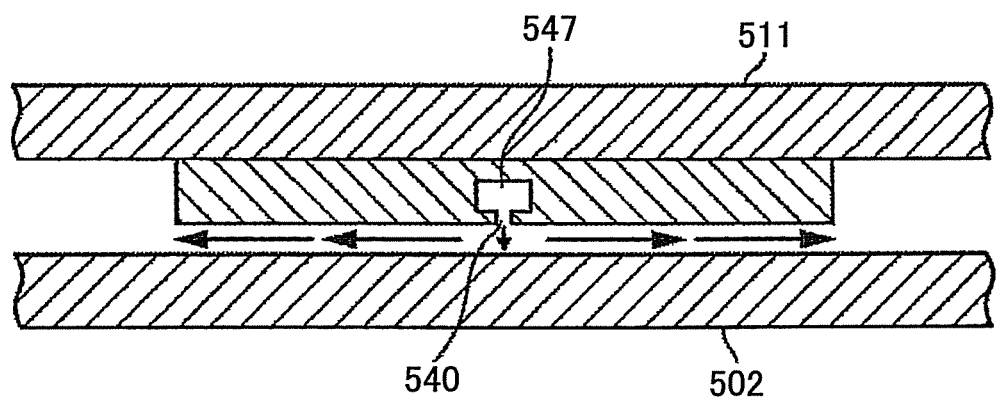
FIG. 37 is a cross-sectional view showing another example of an isolation area.

The mount mechanism for mounting the purge gas nozzles 541 and 542 does not have to be the same as the mount mechanism described above. The above-described configuration in which the projection 544 is situated on both sides of the purge gas nozzle 541 or 542 does not have to be employed. As illustrated in FIG. 37, a conduit 547 for conducting purge gas may be formed inside the projection 504 in radial directions of the rotary table 502, with a plurality of gas discharge ports 540 being formed at the bottom of the conduit 547 along its longitudinal extension. The heating unit for heating a wafer is not limited to a heater using a resistance heating element, and may be a lamp-based heating apparatus. The heating unit may be situated above the rotary table 502, rather than situated below the rotary table 502, or may be situated above and below the rotary table 502.

Figure 38:
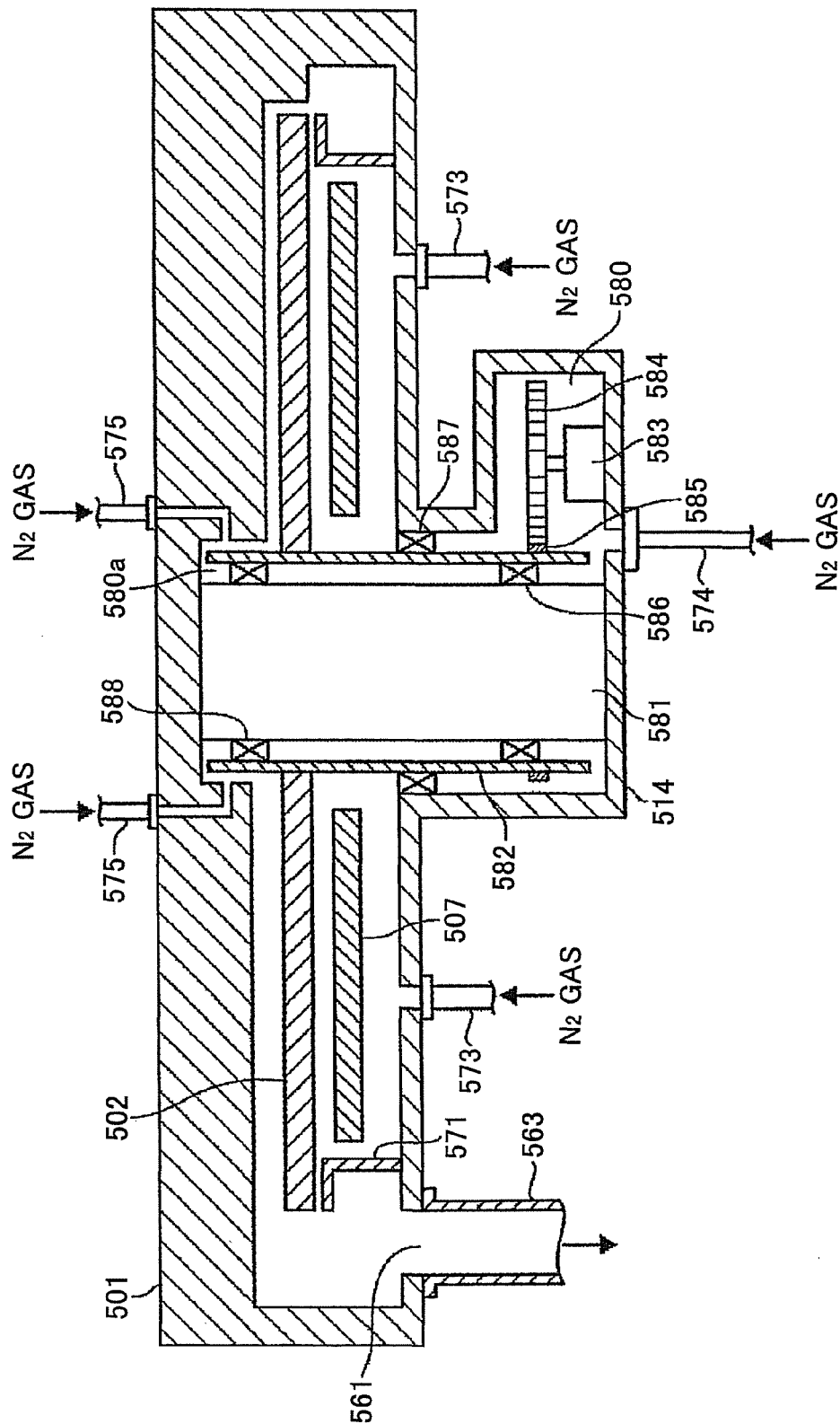
FIG. 38 is a cross-sectional view of the film deposition apparatus according to another embodiment of the present invention.

In the embodiment described above, the rotation shaft 522 of the rotary table 502 is situated at the center of the vacuum container 501, and purge gas purges the space between the center portion of the rotary table 502 and the upper plate of the vacuum container 501. Alternatively, a configuration as illustrated in FIG. 38 may be used. As illustrated in FIG. 38, the bottom section 514 bulges downward at the center area of the vacuum container 501 to form a container space 580, and a recess 580a is formed in the top plate at the center area of the vacuum container 501. Further, a pillar structure 581 is situated at the center area of the vacuum container 501 from the bottom section of the container space 580 to the upper end of the recess 580a of the vacuum container 501. This arrangement prevents BTBAS gas from the first reactant gas nozzle 531 and $O_3$ gas from the second reactant gas nozzle 532 from being mixed with each other through the center area.

In order to rotate the rotary table 502, a rotary sleeve 582 is disposed to surround the pillar structure 581. The rotary table 502 has a ring shape and is fixedly attached to the rotary sleeve 582. A drive cog 584 driven by a motor 583 is placed inside the container space 580. This drive cog 584 rotates the rotary sleeve 582 through a cog unit 585 formed along the outer circumference of the rotary sleeve 582 at a lower part thereof. Bearings 586, 587, and 588 are provided for the rotary sleeve 582. A purge gas supply pipe 574 is connected to the bottom of the container space 580. Further, a purge gas supply pipe 575 is connected to the top portion of the vacuum container 501 to supply purge gas to a gap between the sidewall of the recess 580a and the top portion of the rotary sleeve 582. In FIG. 38, orifices for conducting the purge gas to the gap between the sidewall of the recess 580a and the top portion of the rotary sleeve 582 are provided at two locations. This is only an example. It is preferable to determine the number of orifices (i.e., the number of purge gas supply ports) by taking into account the effectiveness of the mechanism for preventing BTBAS gas and $O_3$ gas from being mixed with each other through the area around the rotary sleeve 582.

In the configuration illustrated in FIG. 38, the gap between the sidewall of the recess 580a and the top portion of the rotary sleeve 582 serves as a purge gas discharge port as viewed from the rotary table 502. This purge gas discharge port, the rotary sleeve 582, and the pillar structure 581 constitute the center area C situated at the center of the vacuum container 501.

The present invention is not limited to the use of two types of reactant gases, and may be applied to a case in which one type of deposition gas is used to form a thin film on a substrate, or to a case in which three or more types of reactant gases are supplied to a substrate in sequence. In the case where three or more types of reactant gases are used, a first reactant gas nozzle, a purge gas nozzle, a second reactant gas nozzle, a purge gas nozzle, a third reactant gas nozzle, and a purge gas nozzle may be arranged in a circular direction in the vacuum container 501 in the order listed, with the isolation areas covering the positions of these purge gas nozzles being configured as in the heretofore-described embodiments. It should be noted that it suffices for the substrate placement unit to move relative to reactant gas nozzles. The substrate placement unit is not limited to a rotary table.

Applied process gases may include, in addition to the examples described heretofore, DSC (Dichlorosilane), HCD (Hexachlorodisilane), TMA (Trimethylaluminium), 3DMAS Trisdimethylaminosilane), TEMAZ (Tetrakisethylmethylaminozirconium), TEMHF (Tetrakisethylmethylamidohafnium), $Sr(THD)_2$ (Strontium bis-tetramethylheptanedionate), $Ti(MPD(THD)_2$ (titanium methylpentanedionatobistetramethylheptanedionato), and monoaminosilane.

Figure 39:
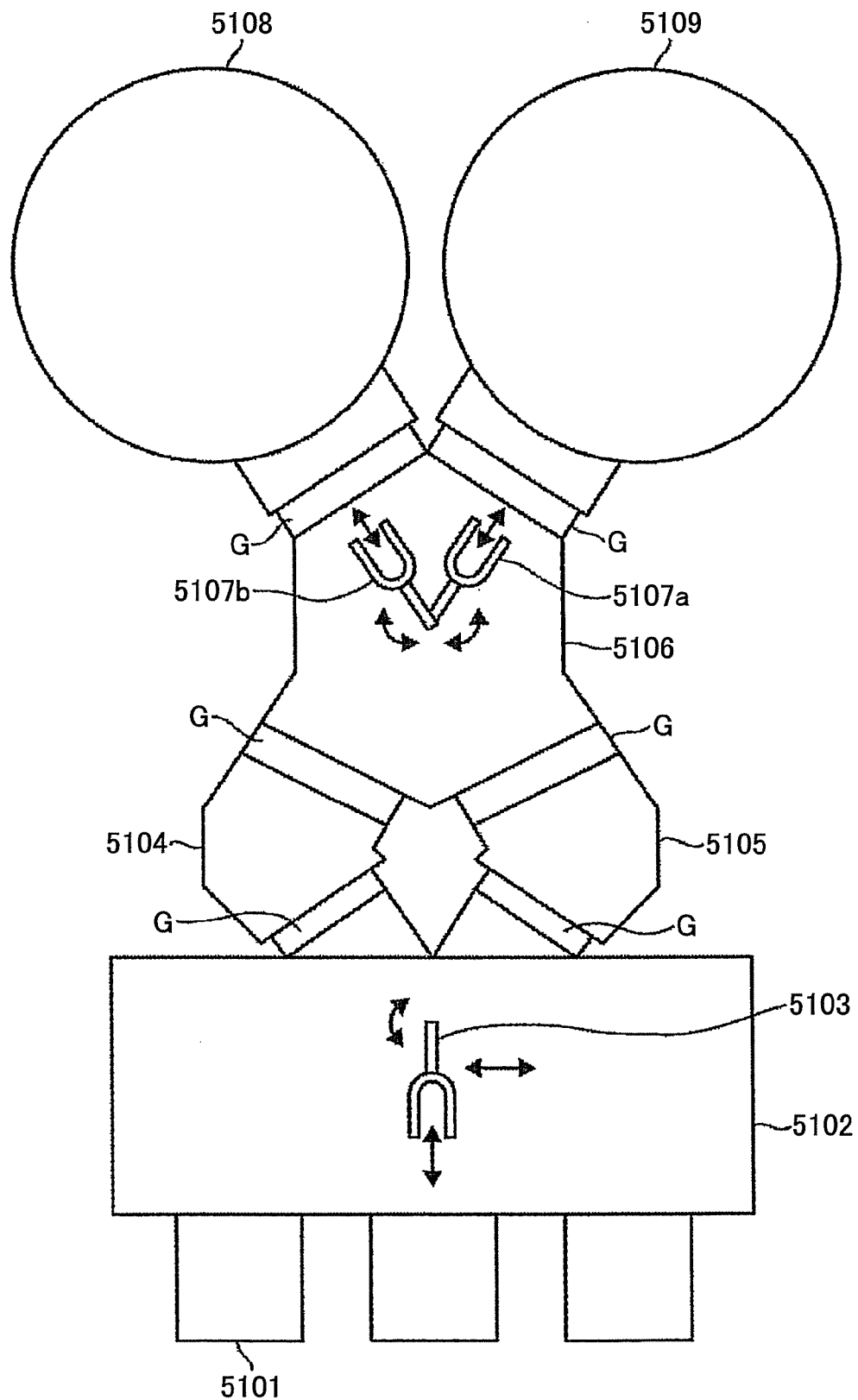
FIG. 39 is a schematic plan view showing an example of a substrate processing system using the film deposition apparatus of the present invention.

FIG. 39 is a drawing illustrating substrate processing apparatus that employs the film deposition apparatus described heretofore. FIG. 39 shows a sealed-type delivery container 5101 referred to as a "hoop" for containing 25 wafers, for example, an atmosphere delivery chamber 5102 containing a delivery arm 5103, load lock chambers (vacuum preparation chambers) 5104 and 5105 operable to be switched between an air atmosphere and a vacuum atmosphere, a vacuum delivery chamber 5106 containing two delivery arms 5107, and film deposition apparatuses 5108 and 5109 according to the heretofore-described embodiments. The delivery container 5101 is delivered to a loading/unloading port having a platform (not shown), and is connected to the atmosphere delivery chamber 5102. Then, an opening/closing mechanism (not shown) opens the hatch. The delivery arm 5103 then takes wafers out of the delivery container 5101. The wafers W are then loaded to the load lock chamber 5104 (5105), an interior space of which is then switched from the air atmosphere to the vacuum atmosphere. The delivery arm 5107 takes the wafers out of the load lock chamber, and delivers the wafers to one of the film deposition apparatus 5108 and 5109, in which the film deposition process is performed as previously described. In this manner, two film deposition apparatuses of the heretofore-described embodiments may be provided, each of which is configured to process five wafers, for example. The provision of plural film deposition apparatuses makes it possible to perform ALD (or MLD) at high throughput.

Further, the present invention is not limited to these embodiments, but various variations and modifications may be made without departing from the scope of the present invention.

The present application is based on Japanese priority applications No. 2008-306734 filed on Dec. 1, 2008 and No. 2008-309011 filed on Dec. 3, 2008 with the Japanese Patent Office, the entire contents of which are hereby incorporated by reference.

What is claimed is:
1. A film deposition apparatus for forming a thin film on a surface of a wafer by use of reactant gases, comprising:
a rotary table including a substrate placement area in which a substrate is placed;
a vacuum container including a container configured to accommodate the rotary table and a top panel having a circle shape and configured to hermetically seal a top of the container;
an open-and-close mechanism having lifting shafts provided at equal intervals along a perimeter of the circle shape of the top panel and extending from the open-and-close mechanism to open and close the top panel, said lifting shafts being connected to a top surface of the top panel;
a plurality of reactant gas nozzles disposed so as to be supported by an outer lateral wall of the vacuum container to be situated at different angular positions with respect to a rotation center of the rotary table to face areas in which the substrate placement area passes, the plurality of reactant gas nozzles having gas discharge ports arranged in radial directions with respect to the rotation center to supply respective reactant gases to a surface of the wafer thereby to form respective process areas;

a sleeve provided at the vacuum container so as to penetrate through the outer lateral wall of the vacuum container;

an inner sleeve located in the sleeve, one end of each of the plurality of reactant gas nozzles being inserted into the sleeve and the inner sleeve, o-rings provided in the sleeve so as to sandwich the inner sleeve;

a discharge gas supply unit situated at an angular position between the process areas to supply purge gas to form an isolation area that isolates atmospheres of the process areas from each other; and an exhaustion unit configured to exhaust atmosphere inside the vacuum container.

2. The film deposition apparatus as claimed in claim 1, further comprising a preparatory treatment unit connected to at least one of the reactant gas nozzles at an upstream position thereof outside the vacuum container to perform a preparatory treatment with respect to the corresponding reactant gas.

3. The film deposition apparatus as claimed in claim 2, wherein the preparatory treatment is one of a heat treatment and a plasma treatment.

4. The film deposition apparatus as claimed in claim 1, wherein the each of the plurality of reactant gas nozzles is detachably inserted into a through-hole provided in the sleeve of the vacuum container.

5. The film deposition apparatus as claimed in claim 4, wherein the through-hole is narrower at a distal end toward an interior of the vacuum container.

6. The film deposition apparatus as claimed in claim 1, wherein the outer lateral wall of the container of the vacuum container has holes formed at different positions in a circumferential direction to receive the reactant gas nozzles inserted thereinto, a number of the holes being larger than a number of the reactant gas nozzles such as to allow a choice to be made with respect to positions at which the reactant gas nozzles are attached.

7. The film deposition apparatus as claimed in claim 1, wherein the plurality of reactant gas nozzles include a first reactant gas nozzle configured to supply a first reactant gas and a second reactant gas nozzle configured to supply a second reactant gas that reacts with the first reactant gas, and a cycle in which the first reactant gas and the second reactant gas are supplied to the surface of the wafer in sequence is repeated to form a plurality of layers of a reacted product to form a thin film.

8. The film deposition apparatus as claimed in claim 1, wherein the discharge gas supply unit includes a purge gas nozzle configured to extend from the outer lateral wall of the container of the vacuum container toward the rotation center of the rotary table to face the rotary table and to have gas discharge ports formed in a lower face of the purge gas nozzle along a longitudinal direction thereof to supply the purge gas.

9. The film deposition apparatus as claimed in claim 8, wherein the outer lateral wall of the container of the vacuum container has holes formed at different positions in a circumferential direction to receive the purge gas nozzle inserted thereinto, a number of the holes being larger than a number of purge gas nozzles used such as to allow a choice to be made with respect to positions at which the purge gas nozzles used are attached.

10. The film deposition apparatus as claimed in claim 1, wherein the discharge gas supply unit includes a purge gas nozzle configured to extend from the outer lateral wall of the container of the vacuum container toward the rotation center of the rotary table to face the rotary table and to have gas discharge ports formed in a lower face of the purge gas nozzle along a longitudinal direction thereof to supply the purge gas, wherein the outer lateral wall of the container of the vacuum container has holes formed at different positions in a circumferential direction to receive any one of the reactant gas nozzles and purge gas nozzle inserted thereinto, a number of the holes being larger than a number of the reactant gas nozzles and discharge gas nozzles used such as to allow a choice to be made with respect to positions at which the reactant gas nozzles and discharge gas nozzles used are attached, and each of the holes is usable either as a hole for a reactant gas nozzle or a hole for a purge gas nozzle.

11. The film deposition apparatus as claimed in claim 1, wherein the isolation area extends over both downstream side and upstream side of the discharge gas supply unit with respect to a rotation direction of the rotary table, and the top panel has a ceiling surface that forms a space with the rotary table through which the purge gas flows from the isolation area to the process areas.

12. The film deposition apparatus as claimed in claim 1, further comprising a center portion situated at a center of the vacuum container and having a discharge port to discharge purge gas to a rotary table surface on which the substrate placement area is situated, thereby isolating the atmospheres of the process areas from each other, and wherein the reactant gases are exhausted by the exhaust unit together with the purge gas dissipating to both sides of the isolation area and the purge gas discharged from the center portion.

13. The film deposition apparatus as claimed in claim 1, wherein each said substrate placement area is disposed at a different position in a circular direction of the rotary table.

14. A film deposition apparatus for forming a thin film by supplying reactant gases to a surface of a wafer, comprising:
a vacuum container;
a substrate placement unit disposed in the vacuum container and configured to support a substrate placed thereon in a substantially horizontal position;
a reactant gas nozzle having one end thereof inserted into a hole formed in an outer lateral wall of the vacuum container to extend over the substrate placement unit to supply a reactant gas to a surface of the substrate placement unit;
a movement unit configured to move the substrate placement unit relative to the reactant gas nozzle;
a sealing member disposed between the one end of the reactant gas nozzle and the outer lateral wall of the vacuum container to fixedly support the one end of the reactant gas nozzle while hermetically sealing an inner space of the vacuum container; and
an inclination adjustment unit configured to support the reactant gas nozzle from below at a support point that is closer to the inner space of the vacuum container than a position of the hole, such that a height of the support point is adjustable to adjust inclination of the reactant gas nozzle relative to the horizontal position,
wherein the inclination adjustment unit includes:
a support member configured to support the reactant gas nozzle from below and having a hole;
a screw hole formed in a sleeve provided to the outer lateral wall of the vacuum container and penetrating through the outer lateral wall of the vacuum container; and an inclination adjustment screw configured to be screwed into the screw hole through the hole of the support member to fixedly mount the support member to the sleeve of the vacuum container, wherein a vertical size of the hole of the support member is larger than a diameter of a screw rod of the inclination adjustment screw, wherein the outer lateral wall of the vacuum container includes an inner sleeve located in the sleeve, the one end of the reactant gas nozzle being inserted into the sleeve and the inner sleeve, and wherein the sleeve has o-rings provided therein so as to sandwich the inner sleeve.

15. The film deposition apparatus as claimed in claim 14, wherein the outer lateral wall of the vacuum container into which the one end of the reactant gas nozzle is inserted is a side wall of the vacuum container.

16. The film deposition apparatus as claimed in claim 14, wherein the sleeve has a flange that is threadably mounted to the outer lateral wall of the vacuum container by a position adjustment screw, the one end of the reactant gas nozzle being inserted into the sleeve, and the flange has a position adjustment hole having a vertical size larger than a diameter of a screw rod of the position adjustment screw, and wherein the outer lateral wall of the vacuum container has a screw hole into which the position adjustment screw is screwed through the position adjustment hole of the flange thereby to threadably mount the flange to the outer lateral wall of the vacuum container.

17. The film deposition apparatus as claimed in claim 14, wherein a plurality of reactant gas nozzles each equivalent to said reactant gas nozzle are provided, and include a first reactant gas nozzle and a second reactant gas nozzle configured to supply a first reactant gas and a second reactant gas to the surface of the substrate placement unit, the first reactant gas nozzle and the second reactant gas nozzle situated at intervals in a direction of relative movement between the substrate placement unit and the reactant gas nozzles, wherein an isolation area is provided between a first process area receiving the first reactant gas and a second process area receiving the second reactant gas in the direction of relative movement to isolate an atmosphere of the first process area and an atmosphere of the second process area from each other, and a cycle in which the first reactant gas and the second reactant gas reacting with each other in the vacuum container are supplied to the surface of the wafer in sequence is repeated to form a plurality of layers of a reacted product to form a thin film.

18. The film deposition apparatus as claimed in claim 17, wherein the substrate placement unit includes a rotary table having a substrate placement area on which a substrate is placed, and the movement unit includes a unit configured to rotate the rotary table around a vertical axis, and wherein the first reactant gas nozzle and the second reactant gas nozzle each have one end thereof inserted into the outer lateral wall of the vacuum container to be spaced apart in a rotation direction of the rotary table and to extend over the rotary table in a substantially horizontal direction in radial directions of the rotary table.

19. The film deposition apparatus as claimed in claim 18, further comprising a center portion situated at a center of the vacuum container and having a discharge port to discharge purge gas to a rotary table surface on which the substrate placement area is situated, thereby isolating the atmospheres of the first process area and the second process area from each other.

20. The film deposition apparatus as claimed in claim 18, wherein each said substrate placement area is disposed at a different position in a circular direction of the rotary table.

21. The film deposition apparatus as claimed in claim 17, wherein the isolation area includes:
 a purge gas supply unit configured to supply purge gas; and
 a ceiling surface extending over both downstream side and upstream side of the purge gas supply unit with respect to the rotation direction, and forming a space with the rotary table through which the purge gas flows from the isolation area to the process areas.

22. The film deposition apparatus as claimed in claim 14, wherein the inclination adjustment unit is configured to support the reactant gas nozzle so as to keep the reactant gas nozzle horizontal to the substrate placed in the substrate placement unit.

23. The film deposition apparatus as claimed in claim 21, wherein the purge gas supply unit is a purge gas supply nozzle having one end thereof inserted into the outer lateral wall of the vacuum container to extend over a surface of the rotary table in a radial direction of the rotary table.

* * * * *